(12) United States Patent
Lingle et al.

(10) Patent No.: US 11,284,544 B1
(45) Date of Patent: Mar. 22, 2022

(54) SYSTEMS AND METHODS FOR SENSING, RECORDING, ANALYZING AND REPORTING ENVIRONMENTAL CONDITIONS IN DATA CENTERS AND SIMILAR FACILITIES

(71) Applicant: Eta Vision Inc., Chicago, IL (US)

(72) Inventors: Mike Lingle, Deerfield, IL (US); Michael Conaboy, Westminster, CO (US); Patrick Boehnke, Oak Park, IL (US)

(73) Assignee: ETA VISION INC., Chicago, IL (US)

( * ) Notice: Subject to any disclaimer, the term of this patent is extended or adjusted under 35 U.S.C. 154(b) by 0 days.

(21) Appl. No.: 16/787,711

(22) Filed: Feb. 11, 2020

Related U.S. Application Data

(63) Continuation-in-part of application No. 16/383,216, filed on Apr. 12, 2019, now Pat. No. 10,863,330, which is a continuation-in-part of application No. 15/369,537, filed on Dec. 5, 2016, now Pat. No. 10,516,981.

(60) Provisional application No. 62/262,715, filed on Dec. 3, 2015.

(51) Int. Cl.
| | | |
|---|---|---|
| *G06F 15/173* | (2006.01) | |
| *H05K 7/20* | (2006.01) | |
| *G06Q 10/06* | (2012.01) | |
| *G06F 11/30* | (2006.01) | |

(52) U.S. Cl.
CPC ..... *H05K 7/20836* (2013.01); *G06F 11/3062* (2013.01); *G06Q 10/06315* (2013.01)

(58) Field of Classification Search
CPC ............ H05K 7/20836; G06F 11/3062; G06Q 10/06315
USPC ........................................................ 709/217
See application file for complete search history.

(56) References Cited

U.S. PATENT DOCUMENTS

| | | | | | |
|---|---|---|---|---|---|
| 5,276,789 | A | * | 1/1994 | Besaw | .................... G06F 30/18 345/440 |
| 5,684,967 | A | * | 11/1997 | McKenna | ............... H04L 41/22 345/696 |
| 5,737,319 | A | * | 4/1998 | Croslin | ............... H04L 41/0631 370/254 |
| 5,793,974 | A | * | 8/1998 | Messinger | .............. H04L 41/22 709/223 |
| 5,910,803 | A | * | 6/1999 | Grau | ....................... H04L 41/12 715/734 |
| 5,966,128 | A | * | 10/1999 | Savage | .................. H04L 41/044 345/428 |
| 5,987,506 | A | * | 11/1999 | Carter | ................... G06F 9/5016 709/213 |

(Continued)

FOREIGN PATENT DOCUMENTS

| | | | | | |
|---|---|---|---|---|---|
| WO | WO-2015049628 | A1 | * | 4/2015 | ......... H05K 7/20836 |

*Primary Examiner* — Alicia Baturay
(74) *Attorney, Agent, or Firm* — McAndrews, Heid & Malloy, Ltd.

(57) ABSTRACT

The present disclosure pertains to utilizing hardware and software to control and record environmental and other data obtained from sensors and other devices, placed throughout a facility, and analyzing and displaying the information in a detailed status report of the environmental conditions inside facility, and once analyzed, the software can provide recommendations to implement measures that increase the efficiency of the facility.

14 Claims, 29 Drawing Sheets

(56) References Cited

U.S. PATENT DOCUMENTS

| | | | | |
|---|---|---|---|---|
| 6,009,466 | A * | 12/1999 | Axberg | G06F 8/34 709/220 |
| 6,040,834 | A * | 3/2000 | Jain | H04L 41/06 709/223 |
| 6,049,827 | A * | 4/2000 | Sugauchi | H04L 41/22 709/219 |
| 6,054,987 | A * | 4/2000 | Richardson | H04L 41/0893 345/440 |
| 6,067,093 | A * | 5/2000 | Grau | G06T 11/206 345/440 |
| 6,185,612 | B1 * | 2/2001 | Jensen | H04L 41/12 709/220 |
| 6,304,273 | B1 * | 10/2001 | Bonnet | H04Q 3/66 345/440 |
| 6,307,573 | B1 * | 10/2001 | Barros | G06Q 30/0641 715/764 |
| 6,377,287 | B1 * | 4/2002 | Hao | G06F 16/904 715/853 |
| 6,470,383 | B1 * | 10/2002 | Leshem | G06F 11/32 709/223 |
| 6,636,239 | B1 * | 10/2003 | Arquie | H04L 41/22 709/220 |
| 6,778,386 | B2 * | 8/2004 | Garnett | G06F 1/183 174/16.1 |
| 6,804,712 | B1 * | 10/2004 | Kracht | H04L 41/0631 709/223 |
| 6,833,850 | B1 * | 12/2004 | Arquie | H04L 41/12 709/223 |
| 6,839,747 | B1 * | 1/2005 | Blumenau | G06F 9/468 709/223 |
| 6,894,645 | B1 * | 5/2005 | Akopian | G01S 19/25 342/357.48 |
| 6,952,208 | B1 * | 10/2005 | Arquie | G06T 11/206 345/440 |
| 6,977,587 | B2 * | 12/2005 | Pradhan | G01S 5/0289 340/539.1 |
| 6,996,611 | B1 * | 2/2006 | Muto | H04L 41/12 358/1.13 |
| 7,051,946 | B2 * | 5/2006 | Bash | H05K 7/20836 165/80.3 |
| 7,080,140 | B2 * | 7/2006 | Heitman | H04L 67/1097 709/201 |
| 7,114,555 | B2 * | 10/2006 | Patel | G05D 1/024 165/247 |
| 7,124,369 | B2 * | 10/2006 | Beaudoin | H04L 41/22 715/738 |
| 7,171,624 | B2 * | 1/2007 | Baldwin | G06F 3/0481 715/733 |
| 7,219,300 | B2 * | 5/2007 | Arquie | H04L 41/12 709/224 |
| 7,284,013 | B2 * | 10/2007 | Ochiai | H04L 67/36 |
| 7,293,067 | B1 * | 11/2007 | Maki | H04L 41/044 709/217 |
| 7,310,774 | B1 * | 12/2007 | Arquie | H04L 41/12 715/734 |
| 7,382,613 | B2 * | 6/2008 | Vinson | G06F 1/20 361/679.48 |
| 7,392,482 | B2 * | 6/2008 | Firebaugh | H04L 41/12 709/224 |
| 7,430,593 | B2 * | 9/2008 | Baldwin | H04L 67/1097 709/223 |
| 7,475,350 | B2 * | 1/2009 | Boyles | G06F 16/954 715/734 |
| 7,620,897 | B2 * | 11/2009 | Shah | G06F 9/44505 715/734 |
| 7,849,174 | B2 * | 12/2010 | Kawashima | H04L 41/12 709/223 |
| 7,877,729 | B2 * | 1/2011 | Amemiya | H04L 41/12 717/113 |
| 8,019,853 | B2 * | 9/2011 | Machida | H04L 41/22 709/224 |
| 8,316,304 | B2 * | 11/2012 | Yamashita | H04L 41/0253 715/734 |
| 8,397,177 | B2 * | 3/2013 | Barros | G06F 3/04847 715/810 |
| 8,421,615 | B2 * | 4/2013 | Ryu | G08C 21/00 340/539.13 |
| 8,472,183 | B1 * | 6/2013 | Ross | H05K 7/1492 361/679.5 |
| 8,483,996 | B2 * | 7/2013 | Patel | H05K 7/20745 703/1 |
| 8,543,681 | B2 * | 9/2013 | Bearden | H04M 7/006 709/224 |
| 8,700,066 | B1 * | 4/2014 | Buchhop | H04W 4/02 455/456.3 |
| 8,811,377 | B1 | 8/2014 | Weston et al. | |
| 8,839,113 | B2 * | 9/2014 | Hamilton | G06F 3/04817 715/734 |
| 8,843,850 | B2 * | 9/2014 | Barros | G06F 3/0484 715/810 |
| 8,868,715 | B2 * | 10/2014 | Bearden | H04L 41/12 709/224 |
| 8,943,352 | B1 * | 1/2015 | Warneke | G06F 1/3234 713/500 |
| 9,055,697 | B2 | 6/2015 | Lyon | |
| 9,203,894 | B1 * | 12/2015 | Ginzburg | H04L 67/125 |
| 9,435,874 | B2 * | 9/2016 | Edge | H04W 64/006 |
| 9,502,902 | B2 * | 11/2016 | Mumtaz | H04L 12/66 |
| 9,602,976 | B1 * | 3/2017 | Notohardjono | H04W 4/029 |
| 9,633,041 | B2 * | 4/2017 | Xu | G06F 3/0605 |
| 9,705,974 | B2 * | 7/2017 | Reddy | H04L 41/5054 |
| 9,767,559 | B1 * | 9/2017 | Rozenfeld | G06T 7/246 |
| 9,882,969 | B2 * | 1/2018 | Reddy | G06F 8/61 |
| 9,883,009 | B2 * | 1/2018 | Hamann | H04L 67/42 |
| 9,883,325 | B2 * | 1/2018 | DeCusatis | H04L 67/12 |
| 9,888,338 | B2 * | 2/2018 | DeCusatis | H04L 67/04 |
| 9,894,807 | B2 * | 2/2018 | Bard | H05K 7/20736 |
| 9,900,742 | B1 * | 2/2018 | Thoresen | H04W 48/16 |
| 9,916,738 | B2 * | 3/2018 | Lashina | G08B 21/0208 |
| 9,933,297 | B2 * | 4/2018 | Barnard | H05B 47/19 |
| 10,007,850 | B2 * | 6/2018 | Leung | G06K 9/00771 |
| 10,038,742 | B2 * | 7/2018 | Reddy | H04L 67/38 |
| 10,051,041 | B2 * | 8/2018 | Reddy | G06F 9/4408 |
| 10,085,118 | B1 * | 9/2018 | Thoresen | H04L 67/16 |
| 10,097,620 | B2 * | 10/2018 | Reddy | H04L 43/065 |
| 10,313,479 | B2 * | 6/2019 | Lochhead | H04L 41/5009 |
| 10,322,734 | B2 * | 6/2019 | Mesher | B61L 23/04 |
| 10,342,161 | B2 * | 7/2019 | Ross | H05K 7/20727 |
| 10,343,701 | B2 * | 7/2019 | Coston | B61L 15/009 |
| 10,441,847 | B2 * | 10/2019 | Wrigg | H04W 4/021 |
| 10,506,542 | B2 * | 12/2019 | Jovicic | H04W 64/00 |
| 10,516,981 | B1 * | 12/2019 | Lingle | H04L 67/28 |
| 10,587,480 | B2 * | 3/2020 | Singamsetty | H04L 41/22 |
| 10,721,845 | B2 * | 7/2020 | Bhagwat | G06F 30/20 |
| 10,806,982 | B2 * | 10/2020 | Wrigg | G09B 19/0038 |
| 10,863,330 | B1 * | 12/2020 | Lingle | H04W 4/026 |
| 10,942,968 | B2 * | 3/2021 | Wrigg | G09B 5/065 |
| 10,959,349 | B1 * | 3/2021 | Patel | H05K 7/20209 |
| 10,986,002 | B1 * | 4/2021 | Tangella | H04L 43/045 |
| 2003/0046390 | A1 * | 3/2003 | Ball | H04L 41/12 709/224 |
| 2003/0055932 | A1 * | 3/2003 | Brisse | H04L 67/1097 709/223 |
| 2008/0042898 | A1 * | 2/2008 | Sharma | G01S 5/0284 342/450 |
| 2008/0278292 | A1 * | 11/2008 | Nierenberg | G08C 21/00 340/10.3 |
| 2009/0286548 | A1 * | 11/2009 | Coronel | G01S 5/14 455/456.1 |
| 2010/0131788 | A1 | 5/2010 | Lo | |
| 2010/0171657 | A1 * | 7/2010 | Liu | G01S 5/0289 342/357.25 |
| 2012/0313612 | A1 | 12/2012 | Schneider et al. | |
| 2013/0187636 | A1 | 7/2013 | Kast et al. | |
| 2014/0280985 | A1 * | 9/2014 | Maguire | H04L 51/32 709/227 |
| 2016/0249487 | A1 * | 8/2016 | Bhagwat | G06F 1/20 |
| 2017/0149880 | A1 * | 5/2017 | Lochhead | G06F 9/00 |

(56) References Cited

U.S. PATENT DOCUMENTS

2018/0017660 A1  1/2018  Roquel
2018/0157532 A1* 6/2018  Kumar .................. G06F 9/5027
2019/0391227 A1* 12/2019 Zhang ....................... G01S 5/14

* cited by examiner

SYSTEMS AND METHODS FOR SENSING, RECORDING, ANALYZING AND REPORTING ENVIRONMENTAL CONDITIONS IN DATA CENTERS AND SIMILAR FACILITIES

CROSS-REFERENCE TO RELATED APPLICATIONS

This application is a continuation-in-part of U.S. patent application Ser. No. 16/383,216, filed on Apr. 12, 2019, entitled "SYSTEMS AND METHODS FOR SENSING, RECORDING, ANALYZING AND REPORTING ENVIRONMENTAL CONDITIONS IN DATA CENTERS AND SIMILAR FACILITIES," which is a continuation-in-part of U.S. patent application Ser. No. 15/369,537, filed on Dec. 5, 2016, entitled "SYSTEMS AND METHODS FOR SENSING, RECORDING, ANALYZING AND REPORTING ENVIRONMENTAL CONDITIONS IN DATA CENTERS AND SIMILAR FACILITIES," which claimed priority to U.S. provisional application No. 62/262,715, filed Dec. 3, 2015, entitled SYSTEMS AND METHODS FOR SENSING, RECORDING, ANALYZING AND REPORTING ENVIRONMENTAL CONDITIONS IN DATA CENTERS AND SIMILAR FACILITIES, all of which are hereby incorporated by reference in their entirety as though fully set forth herein.

TECHNICAL FIELD

The present disclosure pertains to sensing, measuring, recording, and reporting environmental parameters and conditions in facilities such as data centers. In particular, the present disclosure pertains to systems and methods of utilizing specialized electronics and software to control and record environmental conditions, power consumption, and/or other business and/or technical data obtained from the specialized electronics and/or other devices, placed throughout a facility. In some examples, the data may be analyzed and/or displayed in one or more detailed status reports (and/or other reports).

In some examples, the specialized electronics contemplated by the present disclosure may include sensors configured to sense, detect, determine, measure, and/or record temperatures, air pressures, air flows, various humidities, power consumption, indoor locations (detected by onboard electronics, GPS, beacons, time of flight/time of arrival, etc.), motion, occupancy, light, and/or vibrations. In some examples, the sensors may be mounted, attached, retained and/or otherwise positioned at various locations and/or heights throughout the facilities. In some examples, the sensors may be part of one or more sensor systems comprising one or more sensor modules and/or sensor strands.

In some examples, software may analyze the data from the sensors (e.g., using one or more Computational Fluid Dynamics (CFD) analysis techniques) and provide a detailed view into the environment, conditions, and/or equipment within the facility. For example, the software may analyze data from the sensors and determine power density, cooling requirements, cooling supply, air flow, temperature gradients, and/or other information pertaining to the facility. In some examples, the software may also provide visualizations that can be used to help understand the analytics and/or performance of the facility. Further, the software may allow entry of hypothetical data and/or analysis to test theoretical scenarios and/or circumstances. In some examples, the software may provide one or more recommendations to implement measures that increase the efficiency of the facility. In some examples, the software may consider standard operating procedures, best practices, audit and compliance logs, fault detection, and/or other information when making the recommendation(s).

In some examples, some or all of the data collected by the sensors and/or analytical data determined by the system may be mapped and/or otherwise associated with one or more geographic locations (e.g., of the sensors) within the facilities. In some examples, the data collected by the system and/or analytical data determined by the system may be used to assist in controlling the supporting infrastructure at the facility, such as, for example Heating, Ventilation and Air Conditioning (HVAC) equipment, lighting systems, computing systems, security systems, and/or other appropriate systems. In some examples, the data collected by the system and/or analytical data determined by the system may be used to assist in ensuring that facilities and infrastructure adapt to the most optimal and efficient operation as Information Technology (IT) loads in those facilities evolve.

BACKGROUND

Data centers store computer systems, such as, for example, computer servers. Such computer servers are sometimes used to host and/or facilitate network applications. Data centers also use a variety of associated support systems, such as, for example, environmental controls (air conditioning, fire suppression devices, etc.) as well as various security devices.

Data centers typically cost a substantial amount to build and maintain. Part of the cost is the enormous amount of electricity data centers need to run properly. The Department of Energy (DOE) has estimated that approximately half of the energy used to power a data center is used for the cooling and powering of equipment, with the other half going to actually running the servers and other computing equipment. According to DOE statistics, data center electricity use doubled between 2001 to 2006, from 30 to 60 billion kilowatt-hours of electricity, and stood at about 100 billion kilowatt-hours of electricity as of 2013. This amounts to about 2% of all U.S. electricity use and is increasing. Already, there are millions of data centers in the U.S., amounting to about one center per 100 individuals, and this is expected to continue to grow as more computing applications for large and small companies are moved to these facilities.

Data centers are often large enough to need to be housed in large buildings. There are often thousands of computing devices in a large data center. Additionally, the physical arrangement of the computing equipment can change inside data centers. Unfortunately, Computer Aided Design (CAD) drawings used for asset management are constantly out of date due to frequent upgrades and/or changes to the arrangement of equipment inside a data center.

Computing and/or power demands can also shift rapidly within data centers. For example, if the data center acquires a new customer that requires a substantial amount of computing power, the processors in the data center could see dramatically higher utilization in a short time frame. This increased utilization may produce significantly more heat in the physical space that the processors occupy. At the same time, support infrastructure (e.g., cooling systems, airflow distribution, humidity controls, etc.) may remain relatively static. This can drive up overall operating costs. Over time, incremental changes to the computing and/or power demands may increase the demands on the support infrastructure until the support infrastructure is no longer adequate to safely support the operation of the computing equipment. In some cases, IT changes can be so significant that the environmental conditions push elements of the IT equipment into fault tolerances and can put quality of service at risk.

Limitations and disadvantages of conventional and traditional approaches will become apparent to one of skill in the art, through comparison of such systems with the present disclosure as set forth in the remainder of the present application with reference to the drawings.

BRIEF SUMMARY

The present disclosure pertains to a system and method of utilizing software to control and record environmental and other data obtained from sensors and other devices, placed throughout a facility such as a data center. The system and methods are configured to analyze the information obtained from the sensors and to display the information in a detailed status report of the environmental conditions inside the facility, using graphs, maps, charts, windows, dashboards, histograms, scatter plots, and other types of presentation strategies.

As described herein, the disclosure provides for the sensing and measuring of environmental parameters and conditions, which may include some or all of the following: temperature, air pressure, humidity, and power consumption, and others, at various locations and heights throughout the facility. By using the software associated with the system, the user can receive detailed views into the power density, cooling requirements, and cooling supply of the facility. The software can also be configured to provide standard and custom visualizations to view and understand either the low level data, or the high level analytics. Either way, the user is provided analysis and an understanding of the performance of the facility.

In the some examples, the system of the present disclosure is a combination of five main components: sensor network nodes, known location nodes, gateway/edge nodes, a cloud computing component, and a user interface. In some examples, a mesh network (a wireless personal area network or WPAN) and/or a wide area network (WAN) are deployed to connect all of the five main components.

The present disclosure describes systems that have the potential to create flexibility and improve the performance of major support infrastructure assets within data centers that are traditionally static. Data center operators will have access to environmental information that previously had never existed or was not feasible to measure at this level of granularity, all in real time. Operators will also have to ability to reconfigure the sensor fleet with nominal input or configuration required, enabling the data required to keep the infrastructure in sync with the IT immediately available. Ultimately, data center operators are empowered to take action with their infrastructure and drive improvements in redundancy, efficiency, IT equipment performance, lower PUE, and decrease operating costs.

One of the benefits of the present disclosure is that data center operators will be able to review and revise their environmental settings, as described herein, and reduce electricity usage in a way that can offer immediate and ongoing savings. The amount of savings is highly dependent on the size of the data center, the equipment installed, and the infrastructure systems. For example, a typical 800 kw data center could see between $50,000 and $300,000 in power savings annually, which will be even higher as the trend for larger data centers and higher power density continues, thereby increasing these savings.

Another benefit of the present disclosure is the reduced cost in new designs. The design and commission of new data centers often start off with significantly over designed infrastructure, including designs that go beyond necessary redundancy requirements. Over time, data center operators slowly reach the "limits" of the infrastructure as the IT equipment rapidly changes inside and increases in density. Typically, once those limits have been reached, a consultant or an internal team is called in to redesign and often over design the system update, starting the process all over again.

The present disclosure, using appropriate sensors and similar devices, allows data center operators to have access to data at the granularity required, which does not currently exist. This information can be used for thorough thermodynamic analysis of the environmental systems, allowing for vastly improved efficiencies infrastructure efficiencies, and in many cases deferring the need for major upgrades. Infrastructure upgrades can vary in cost, but typically range between $50,000 and $2,000,000 depending on the size and scope of the improvement. The present disclosure also provides for a reduction in the operational cost of sensor management and data gathering.

In yet another benefit of the present disclosure, the sensors and software help improve infrastructure utilization and efficiency, increase reliability, and better protect against brown/black out power shortages. The present disclosure also improves monitoring and alarms that can serve as an early warning sign to help prevent a data center outage. According to an Emerson study in 2011, data centers worldwide suffered complete outages an average of 2.5 times during the year and lasted an average of 134 minutes per outage. The downtime cost of a data center averages approximately $300,000 per hour resulting in $1,700,000 in downtime per data center per year.

In the present disclosure, the sensors and similar devices attach to the outside of server racks using magnets, bolts, clips, or plugs, or any other attachment techniques that would not interfere with the operation of the system and sensors, as known by those having ordinary skill in the art and depending on the device. Although other configurations are possible, as long as the devices can be located properly to sense environmental and other data. The system software can be cloud hosted, virtualized, or run locally.

The system software controls the sensors and measures data from the sensors that are placed throughout the facility. The system software can also display detailed information or status of the environmental conditions inside the data center. Some of the environmental parameters to be measured include, but are not limited to, temperature, air pressure, humidity, and IT power. The system software provides a detailed view into the power density, cooling requirements, and cooling supply of the data center, among other information, including, but not limited to, Computational Fluid Dynamics (CFD) analysis indicating air flow and temperature gradient throughout the facility.

Standard and custom visualizations will be used to view the low level data, and high level analytics will be used to analyze the performance of the data center and recommend or allow the implementation of measures that increase the efficiency. Standard operating procedures, best practices, audit and compliance logs, and fault detection are built into the software, as described herein. Further, the software can allow for hypothetical analysis to test theoretical scenarios and circumstances. All of the actual measured values and calculated analytics determined by the system can be mapped to the geographic location of the sensors.

In the present disclosure, the hardware products, sensors and similar products, utilize magnets or other attachment devices to attach to the side of a server rack. The hardware products can even be used to replace existing power supply power cables, in some configurations. By utilizing multiple sensors and magnets that attach to shelves at various heights on the rack, the sensors can measure vital temperatures at multiple points on the rack, as opposed to a single temperature measurement. The sensors can also be used to measure relative humidity and ambient pressure which gives a full picture of the data center environment in general and at specific locations, which can be automatically mapped in the data center by the sensors. Power monitors can replace the existing server power supply cables, and the sensor configurations are completely customizable and flexible for a variety of data center configurations and for growth.

In some examples, a computing system of the present disclosure may use sensor data to keep track of pertinent activities and/or events involving server racks in a data center. This may assist in keeping track of and/or managing valuable data center assets. This may also help with fulfilling certain tracking and/or logging obligations for server tenants.

In addition to keeping track of events involving server racks, in some examples, the computing system may also be used to keep track of the health of cooling equipment. The cooling equipment may be located within the data center and/or outside of the data center. Keeping track of the health of the cooling equipment can be an important task, as proper operation of cooling equipment is essential to the continued functioning of a data center.

In some examples, the computing system may also be used to determine inefficiencies within the data center (e.g., pertaining to the environmental conditions of the data center). In some examples, the computing system may additionally recommend corrective action to remedy the inefficiencies. Because of the high cost of operating a data center, the cost savings that come with correcting even small inefficiencies can be significant. Likewise, the cost to allowing inefficiencies to fester can be significant.

Other objects and advantages of the present disclosure will become apparent to one having ordinary skill in the art after reading the specification in light of the drawing figures, however, the spirit and scope of the present disclosure should not be limited to the description of the exemplary embodiments contained herein.

Figure 1A:
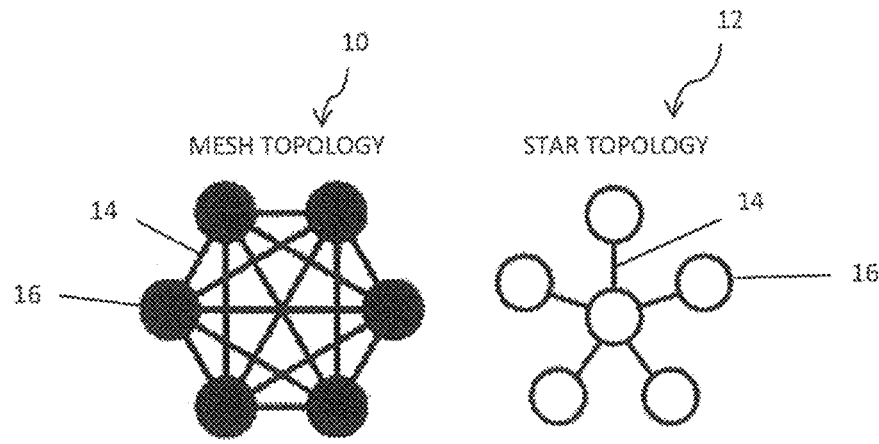
FIG. 1A illustrates a visualization of a mesh network topology versus a star network topology in accordance with the present disclosure.

The figures are not necessarily to scale. Where appropriate, the same or similar reference numerals are used in the figures to refer to similar or identical elements. For example, reference numerals utilizing lettering (e.g., rack sensor strand 2020a, plenum sensor strand 2020b) refer to instances of the same reference numeral that does not have the lettering (e.g., sensor strands 2020).

DETAILED DESCRIPTION

Some examples of the present disclosure may relate to a system, comprising a sensor system configured to mount to a server rack within a data center, the sensor system comprising a sensor configured to measure data within the data center, a computing system configured to receive the data, the computing system comprising processing circuitry, and memory circuitry comprising machine readable instructions which, when executed, cause the processing circuitry to determine a position of the sensor within the data center, determine an efficiency indicator based on the data measured by the sensor and the position of the sensor, determine whether there is an inefficiency within the data center based on the efficiency indicator, and in response to determining there is an inefficiency, recommend a solution to the inefficiency.

In some examples, the sensor comprises a first sensor, the sensor system further comprises a second sensor configured to measure data within the data center, the position of the first sensor comprises a first position, the memory circuitry comprises machine readable instructions which, when executed, further cause the processing circuitry to determine a second position of the second sensor within the data center, and the efficiency indicator is determined based on the data measured by the first and second sensors, as well as the first position of the first sensor, and the second position of the second sensor. In some examples, the position of the sensor is determined using position data obtained via a local positioning system or a relative positioning system of the data center. In some examples, the data comprises thermal data, humidity data, or pressure data. In some examples, the efficiency indicator comprises a hot spot, an airflow direction, an airflow magnitude, a horizontal temperature gradient, a vertical temperature gradient, or a server rack utilization. In some examples, the inefficiency comprises a temperature above a maximum temperature threshold, a reversed air flow, a horizontal temperature gradient below a low delta threshold, a reversed horizontal temperature gradient, a vertical temperature gradient above a high delta threshold, or a reversed vertical temperature gradient. In some examples, recommending the solution comprises generating a diagram showing a location of a server rack or cooling component within the data center that is impacted by the inefficiency or that will be impacted by the solution, generating a cost saving analysis that includes the solution, or generating a work order to implement the solution.

Some examples of the present disclosure relate to a method of determining inefficiencies in a data center, comprising measuring data within the data center via a sensor of a sensor system configured to mount to a server rack, determining a position of the sensor within the data center, determining an efficiency indicator based on the data measured by the sensor and the position of the sensor, determining whether there is an inefficiency within the data center based on the efficiency indicator, and in response to determining there is an inefficiency, recommending a solution to the inefficiency.

In some examples, the sensor comprises a first sensor, the data is measured via the first sensor and a second sensor of the server rack sensor system, the position comprises a first position, the method further comprises determining a second position of the second sensor within the data center, and the efficiency indicator is determined based on the first position and second position, as well as the data measured by the first sensor and second sensor. In some examples, determining the position of the sensor comprises determining the position via a local positioning system or a relative positioning system of the data center. In some examples, the data comprises thermal data, humidity data, or pressure data. In some examples, the efficiency indicator comprises a hot spot, an airflow direction, a change in temperature, or a temperature gradient. In some examples, the inefficiency comprises a temperature above a temperature threshold, a reverse air flow, a change in temperature above a high delta threshold, a change in temperature below a low delta threshold, a temperature gradient above a gradient threshold, or a reversed temperature gradient. In some examples, the solution comprises a reconfiguration of a server mounted in the server rack, a consolidation of a processing load to fewer server racks, a disbursement of the processing load to more server racks, an installation of a blanking panel in the server rack, an installation of a containment solution around the server rack, a modification of an air supply medium, or a cooling system configuration change.

Some examples of the present disclosure relate to a non-transitory machine readable medium, comprising machine readable instructions which, when executed by a processor determine a position of a sensor within a data center, the sensor being part of a sensor system mounted to a server rack within the data center, the sensor being configured to measure data within the data center, determine an efficiency indicator based on the data measured by the sensor and the position of the sensor, determine whether there is an inefficiency within the data center based on the efficiency indicator, and in response to determining there is an inefficiency, recommend a solution to the inefficiency.

In some examples, the position of the sensor is determined using position data obtained via a local positioning system or a relative positioning system of the data center. In some examples, the data comprises thermal data, humidity data, or pressure data. In some examples, the efficiency indicator comprises a hot spot, an airflow direction, a change in temperature, or a temperature gradient. In some examples, the inefficiency comprises an temperature above a temperature threshold, a reverse air flow, a change in temperature above a high delta threshold, a change in temperature below a low delta threshold, a temperature gradient above a gradient threshold, or a reversed temperature gradient. In some examples, the solution comprises a reconfiguration of a server mounted in the server rack, a consolidation of a processing load to fewer server racks, a disbursement of the processing load to more server racks, an installation of a blanking panel in the server rack, an installation of a containment solution around the server rack, a modification of an air supply medium, or a cooling system configuration change.

Some examples of the present disclosure relate to a cooling monitoring system, comprising a sensor system configured to mount to cooling equipment of a data center, the sensor system configured to measure a cooling equipment parameter, a computing system configured to receive the cooling equipment parameter, the computing system comprising processing circuitry, and memory circuitry comprising a stored health threshold and computer readable instructions which, when executed, cause the processing circuitry to determine a health of the cooling equipment based on the cooling equipment parameter, compare the health of the cooling equipment to the stored health threshold, and in response to determining the health of the cooling equipment is below the stored health threshold, perform an action.

In some examples, the action comprises generating a notification. In some examples, the action comprises determining whether there exists a work order corresponding to a planned or contemporaneous maintenance of the cooling equipment, in response to determining the work order does exist, indicating or confirming the work order is still needed, and in response to determining the work order does not exist, generating a notification or a new work order. In some examples, the computing system further comprises communication circuitry, the sensor system is configured to measure the cooling equipment parameter during a measuring time period, and the action comprises communicating, via the communication circuitry, with a security system regarding security data corresponding to the measuring time period, and associating the security data with the cooling equipment and the measuring time period in the memory circuitry.

In some examples, the memory circuitry further comprises a parameter signature, and wherein the health of the cooling equipment is determined based on a comparison of the cooling equipment parameter to the parameter signature. In some examples, the parameter signature is associated with good health. In some examples, the health of the cooling equipment is determined based on a degree of difference between the cooling equipment parameter and the parameter signature. In some examples, the cooling equipment parameter comprises a first cooling equipment parameter, the sensor system is configured to measure a second cooling equipment parameter, and the health of the cooling equipment is determined based on the first cooling equipment parameter and the second cooling equipment parameter. In some examples, the cooling equipment parameter comprises a temperature in or around the cooling equipment, a pressure in or around the cooling equipment, a humidity in or around the cooling equipment, a vibration of the cooling equipment, a vibration harmonic of the cooling equipment, or a power characteristic of the cooling equipment.

Some examples of the present disclosure relate to a method of monitoring cooling equipment of a data center, comprising measuring a cooling equipment parameter via a sensor system mounted on a component of the cooling equipment, determining, via processing circuitry, a health of the cooling equipment based on the cooling equipment parameter, comparing the health of the cooling equipment to a stored health threshold, and in response to determining the health of the cooling equipment is below the stored health threshold, performing an action.

In some examples, performing the action comprises generating a notification. In some examples, performing the action comprises determining whether there exists a work order corresponding to a planned or contemporaneous maintenance of the cooling equipment, in response to determining the work order does exist, indicating or confirming the work order is still needed, and in response to determining the work order does not exist, generating a notification or a new work order. In some examples, the cooling equipment parameter is measured during a measuring time period, and performing the action comprises communicating, via communication circuitry, with a security system regarding security data corresponding to the measuring time period, and associating the security data with the cooling equipment and the measuring time period in memory circuitry. In some examples, determining the health of the cooling equipment comprises determining the health based on a comparison of the cooling equipment parameter to a parameter signature stored in memory. In some examples, the parameter signature is associated with good health. In some examples, determining the health of the cooling equipment further comprises determining a degree of difference between the cooling equipment parameter and the parameter signature. In some examples, the cooling equipment parameter comprises a first cooling equipment parameter, and wherein the method further comprises measuring a second cooling equipment parameter via the sensor module, wherein determining the health of the cooling equipment comprises determining the health based on the first cooling equipment parameter and the second cooling equipment parameter. In some examples, the cooling equipment parameter comprises a temperature in or around the cooling equipment, a humidity in or around the cooling equipment, a vibration of the cooling equipment, a vibration harmonic of the cooling equipment, or a power characteristic of the cooling equipment.

Some examples of the present disclosure relate to a server rack monitoring system, comprising a sensor system configured to mount to a server rack, the sensor system configured to measure a server rack parameter, a computing system configured to receive the server rack parameter, the computing system comprising, processing circuitry, and memory circuitry comprising one or more stored parameter signatures and computer readable instructions which, when executed, cause the processing circuitry to determine whether a server rack event has occurred based on a comparison of the server rack parameter with the one or more stored parameter signatures, and in response to determining the server rack event has occurred, perform an action.

In some examples, the action comprises logging the server rack event in memory circuitry. In some examples, the sensor system is configured to measure the server rack parameter during a measurement time period, and wherein logging the server rack event in memory circuitry comprises associating the server rack event with the server rack and the measurement time period in memory circuitry. In some examples, the action comprises determining whether there exists a work order corresponding to the server rack event, in response to determining there does exist a work order corresponding to the server rack event, indicating the work order is in process, and in response to determining there does not exist a work order corresponding to the server rack event, generating a notification. In some examples, the computing system further comprises communication circuitry, the sensor system is configured to measure the server rack parameter during a measuring time period, and the action comprises communicating, via the communication circuitry, with a security system regarding security data corresponding to the measuring time period in response to determining that the server rack event occurred, and associating the security data with the server rack event, server rack, and the measuring time period in the memory circuitry. In some examples, the server rack parameter comprises a temperature in or around the server rack, a humidity in or around the server rack, a pressure in or around the server rack, a light intensity around the server rack, a vibration of the server rack, or a power characteristic of the server rack. In some examples, the sensor system is configured to adjust a setting of the sensory system in response to the server rack parameter being outside of a threshold range. In some examples, the setting comprises: an enablement of a sensor of the sensor system, a sample rate of the sensor system, a maximum frequency rate of the sensor system, a maximum measurement range of the sensor system, an operating mode of the sensor system, a power mode of the sensor system, a performance mode of the sensor system, or a bandwidth of the sensor system. In some examples, the memory circuitry comprises a plurality of parameter signatures and a previous server rack event, and the computer readable instructions, when executed, further cause the processing circuitry to select the one or more parameter signatures from the plurality of parameter signatures based on the previous server rack event. In some examples, the server rack event comprises a door open event, a door close event, a server installation event, a server removal event, a cable event, a rack disturbance event, a fan event, a drive failure, a server restart, a natural disaster, or an abnormal operation.

Some examples of the present disclosure relate to a method of server rack monitoring, comprising measuring a server rack parameter via a sensor system mounted to a server rack, determining, via processing circuitry, whether a server rack event has occurred based on a comparison of the server rack parameter with one or more parameter signatures stored in memory circuitry, and in response to determining the server rack event has occurred, performing an action.

In some examples, the action comprises logging the server rack event in the memory circuitry. In some examples, the server rack parameter is measured during a measurement time period, and logging the server rack event in the memory circuitry comprises associating the server rack event with the server rack and the measurement time period in the memory circuitry. In some examples, the action comprises determining whether there exists a work order corresponding to the server rack event, in response to determining there does exist a work order corresponding to the server rack event, indicating the work order is in process, and in response to determining there does not exist a work order corresponding to the server rack event, issuing an alert. In some examples, the action comprises associating security data with the server rack event in memory. In some examples, the server rack parameter comprises a temperature in or around the server rack, a humidity in or around the server rack, a vibration of the server rack, or a power characteristic of the server rack. In some examples, the method further comprises adjusting a setting of the sensor system in response to the server rack parameter being outside of a threshold range. In some examples, the setting comprises an enablement of a sensor of the sensor system, a sample rate of the sensor system, a maximum measurement range of the sensor system, an operating mode of the sensor system, a power mode of the sensor system, a performance mode of the sensor system, or a bandwidth of the sensor system. In some examples, the method further comprises determining a previous server rack event and selecting the one or more parameter signatures from a plurality of parameter signatures based on the previous server rack event. In some examples, the server rack event comprises a door open event, a door close event, a server installation event, a server removal event, a cable event, a fan event or a server restart.

The present disclosure pertains to systems and methods for obtaining environmental measurements (temperature, pressure, humidity, current, voltage, power, etc.) and associating them with sensor location or positional data and time data at a facility, such as a data center ("the environmental reporting system"). These devices are designed to operate as Internet of Things (IoT) devices that communicate over a customized low power mesh network. They are designed to solve two very complex problems simply: (1) environmental thermodynamic analysis and (2) sensor fleet management.

As described herein, the environmental reporting system provides for the sensing, analyzing and measuring of environmental parameters and conditions, which may include some or all of the following: temperature, air pressure, humidity, and power consumption, and others, at various locations and heights throughout the facility. By using the software associated with the system, the user can receive detailed views into the power density, cooling requirements, and cooling supply of the facility. The software can also be configured to provide standard and custom visualizations to view and understand either the low level data, or the high level analytics, so that the user is provided with analysis and an understanding of the performance of the facility.

To setup and install a sensor in the preferred embodiment is extremely easy. Turn it on, push a button, or use NFC to securely connect it to the network (no need to type in a Wi-Fi name or password), and use the magnets to attach it to a server rack (rack module). The sensor will begin to securely communicate encrypted traffic over the mesh network. Utilizing triangulation and trilateration technology, the sensors precisely, accurately, and automatically locate themselves in physical space and communicate their location data along with the environmental data.

This allows for the creation of a novel system and methods for measuring, analyzing and reporting environmental data that was previously unavailable, and at improved granularity. This allows for the generation of software to analyze locations of the sensors, collate the data, and create a 3D representation of the environment. Since the system collects time series data, as the space changes over time, the system gains valuable insights to the complicated thermodynamics and fluid dynamics in play. The ultimate result is better infrastructure management and greatly reduced energy costs.

The system is very robust and self-healing because of the energy scavenging hardware design and customized low power mesh network. The mesh network allows all the devices to use each other as relays to send data back to the server that collects it into the database, as opposed to a traditional star network topology that communicates back a single point, typically a Wi-Fi router. If a device fails, traffic can reroute back through the next nearest node automatically and is in effect, self-repairing.

An additional benefit to the mesh network protocol is that each additional device extends the range of the overall network by the net range radius of the additional device. This is similar to the idea of "daisy chains" in wired connections.

FIG. 1A shows the visualization of Mesh Topology 10 versus Star Network Topology 12. Each line 14 connecting the nodes 16 demonstrates a potential path that data could travel. The nodes 16 represent sensors.

Figure 1B:
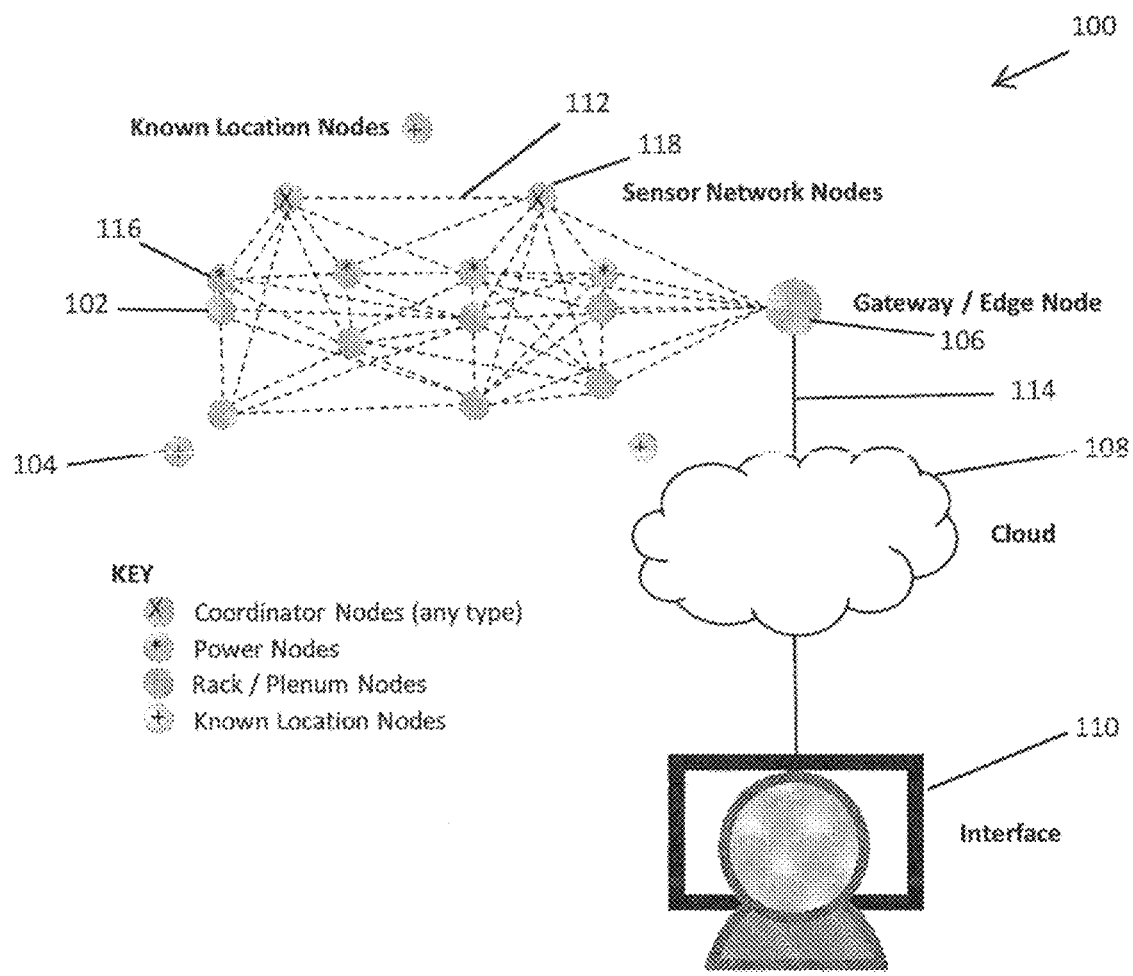
FIG. 1B illustrates components of an example environmental reporting system in accordance with the present disclosure.

FIG. 1B shows an operational topography map of the present disclosure in accordance with a preferred embodiment. The environmental reporting system 100 is a combination of five main components: the sensor network nodes 102, known location nodes 104, the gateway/edge nodes 106, the cloud 108, and the interface 110.

Figure 1C:
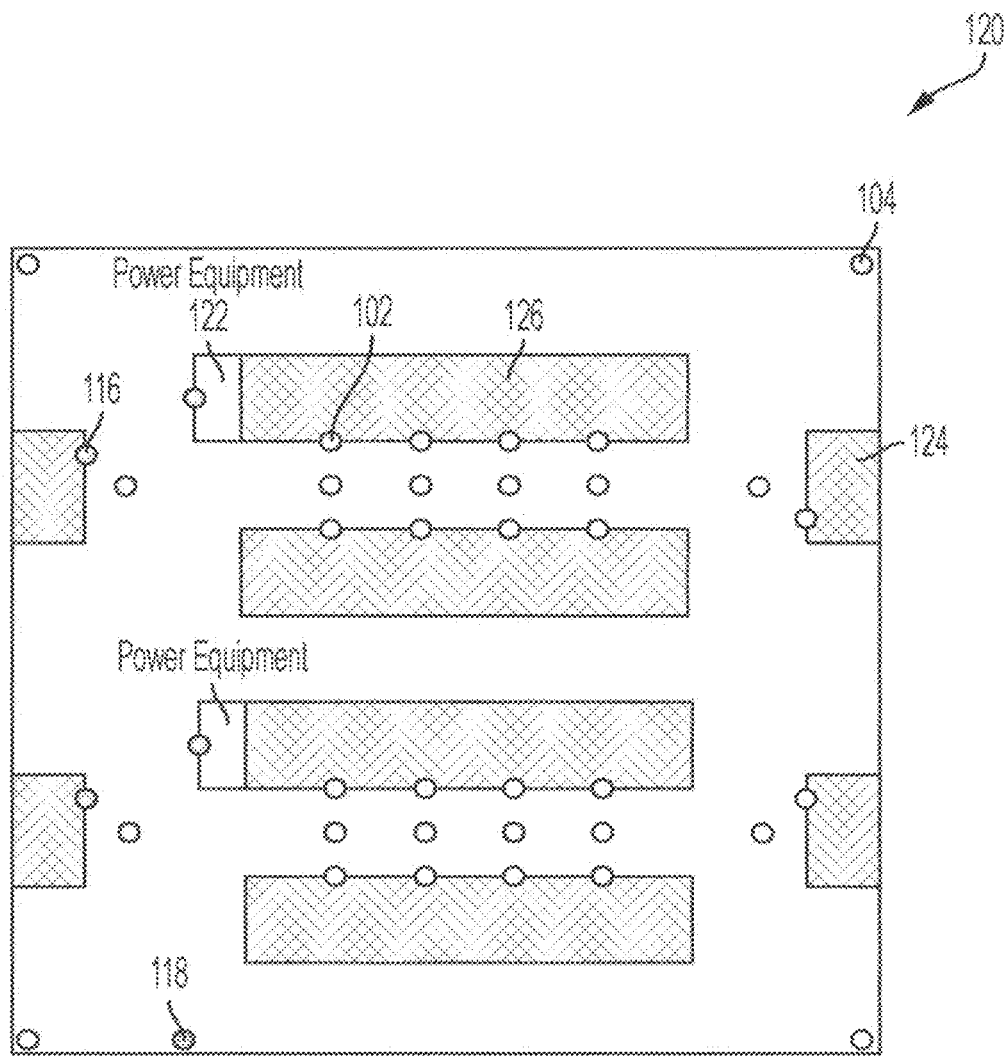
FIG. 1C illustrates an example data center with nodes of the environmental reporting system of FIG. 1B overlaid, in accordance with the present disclosure.

The sensor network nodes 102 consists of three different node types, with the purpose to measure different aspects of the data center 120 (see FIG. 1C). These aspects include measurements about the environment at the rack level (rack nodes 68, FIG. 5), measurements about the environment in the floor, ceiling, or plenums (plenum nodes 70, FIG. 6), and power measurements (power nodes 72, FIGS. 7 and 8). The sensor network nodes 102 exist in the WPAN 112.

The known location nodes 104 are permanently installed in the data center 120 and are used to assist in increasing the accuracy of indoor positioning. The known location nodes 104 also exist in the WPAN 112.

The gateway/edge nodes 106 connect the sensor network nodes 102 to the cloud 108, and provide processing power for analytics and decision making that require low latency. The gateway/edge nodes 106 exist in both the WPAN 112 and WAN 114.

The cloud 108 stores all of the data, provides processing power for the core analytics, and hosts the interface 110. The cloud 108 is understood by one having ordinary skill in the art.

The interface 110 is for the client to view the data and analytics, make decisions, and control the network and environment in the facility. The interface 110 is also used for displaying reports and other output and is understood by one having ordinary skill in the art.

The environmental reporting system 100 utilizes a mesh network 112, such as a wireless personal area network or WPAN, along with a wide area network 114 or WAN to connect all of the components. In the preferred embodiment, the WPAN 112 is the network created by the sensor network nodes. The WPAN 112 will exceed industry standard encryption methods and will be implemented via AES 128-bit encryption. Keys will be stored in dedicated tamper proof hardware and encrypted via 256-bit elliptical curve encryption. The WAN 114 is used for the bridge to communicate with the cloud. HTTPS and VPN tunnels will be implemented for communication purposes.

Of course, other connection platforms can be used to provide connections between the nodes, as understood by one having ordinary skill in the art. Additionally, the preferred embodiment utilizes power nodes 116 and coordinator nodes 118, which may be nodes of any type described above.

FIG. 1C shows a data center overlay 120. The data center 120 contains power equipment 122, cooling equipment 124, and rows of racks or enclosures 126 for supporting data storage and servers, among other devices. The environmental reporting system 100 provides for the strategic placement of the various nodes described above, including the sensor network nodes 102, known location nodes 104, power nodes 116 and coordinator nodes 118, in the data center, As an exemplary embodiment of the present disclosure, three separate hardware devices will be described: a rack node 68, a plenum node 70, and a power meter node 72.

Each of the three sensor network node types and the known location nodes will consist of the same core but each has different sensor arrays to perform their specific functions.

The core 64 provides the ability to charge the internal battery from micro USB or energy harvesting mechanisms, monitor the battery, regulate power, read and write to the sensor array, wirelessly communicate with other modules, provide indoor positioning, accept user input, and provide user output. The sensor array 66 is made up of the sensors that are connected to each node type.

The following features of the core 64 and sensor array 66 functional block diagrams set forth in FIG. 2, and will be explained below, along with additional details for mesh network, sleeping mesh network, locating and commissioning. The particular devices set forth herein are those used in connection with the preferred embodiment, and the claims are not intended to be limited to those particular devices, unless the device is actually recited.

Functional block [1] 20 is the external interface for charging a module from an external source. Charging 20 will be performed via a micro USB port 22 and will conform to the BC1.1 specification. All supporting integrated hardware will be selected to conform to this specification and to adequately support the power requirements of all of the functional blocks. Functional block [1] 20 will provide user output through functional block [7] 52.

Functional block [2] 24 is the onboard battery charging/energy harvesting/power source. Potential onboard power sources 24 include, but are not limited to, photovoltaic cells 26 and thermoelectric generators 2R The photovoltaic cells will use thin-film technology and the thermoelectric generators will use peltier elements. Both of the power sources will be selected and sized to adequately support the power requirements of all of the functional blocks. Photovoltaic cells 26 will be utilized when a light source is available and thermoelectric generators 28 will be utilized when a temperature differential is available. Functional block [2] 24 will provide user output through functional block [7] 52.

Functional block [3] 30 is the battery/power source. A rechargeable 18650 lithium ion battery 32 will be used. The Microchip 34 (MCP73831T and/or MCP73831-2ATI/MC) will be used for charge management. The Maxim MAX17043 and/or MAX17048G+ will be used for charge status monitoring, or a fuel gauge 36. The battery will be sized to adequately support the power requirements of all of the functional blocks without power being supplied from functional block [1] 20 or functional block [2] 24 for a minimum of two years. Functional block [3] 30 will provide user output through functional block [7] 52.

Functional block [4a] 38 is for wireless communication 34. Wireless communication 38 will be accomplished via 6LoWPAN (and/or a proprietary routing algorithm) on the 802.15.4 protocol. The preferred wireless radio is the decaWave DW1000. The wireless communication/carrier frequency will support 1,000+ nodes with low sampling frequency and low data rate. Typical ranges that will have to be supported are 50 feet in a data center environment. All wireless communications will be encrypted with AES 128-bit encryption, and keys will be stored using 256 elliptical curve encryption. Hardware encryption will be done with the Atmel ATECC508A and/or ATECC608A. Functional block [4] will provide user output through functional block [7] 52.

In an alternative embodiment, wireless communication 38 could be accomplished via low power Bluetooth. Bluetooth hardware could be selected to support the following protocols: Bluetooth 4.2 or newer, mesh networking (Bluetooth 4.2 or newer, CSRMesh, or custom developed), sleeping mesh networking (Bluetooth 4.2 or newer, CSRMesh, or custom developed), and beacons (iBeacon or uBeacon). NFC could be used to commission and configure a module via another NFC enabled device (smartphone). NFC hardware could also be selected to support ISO/IEC 14443 and ISO/IEC 18000-3. Functional block [4a] will provide user output through functional block [7] 52.

Functional block [4b] 38 also represents the indoor positioning. The indoor positioning will be accomplished with an ultra-wide band radio, which is the same or similar radio used for wireless communication in functional block [4a]. Indoor positioning will have an accuracy of <10 cm.

Functional block [5] 40 is data acquisition and orchestration. The hardware for the data acquisition and orchestration 40 will support analog and digital inputs, as well as the SPI, 12C, USART, and/or USB protocols, and general purpose processing to orchestrate the operations of the node. The preferred embodiment uses an ATMEL SAML21 and/or SAME70 microcontroller 42 for data acquisition and orchestration. Function block [5] 40 will be used to interface all of the other functional blocks.

Functional block [6] 44 is the user input. User input 44 will consist of a device on/off switch, button, touch pad, or other such technology 46, and a device commissioning switch 48, button, touch pad, or other such technology. The device commissioning input 48 will be used in place of or in tandem with the device commissioning from functional block [4] 34.

Functional block [7] 52 is the user output 52. User output 52 will consist of three RGB LEDs 54 (although more or less can be incorporated). In one configuration, the first RGB LED, power on LED will indicate if the unit is on, off, or has low power. The second RGB LED, status LED, will indicate the status of the wireless communications, indoor positioning and commissioning. The third RGB LED, notification LED, will indicate if the module is measuring alert or exception conditions. Different LED color combinations can be used for different indications.

Functional block [8] 58 is the sensor array 66. The sensors in the sensor array 66 are broken into two classifications, environment sensors 60 and power sensors 62. The environment sensors 60 are temperature, humidity, pressure, occupancy, movement, and lighting level. The temperature sensors to be selected will be a contact RTD sensor and digital sensor. The humidity sensor to be selected will be a digital relative humidity sensor. The pressure sensor to be selected will be a digital barometric pressure sensor. Pressure differentials will be used to calculate air flows. The power sensors 62 are current and voltage. Voltage and current sensors 62 will be selected to measure RMS values.

Exemplary sensors include temperature sensors (Bosch BME280, Murata NXFT), humidity sensors (Bosch BME280), pressure sensors (Bosch BME 280), light sensors (thin film), occupancy sensors, inertial movement sensors (STI LSM9DS1), and current sensors.

Communication from the gateway edge nodes 106 to the sensor network 102, 116, 118, and known location nodes 104 will be done over the WPAN 112. The gateway/edge nodes 106 will be able to communicate with the decaWave DW1000 radios in the sensor network nodes 102, 116, 118 and known location nodes 104. This can be done through a software defined radio (SDR) or through a USB interface (via the SAML21) to the decaWave radio.

Figure 3A:
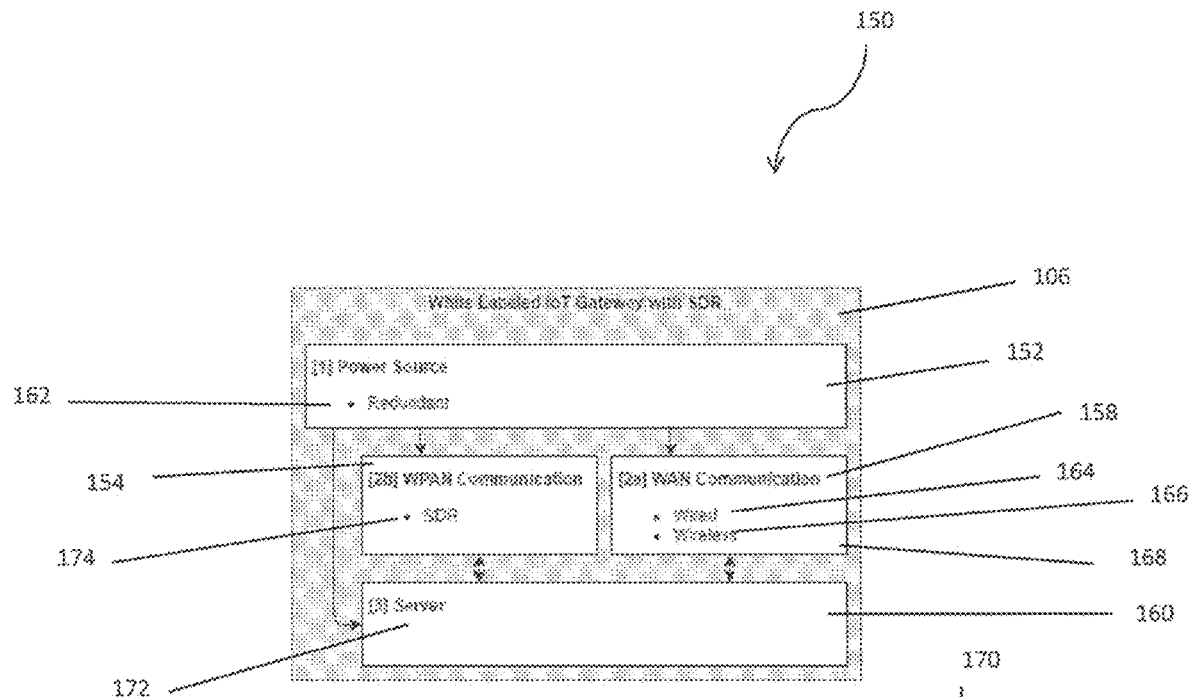
FIGS. 3A and 3B are block diagrams illustrating an example gateway/edge component system, in accordance with the present disclosure.
Figure 3B:
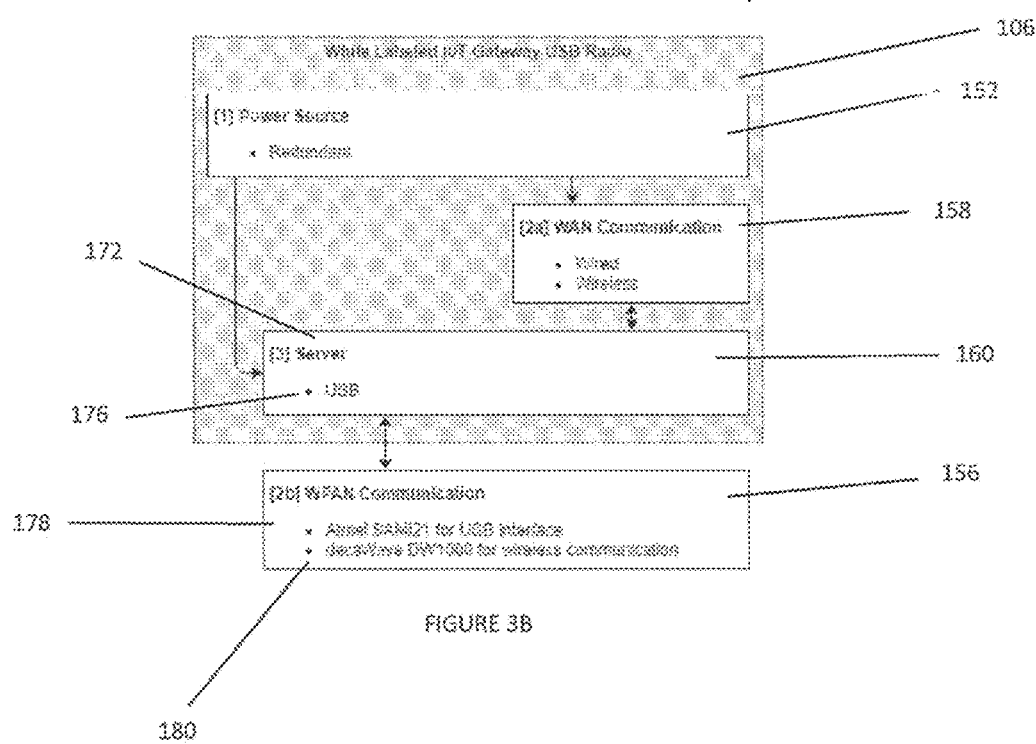

FIG. 3A shows the gateway/edge node functional block diagram 150 utilizing a SDR option for communication with the WPAN 112, and FIG. 3B shows the gateway/edge node functional block diagram 170 utilizing a USB interface option. Again, the particular devices set forth herein are those used in connection with the preferred embodiment, and the claims are not intended to be limited to those particular devices, unless the device is actually recited.

The gateway/edge node 106 can be selected from commercially available IoT gateways and configured or modified to work with the sensor network nodes 102, 116, 118, and known location nodes 104. The gateway/edge node 106 is made up of four functional blocks; the power source block 152, the WPAN communication block 154 (SDR option), the WPAN communication block 156 (USB interface option), the WAN communication block 158, and the server block 160.

The gateway/edge node 106 will be powered from redundant 120 V single phase power supplies 162. Communication from the gateway/edge nodes 106 to the cloud 108 will be done over the WAN 114. This will be accomplished with a wired Ethernet connection 164, a Wi-Fi connection 166, or a cellular connection 168. All traffic will be routed through a VPN.

The server 160 will be a general purpose server 172 capable of running a host operating system (OS), preferably Linux. The OS will run the application code required to utilize functional block [2a] 158 and functional block [2b] 154, 156. In addition to this, application specific code will be located on the server 160.

In WPAN communication 154, using the SDR option 150, the gateway/edge nodes 106 will have an SDR 174 that will be configured to communicate with, for example, the decaWave DW1000. In the SDR option 150 no physical modifications to the white labeled IoT gateway will be required. It will however be necessary to configure the SDR 174.

In the WPAN communication 156, using the USB radio option 170, the gateway/edge 106 will have a USB port 176, which will be connected to a microcontroller 178, for example, the Atmel SAML21, which will act as a USB peripheral. The microcontroller 178 will be connected to a decaWave DW1000 180, as the decaWave DW1000 180 requires a host microcontroller to communicate over USB 176. In the USB radio option 170, physical modifications will be needed to facilitate communication of the gateway/edge router with the WPAN 112. These modifications utilize the same microcontroller as in the other nodes to provide a USB interface to the same radio used in the other nodes, which will allow for the same drives for the radio that are used in the other nodes. These physical modifications will reside either internal or external to the white labeled IoT gateway.

As described herein, modules communicate over a customized network that allows the devices to operate wirelessly, reliably, and for long periods of time with a low power consumption. This allows the module network to heal itself in the event that a module fails or loses power. The network is extremely robust and does not require a centralized point to communicate data. Modules will talk to the nearest device enabling a "daisy chain" of communication. This allows the network to operate with a range that grows with the communication radius of each device.

Potential protocols include, but are not limited to, 6LoWPAN Bluetooth 4.2 or newer, CSRMesh, or a proprietary developed network that may utilize any of the aforementioned protocols. In the preferred embodiment, the gateway/edge nodes 106 will be selected from white labeled commercially available IoT gateways. The gateway/edge nodes 106 gather data from the sensor network, store a rolling window locally, and send the data to the cloud 108. The gateway/edge nodes 106 will also be responsible for analyzing the incoming data and performing any required low latency processes.

Additionally, sleeping mesh networks are a specific subset of mesh network that allow for reduced power consumption. In between communications, modules in a sleeping mesh network can further reduce their power consumption by shutting off their receive and transmit functions and relying on a precise internal clock to re-enable them for periods of communication.

Modules will automatically be located using triangulation and trilateration protocols from time of flight/time of arrive measurements and customized hardware controls that drive energy usage down to very low levels. This allows the module to tie sensor array measurements to a location and thusly create a detailed map of the modules and surroundings.

Commissioning will be defined as the automated process of adding a module to the network, configuring the module, and testing and verifying the communications and sensor array.

Figure 2:
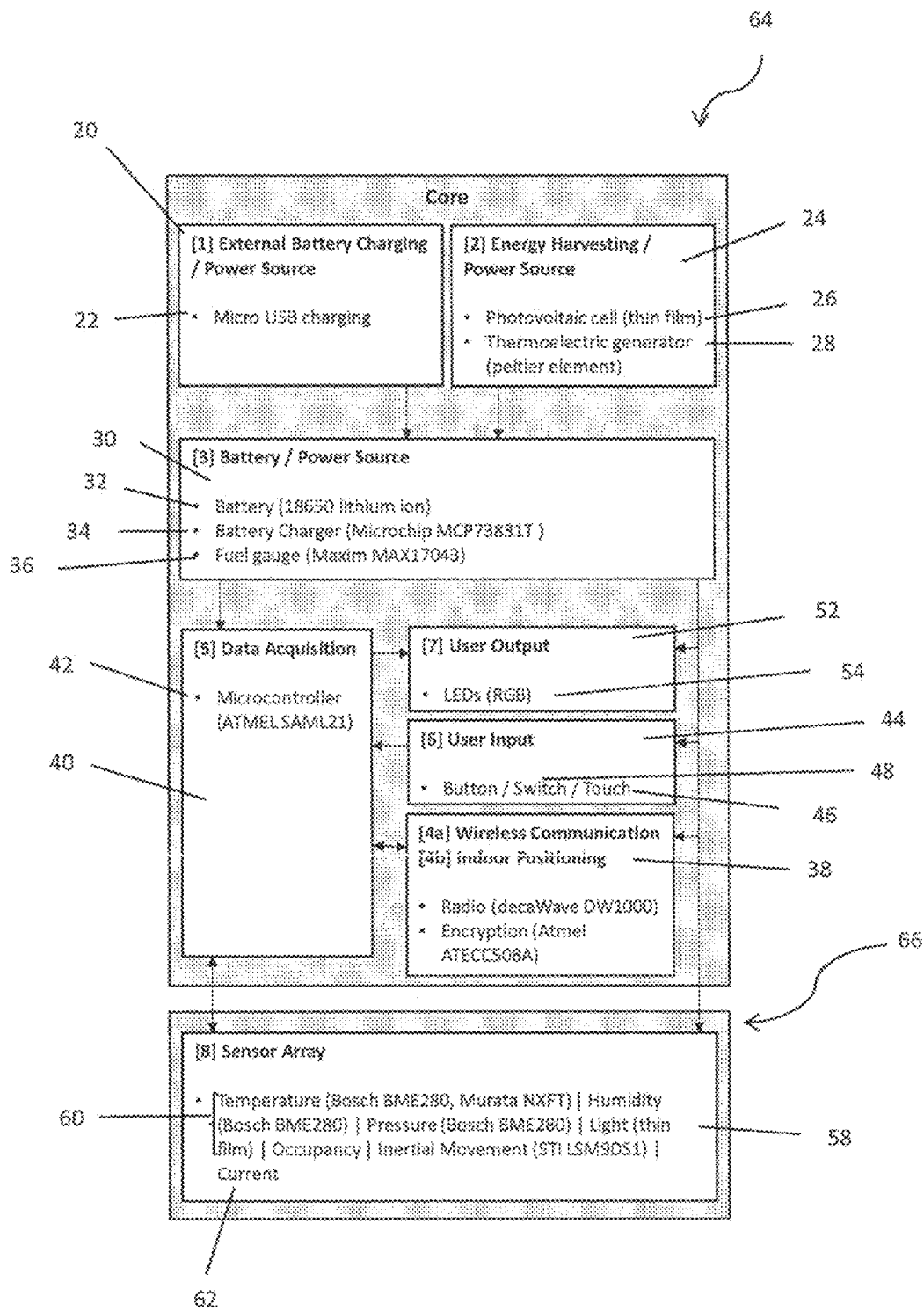
FIG. 2 is a block diagram illustrating an example core component system and sensor array system of the environmental reporting system of FIG. 1B, in accordance with the present disclosure.

FIG. 2 shows additional detail of the core 64 and configurable sensor functional blocks 66 of each module 16 as described herein. Again, the core functional block 64 will be contained in each of the three types of modules 16, while the variable functional block 66 will be contained in each of the three types of modules 16 but functional block [8] 58 will only contain the sensors relevant to the modules function.

In the preferred embodiment, the rack nodes 102 will consist of the core and the follow sensor array: seven temperature sensors, a humidity sensor, a pressure sensor, a light sensor, an occupancy sensor, and an inertial movement sensor. The plenum nodes 102 will consist of the core and the following sensor array: a temperature sensor, a humidity sensor, a pressure sensor, and an inertial movement sensor. The power nodes 116 will consist of the core and the following sensor array: a temperature sensor, a humidity sensor, a pressure sensor, a current sensor, and an inertial movement sensor. The known location nodes 104 will consist of the core and the following sensor array: a temperature sensor, a humidity sensor, a pressure sensor, and an inertial movement sensor. The gateway/edge nodes 106 will be selected from white labeled commercially available IoT gateways.

The hardware will be designed to be tamper proof. An attempted read of the firmware will cause the firmware to be erased. This will be deployed via a RTC tamper alert with a backup coin cell battery and the Atmel ATECC508A and/or ATECC608A. All active core and sensor parts will have registered IDs. Any part without a registered ID will be rejected. This tamper resistance will be implemented via a blockchain structure.

Additionally, the core requirements are as follows: Operating Voltage: 3.3 V, Operating Temperature: −20° C. to 65° C., Operating Humidity: 0% RH to 100% RH, Operating Pressure: 300 hPa to 1100 hPa, Power Consumption: 5 mA normal operation. The sensor array requirements are as follows: Operating Voltage: 3.3 V, Interface: Analog or digital (I2C, SPI, or USART), Operating Temperature: −20° C. to 65° C., Operating Humidity: 0% RH to 100% RH, Operating Pressure: 300 hPa to 1100 hPa, Power Consumption: ≤0.5 mA normal operation.

The passive support components requirement is as follows: Operating Temperature: −20° C. to 65° C., Operating Humidity: 0% RH to 100% RH, Operating Pressure: 300 hPa to 1100 hPa. The environmental conditions are as follows: Operating Temperature: −20° C. to 65° C., Operating Humidity: 0% RH to 100% RH, Operating Pressure: 300 hPa to 1100 hPa. The service requirements are as follows: Users will be able to replace/recharge the battery, replace the antenna and everything else will be performed via field service or RMAs.

Figure 4A:
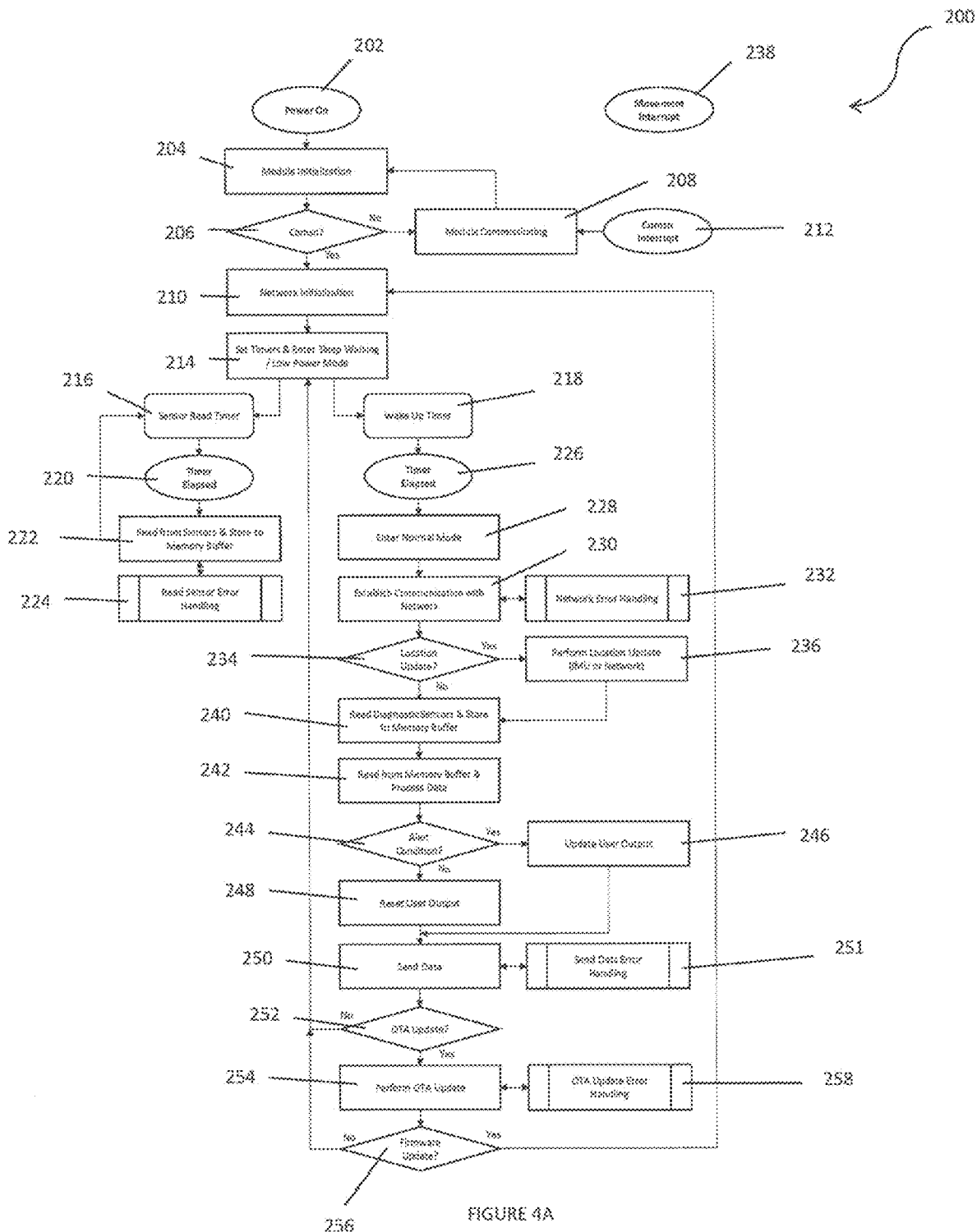
FIGS. 4A and 4B are flowcharts illustrating an example main state machine for the sensor network nodes of the environmental reporting system of FIG. 1B, in accordance with the present disclosure.
Figure 4B:
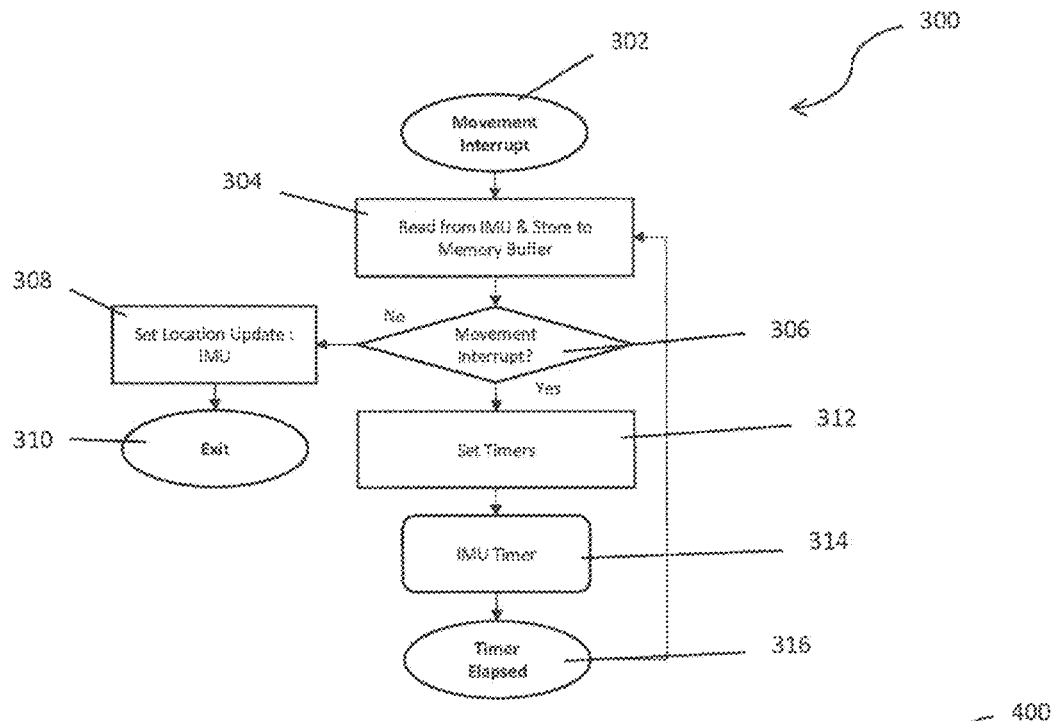
Figure 4C:
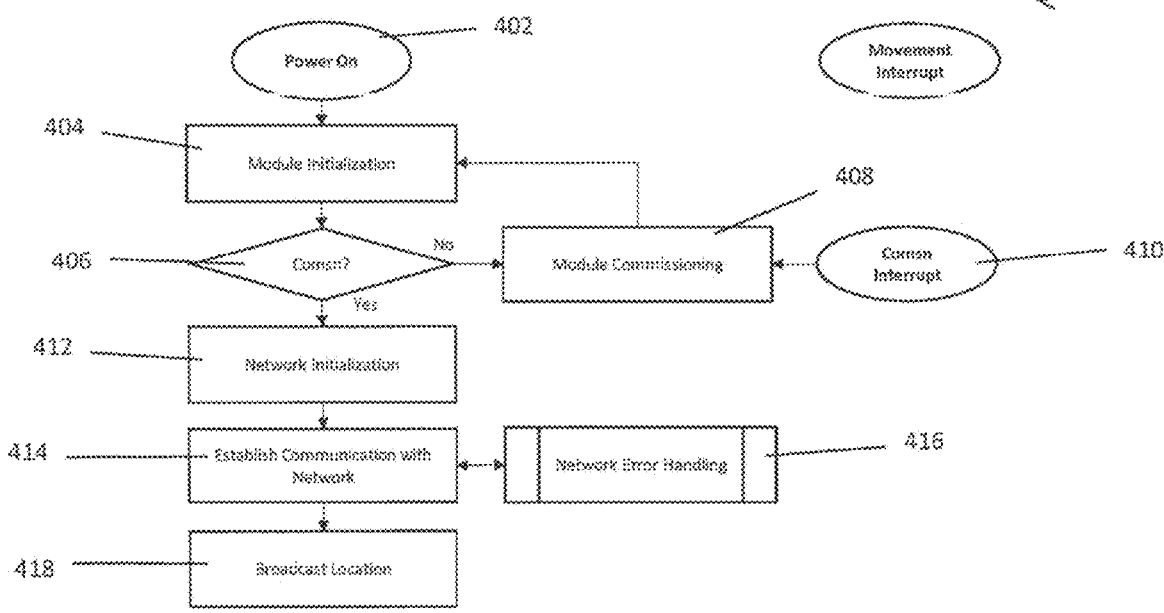
FIGS. 4C and 4D are flowcharts illustrating an example main state machine for the known location nodes of the environmental reporting system of FIG. 1B, in accordance with the present disclosure.
Figure 4D:
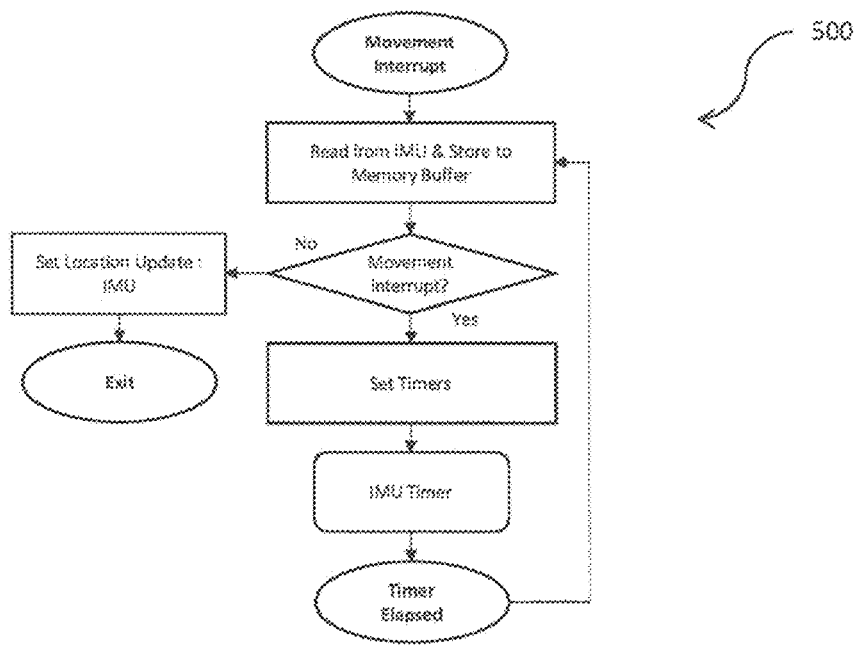
Figure 4E:
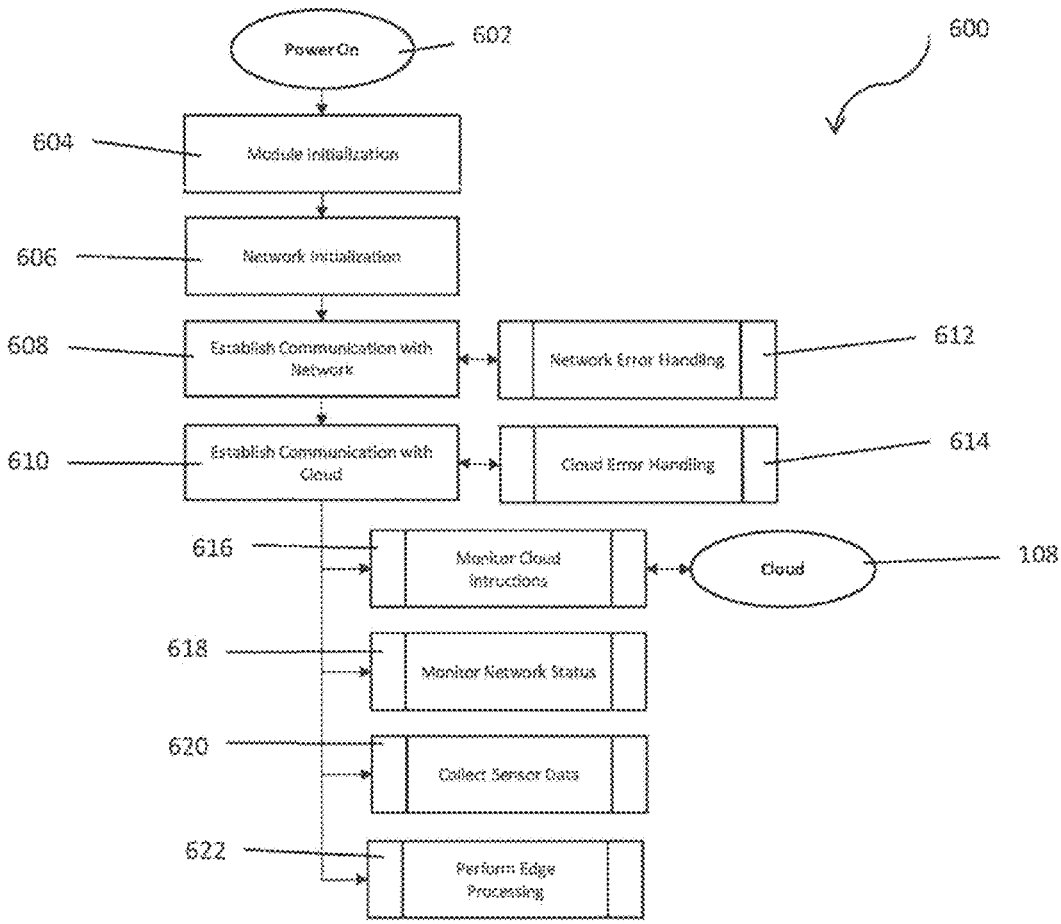
FIG. 4E is a flowchart illustrating an example gateway/edge application, in accordance with the present disclosure.

The firmware requirements for the sensor network nodes are modeled in two sections: the main state machine including synchronous interrupts and the asynchronous interrupts. FIGS. 4A and 4B show flowcharts for the main system including asynchronous interrupts, while FIGS. 4C and 4D show flowcharts for the main system including the synchronous interrupts. FIG. 4E shows a flowchart for the gateway/edge nodes 106.

FIG. 4A shows a flowchart of the main state machine 200 of the environmental reporting system 100 in accordance with the present disclosure, including synchronous interrupts, for the sensor network nodes 102, 116, 118. Once powered on 202, the node 16 initializes itself 204 with the last known configuration. Upon completion, the node 16 will then check to see if it has been commissioned to the network 206. As described herein, commissioning is the process of registering, updating configuration, and adding a node 16 to the WPAN 112. If the node 16 has not been commissioned it will enter the commissioning sequence 208, then it will re-initialize itself with the new configuration parameters 210. Commissioning can also be manually initiated as indicated by the commissioning interrupt 212. This will be in the form of a user input that can happen at any time.

Otherwise the node 16 will set its wake up timers then enter a low power sleep mode 214. The sensor read timer 216 is used to sample the data from the sensors 16 and the wake up timer 218 is used to send the data sampled from the sensors to the gateway/edge node 106. The wake up timer 218 will be a multiple of the sensor read timer 216. This allows for more energy efficient operation.

Once the sensor read timer has elapsed 220, with nominal wake up, the node 16 will read from the sensors 60 in the sensor array 58 and store the values into a buffer 222. If there were any errors from reading the sensors 60, those will be handled as well 224. When these steps are complete, the node 16 will reset its sensor read timer 214 and return to a full sleep, starting the process over.

Once the wake up timer has elapsed 226 (which is a multiple of the sensor read timer of lower priority, indicating that when both timers elapse, the sensor read timer process will run first), the node 16 will completely wake itself up 228 and establish communication with the network 230. If there are errors in establishing communication with the network, those will be handled 232.

After this step, the node 16 will check if a location update is required 234. There are two forms of location updates 236, IMU and network. An IMU update will be triggered by the movement interrupt state machine 238, as described herein. If an IMU location update is to be performed, the node 16 will package all of the data from the IMU to be transmitted back to the gateway/edge node 106 later. If a network location update is to be performed, which will be a command issued over the WPAN 112 from the gateway/edge node 106, the node 16 will perform network ranging with its peers in the WPAN 112 and package the data to be transmitted back to the gateway/edge node 106 later.

The next step in the sequence, is for the node 16 to read or acquire from its diagnostic sensors 240 (network status from the wireless radio and battery status from the fuel gauge and battery charger) and package the data acquired. The node 16 will then read, process, and package the data stored from the sensor read timer routine 242. Based off the configuration on the node 16, the node 16 will then look at the packaged data to see if an alert condition has been determined 244.

An example of an alert condition could be a temperature value that is too high or a low battery. If there is an alert condition, the user output will be updated 246; otherwise the user output will be reset 248. Once these steps have been performed, the node 16 will transmit all of the packaged data 250 over the WPAN 112 to the gateway/edge node 106, and any errors will be resolved 251.

Finally, the node 16 will check for an over the air or OTA update 252. This will be issued from the gateway/edge node 106. If the OTA update was only for a new configuration, the node 16 will perform the update 254, reset its timers, and go back to sleep 214, starting the process over again. If the OTA was a firmware update 256, the node will perform the firmware update and reset itself back to network initialization 210. If there were any errors, those will be resolved 258.

FIG. 4B shows a flowchart of the asynchronous interrupts 300 of the main state machine 200 of the environmental reporting system 100, for the sensor network nodes 102, 116, 118, in accordance with the present disclosure. The asynchronous interrupts 300 will be generated if the IMU detects movement 302. This will be a hardware interrupt that is supported by both the IMU and microcontroller 40.

Upon the interrupt firing, the node 16 will read the data from the IMU and store it to a buffer 304. Then will node 16 will check to see if the interrupt is still valid 306, if the node 16 is still being moved. If the interrupt is no longer valid, the node 16 will set an IMU location update 308 that will be handled by the main state machine 200, as described above, and exit 310.

If the interrupt is still valid, the node will set a timer 312 that will be used to trigger the next read of the data from the IMU 314, when the timer elapses 316, thus starting the process over again. All of this will be done while the node 16 is still sleeping.

FIG. 4C shows a flowchart of the main state machine 200 of the environmental reporting system 100, including synchronous interrupts 400 for the known location nodes 104, in accordance with the present disclosure. Once powered on 402, the node 16 initializes itself with the last known configuration 404. Upon completing that step, the node 16 will check to see if it has been commissioned to the network 406.

Commissioning, as described herein, is the process of registering, updating configuration, and adding a node 16 to the WPAN 112. If the node 16 has not been commissioned, it will enter the commissioning sequence 408, and then re-initialize itself with the new configuration parameters 404. Commissioning can also be manually initiated as indicated by the commissioning interrupt 410. This will be in the form of a user input that can happen at any time.

Otherwise the network will be initialized 412, and the node 16 will establish communication with the network 414. If there are errors in establishing communication with the network, those will be resolved 416. After communications with the network have been established 414, the node 16 will broadcast its location 418 to assist in network location updates. As described herein and shown in FIG. 4A, the main state machine 200, will check 252 and perform OTA updates 254, which will be handled as they are for the sensor network nodes.

FIG. 4D shows a flowchart of the asynchronous interrupts 500 of the main state machine 200 of the environmental reporting system 100, in accordance with the present disclosure. The asynchronous interrupts 400 of the main state machine 200 for the known location nodes 104 is the same as that described above and shown in FIG. 4B for the sensor network nodes 102, 116, 118.

FIG. 4E shows a flowchart of the gateway/edge node application 600 of the environmental reporting system 100, in accordance with the present disclosure. The gateway/edge node application 600 will run on the OS installed on the gateway/edge node 106. At power on 602, the application 600 will automatically start and will initialize itself 604 with the last know configuration. Once that step is performed, the application 600 will initialize the network 606 for the WAN 114 and WPAN 112.

Next, the application 600 will establish communication with WPAN 608, and establish communication with WAN 610, and resolve any errors with establishing communication with WPAN 612, and resolve any errors with establishing communication with WAN 614, appropriately.

Next, the application 600 will run four continual sub-processes; monitor cloud instructions 616, monitor network status 618, collect sensor data 620 and perform edge processing 622.

The monitoring cloud instructions 616 sub-process will maintain communication with the cloud 108 to listen for instructions. These instructions could include, but are not limited to, pushing OTA updates, updating configurations, requests for data, and updating status.

The monitoring network status 618 sub-process will continually monitor the status of the WPAN 112.

The collect sensor data 620 sub-process will continually orchestrate the process of gathering the data from the WPAN 114.

The perform edge processing 622 sub-process will perform any necessary processing on the data from the WPAN 112 that is not done on the other nodes 16 or the cloud 108. This sub-process will be utilized to lower latency and decrease power usage. Examples of edge processing are performing data center equipment control decisions, communicating with data center equipment, and assisting with real time calculations.

Figure 5:
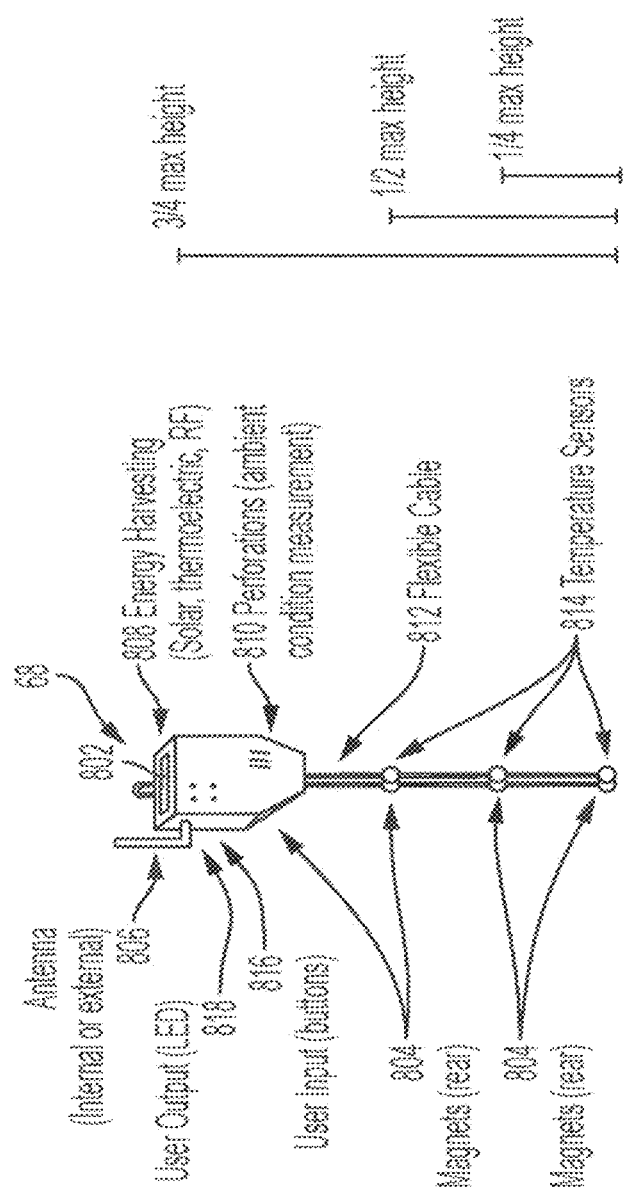
FIG. 5 illustrates an example rack node of the environmental reporting system of FIG. 1B, in accordance with the present disclosure.
Figure 11:
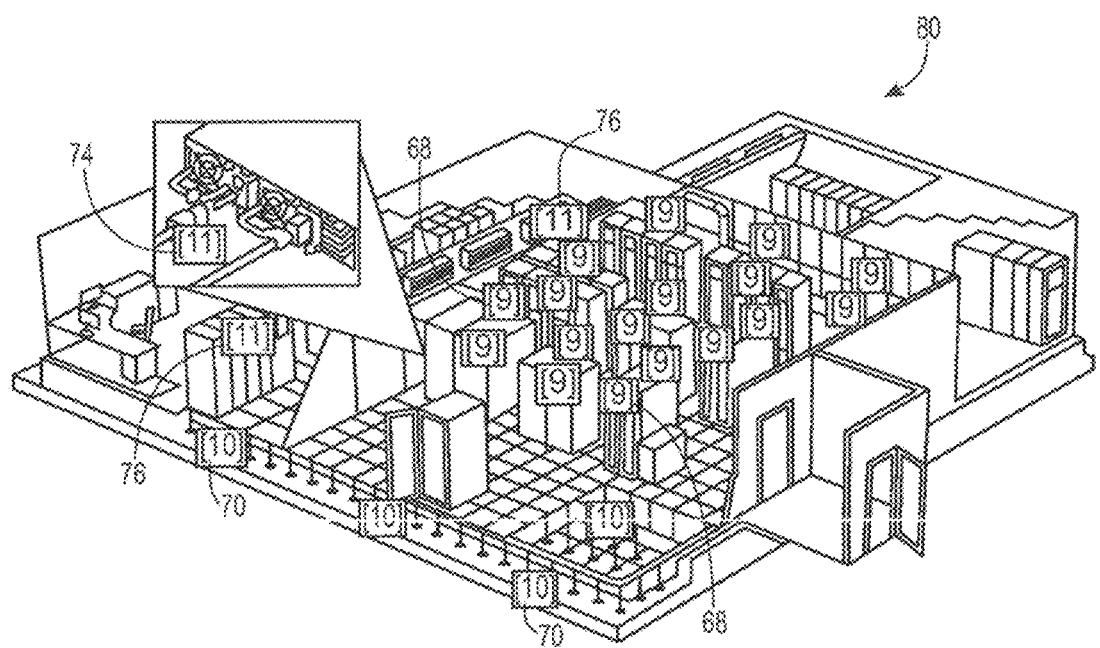
FIG. 11 illustrates an example data center in accordance with the present disclosure.

FIG. 5 shows a rack module or node 68. The rack module 68 measures the environmental conditions of data center at various spatial locations and heights. This will be accomplished by attaching the rack modules to the top front and rear of the server racks at different locations across the data center (FIG. 11).

The rack modules 68, are made up of a housing 802, and will be attached to the rack with magnets 804, although other attachment methods can be used. The rack modules 68 also contain an antenna 806, which can be internal or external, and energy harvesting functionality 808, as described herein. The housing 802 contains perforations 810 for ambient condition measurements, and a flexible cable 812. Temperature sensors 814 are used to determine the temperature, and each rack module 68 contains inputs 816 such as buttons, and outputs 818, such as LEDs.

In the preferred embodiment, each rack module 68 will be capable of measuring temperatures at three different heights (¼, ½ and ¾ of the rack height), humidity at a single height, barometric pressure at a single height, and identifying its location.

The sensor network nodes 68 must be able to withstand a standard drop tests from 12 feet, withstand 400 lbs. of pressure, with >2,000 on/off cycles. The nodes 68 will be made out of molded plastic, rubber cable sheathings and magnets, with a smooth texture. The color will be orange grey and black, and they will need to have mounts for the main PCB, the user input/output PCB, the antenna, the energy harvesting mechanisms, and the flexible cable. Holes or perforations will need to be made to attach the antenna, expose the user input/output, mount the flexible cable, and let ambient conditions into the unit. Magnets will have to be affixed to the module. The unit should be less than 3 inches long, 2 inches wide and 1 inch deep, except that the harvesting mechanism may extend past the stated dimension by 1 inch.

Figure 6:
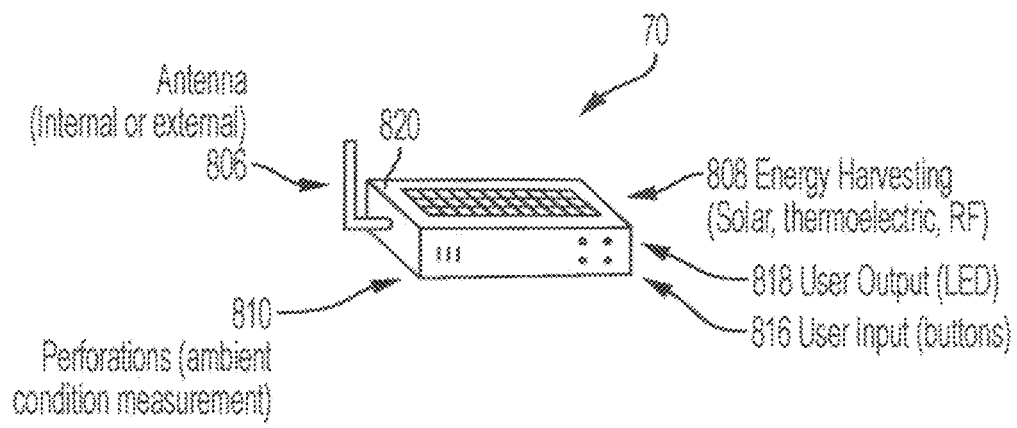
FIG. 6 illustrates an example plenum node of the environmental reporting system of FIG. 1B, in accordance with the present disclosure.
Figure 9:
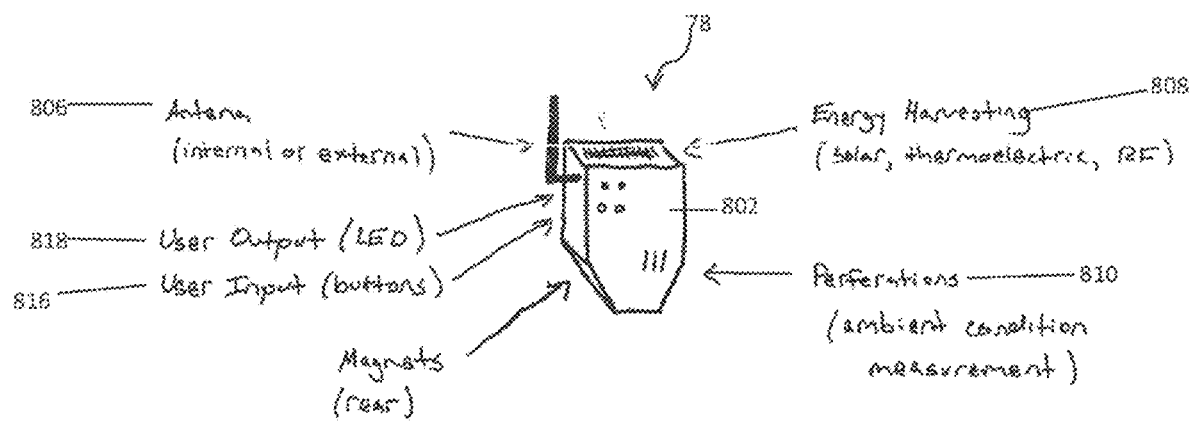
FIG. 9 illustrates an example known location node of the environmental reporting system of FIG. 1B, in accordance with the present disclosure.

FIG. 6 shows the subfloor or plenum module 70, which measures, which records the environmental conditions of data center at various spatial locations of the subfloor, ceiling, or plenums. This will be accomplished by placing the subfloor or plenum modules 70 at different locations across the data center (FIG. 9). The plenum modules 70 contains a different housing 820 than the rack modules 68 (although it could be the same), and also contain an antenna 806, which can be internal or external, and energy harvesting functionality 808. The housing 820 contains perforations 810 for ambient condition measurements. Each plenum module 70 contains inputs 816 such as buttons, and outputs 818, such as LEDs.

In the preferred embodiment, each plenum or subfloor module 70 will be capable of measuring temperature, barometric pressure, and identifying its location.

Similarly, the plenum nodes 70 must be able to withstand a standard drop tests from 12 feet, withstand 400 lbs. of pressure, with >2,000 on/off cycles. The plenum nodes 70 will be made out of molded plastic, rubber cable sheathings and magnets, with a smooth texture. The color will be orange grey and black, and they will need to have mounts for the main PCB, the user input/output PCB, the antenna, the energy harvesting mechanisms, and the flexible cable. Holes or perforations will need to be made to attach the antenna, expose the user input/output, mount the flexible cable, and let ambient conditions into the unit. Magnets will have to be affixed to the module. The unit should be less than 3 inches long, 3 inches wide and 1 inch deep, except that the harvesting mechanism may extend past the stated dimension by 1 inch.

Figure 7:
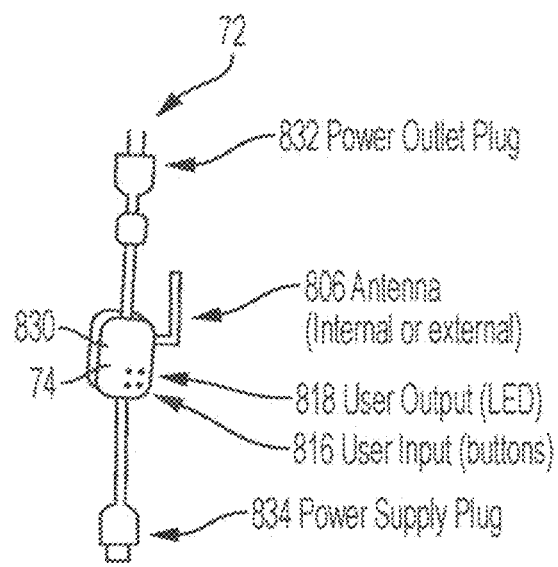
FIG. 7 illustrates an example inline power node of the environmental reporting system of FIG. 1B, in accordance with the present disclosure.
Figure 8:
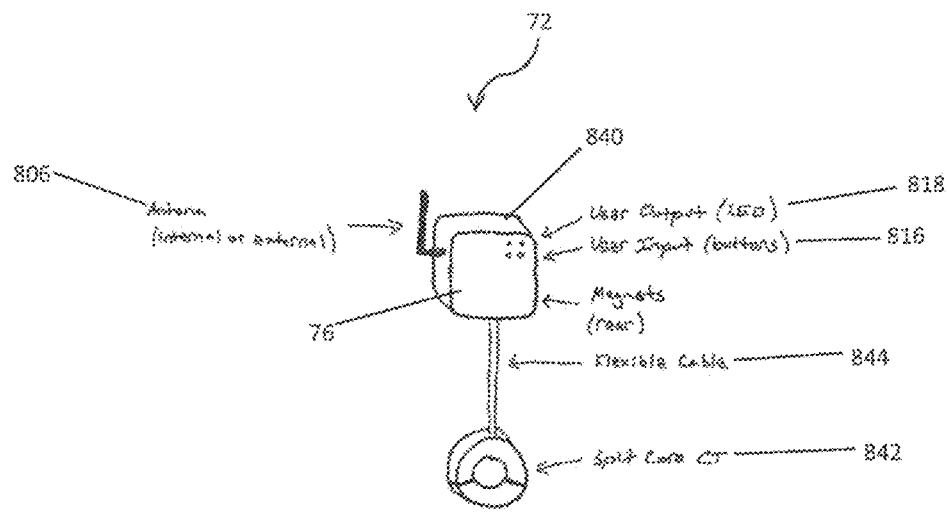
FIG. 8 illustrates an example clamp on power node of the environmental reporting system of FIG. 1B, in accordance with the present disclosure.

FIGS. 7 and 8 show the power meter modules or nodes 72, which measures the power demand and consumption of equipment. There are two designs for the power meter module 72, an inline design 74 (FIG. 7) and a clamp on design 76 (FIG. 8).

The inline module 74 will replace each server's standard power cord with an inline power meter module 74. The inline module 74 will also have a housing 830, and a power outlet plug 832. An antenna 806, user input 816 and output 818, along with a power supply plug 834. Each inline power module 74 will be capable of measuring server current, server voltage, and identifying its location.

The clamp on module 76 will attach to any power supply cable in the data center between 120 and 480 volts. The clamp on module 76 will also have a housing 840, but no power outlet plug 832 or power supply plug 834. Instead, the clamp on module 76 will use a split core CT 842 and a flexible cable 844 to attach to the device, along with an antenna 806, and user input 816 and output 818. Each clamp on power module 76 will be capable of measuring server current and identifying its location.

Similar to the units described above, the in-line power node 74 will be made out of molded plastic, rubber 120 V cable, power output plug, power supply plug, with a smooth texture. The color will be orange grey and black, and they will need to have mounts for the main PCB, the user input/output PCB, the antenna, the energy harvesting mechanisms, and the flexible cable. Holes or perforations will need to be made to attach the antenna, expose the user input/output, mount the flexible cable, and let ambient conditions into the unit needs to be in line with a server power supply cable. The unit should be less than 3 inches long, 2 inches wide and 1 inch deep, except that the harvesting mechanism may extend past the stated dimension by 1 inch.

While the clamp-on power node 76 will be made out of molded plastic, rubber 120 V cable, power output plug, power supply plug, with a smooth texture. The color will be orange grey and black, and they will need to have mounts for the main PCB, the user input/output PCB, the antenna, the energy harvesting mechanisms, and the flexible cable. Holes or perforations will need to be made to attach the antenna, expose the user input/output, mount the flexible cable, and let ambient conditions into the unit. A split core CT will have to be attached to the device. The unit should be less than 3 inches long, 2 inches wide and 1 inch deep, except that the harvesting mechanism may extend past the stated dimension by 1 inch.

FIG. 9 shows a known location node 78. The known location nodes 78 are made up of a housing 802, which contains perforations 810 for ambient condition measurements, and magnets 804 for mounting the device (although other attachment devices can be used). The known location node 78 also contains an antenna 806, which can be internal or external, and energy harvesting functionality 808, as described herein. Each rack module 68 contains inputs 816 such as buttons, and outputs 818, such as LEDs.

Figure 10:
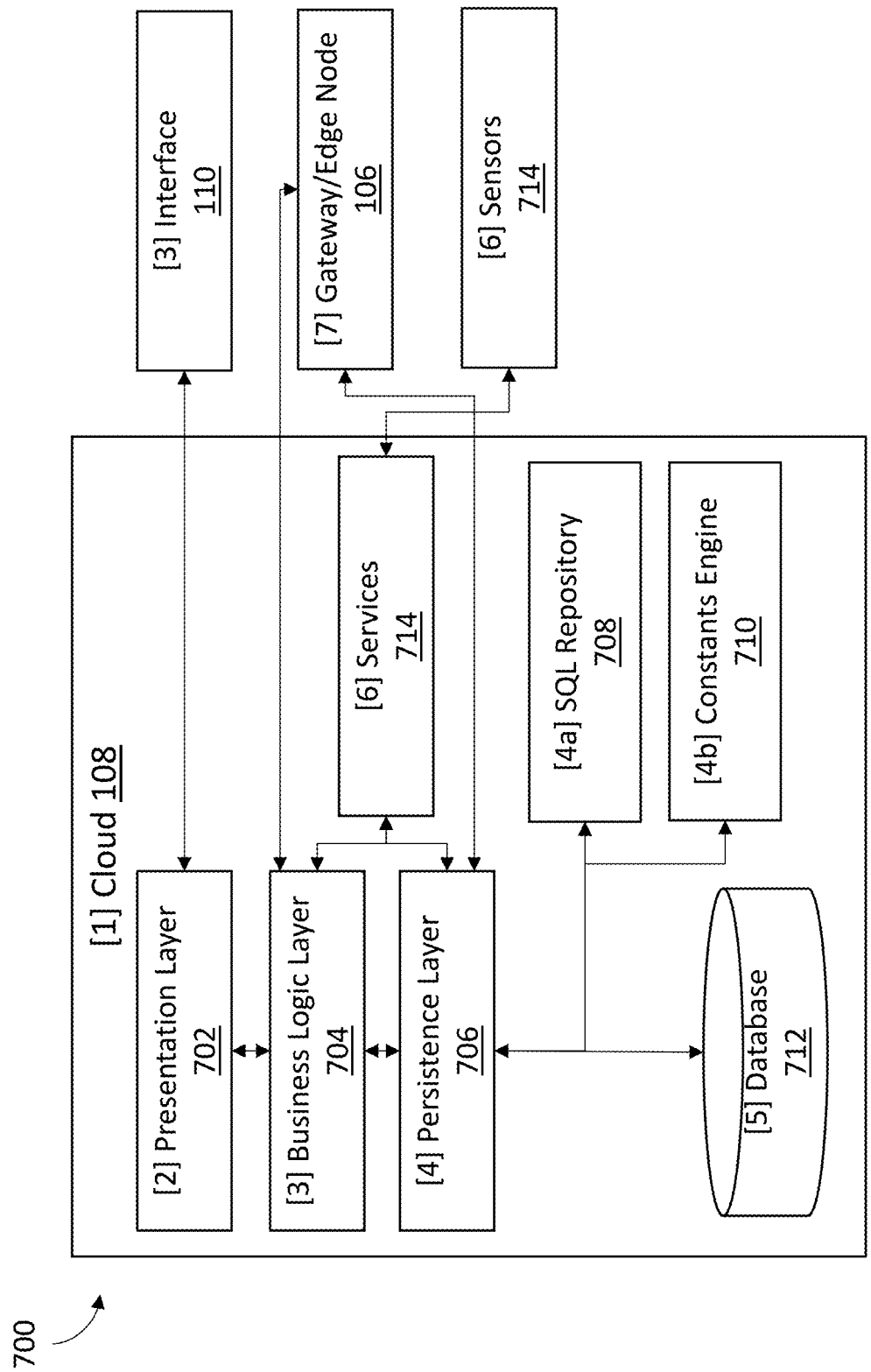
FIG. 10 is a block diagram illustrating an example cloud computing and user interface system of the environmental reporting system of FIG. 1B, in accordance with the present disclosure.

FIG. 10 shows an exemplary functional block diagram 700 for the cloud computing system 108 and the user interface 110. The cloud computing system 108 hosts the applications data, executable code and provides security for the environmental reporting system. The cloud computing system 108 can exist on a cloud providers' hardware (AWS, Google, Microsoft, etc.), as a virtual machine image to run on any hypervisor, or bare metal equipment, as understood by one having ordinary skill in the art. In general, the cloud computing system 108 is made up of a number of layers, services, databases, engines and repositories, among other items. The layers include, but are not limited to, the presentation layer 702, the business logic layer 704, and the persistence layer 706, along with the SQL repository 708, the constants engine 710, the database 712 and various services 714. Outside of the cloud computing system 108 is the user interface 110, gateway/edge nodes 106 and services 714.

The presentation layer 702 is responsible for generating HTML and JavaScript code that is to be delivered to the user interface 110 (e.g., modern web browser). In the preferred embodiment, the use of browser plugins will be avoided due to security issues. The core libraries, frameworks, and technologies that will be used in the presentation layer 702 are, for example, HTML5, CSS3, JavaScript, HTML Canvas, Node.js, React.js, WebPack, WebGL, three.js, and D3.js.

The business logic layer 704 holds all the formulas and proprietary technology. The business logic layer 704 is also responsible for communicating with the services 714, presentation layer 702, persistence layer 706, and in some cases the gateway/edge node 106. As an example, it may be more efficient to do some calculations on the collected data and then store it in the database 712. The business logic layer 704 can perform such calculations before the data is stored in the database 712. The business logic layer 704 is also responsible for mapping the data transfer objects from the persistence layer 706 to the presentation layer 702. This mapping avoids sending unnecessary information to the portal and keeps the html/JavaScript objects and payload small. The core libraries, frameworks, and technologies that will be used in the business logic layer 704 are Java, Python, STAN, Jetty, Spring JDBC, Rest, and Maven.

The persistence layer 706 is responsible for converting language specific code to SQL. This layer 706 is also responsible for mapping one object to one or more tables in the database 712. The opposite is also true, this layer 706 is able to combine a few tables into one object for the client data (in this case the services 714 or business logic layer 704). Although some of the SQL code may be generated dynamically at run time, most of the SQL code is kept inside the SQL repository 708. This repository 708 can be used in future if the main programming language of portal is changed. The core libraries, frameworks, and technologies that will be used in the persistence layer 706 are Java, Jetty, Spring JDBC, Rest, and Maven.

The SQL repository 708 is a subset of the persistence layer 706 that contains SQL code for the services 714. Some SQL may need to be generated dynamically but the most common SQL scripts will be stored in the SQL repository 708. The SQL repository 708 will be able to handle multiple programming languages.

The constants engine 710 is a subset of the persistence layer 706 that contains constants used in static equations. Examples of constants include converting from temperature RTD values to degrees Fahrenheit, triangulation and trilateration constants, and unit conversions.

The database 712 will store all of the data generated from the sensor network nodes 102, 116, 118, known location nodes 104, gateway/edge nodes 106, interface 110, and user actions. In the preferred embodiment, the database 712 is PostgreSQL.

The services layer 714 is responsible for offering a series of REST services to a client. A client can be third party service, sensor, gateway, or the interface. Security is an important factor when building the services layer 714. This layer 714 should be very selective to deny any client that is not trusted. A certificate based security model will be used for this communication. This layer 714 will use the business logic layer 704 to store some information into the database 712. This layer 714 can also use the information in the database 712 to compute some information for the end client.

As described herein, the gateway/edge node 106 will feed data from the sensor network nodes 102, 116, 118 and known location nodes 104 to the database 712 and business logic layer 704. The data will be sent through a VPN IPsec tunnel to the cloud 108.

As described herein, the interface 110 provides the visual experience for the user. It will be delivered through a modern web browser that supports HTML5, CSS3, and WebGL. The interface will consist of a series of dashboards, data visualizations, analytics, and conversations.

Additionally, in the preferred embodiment, the technologies used for security directly on the cloud 108 are OpenLDAP, Apache Shiro, and 256 bit file system/container encryption. Communication between the cloud 108 and gateway/edge nodes 106 will be secured through an IPsec VPN tunnel. Communication between the cloud 108 and interface 110 will be secured via https. Authentication and authorization will be used to access the cloud 108 and interface 110, as well as the features and components of the features.

The cloud application is modeled in five sub-processes. The gateway/edge node data sub-process is responsible for connecting the gateway/edge node 106 and retrieving data. The gateway/edge node 106 will provide a REST service that the cloud application can use to accomplish this. Once the data has been retrieved, the business logic layer 704 and persistence layer 706 will be used to process and store the data in the database.

The gateway/edge node instructions sub-process is responsible for relaying and receiving instructions from the gateway/edge node 106 and any associated required data. These instructions could include, but are not limited to, pushing OTA updates, updating configurations, requests for data, and updating a status.

The interface host and requests sub-process is responsible for serving the interface 110 and processing and/or providing requests to the interface 110.

The service host and requests sub-process is responsible for serving the services 714 responding to requests.

The monitoring and logging sub-process monitoring the cloud 108, cloud application, interface 110, and user actions. The outputs are processed and stored in the database 712 and will be used to identify internal quality issues, identify how users use the interface 110, and provide quantitative data for AB testing.

The interface 110 is divided up into layout and features. The layout depicts the functional layout for the interface window and the widgets. The window is the main layout for the interface 110 and will be accessible through a web browser. There are two main layout features in the window, the feature container and the widget container.

The feature container displays the icons for the different features supported by the interface 110 and an ability to navigate through the different features. The widget container displays the different widgets for the selected feature and an ability to navigate through the different features. The widget layout describes the default minimum layout for any widget. This includes the widget content, a way to reposition the widget in the widget container, and a way to access the widget settings.

The features supported in the interface include dashboards; data center selection; data visualization; data center views; alerts, events and exceptions; trends; CFD modeling; auditing; planning; and workflow and conversations. Additionally, there are universal features, common to most systems, including data browser; export; content, insights, action; conversation; machine learning; and help, as understood by one having ordinary skill in the art.

Customizable dashboards can be created by using widgets from any of the features described herein. Default dashboards can be created to show the status of the data center, performance of the data center, suggested insights and actions to improve the performance, alerts, events, and exceptions. If multiple data centers are to be used in the interface 110, it will be possible to select between them, or combinations of them. This will be done by visually presenting the data centers on a geographic map and displaying a snapshot of the default dashboards for each data center.

Different combinations of data can be selected, including multiple data sets, to be visualized. Aggregation of data can be selected, including selecting multiple sets of data to be visualized as one set of data. As an example, a user or operator can select all temperatures to be combined in a statistical manor and then visualized. Transformations of data can be selected, such as applying an equation to a combination of data sets to be visualized. As an example, the user can add two power data sets to visualize the sum.

Many different charts and types of charts can be used to visualize the data. Examples include table, line, control, bar or pie chart. Also, the environmental reporting system 100 can plot out the data in histograms, scatter plots, violin plots or contour lines, among others. The environmental reporting system 100 can show a stratification, or a visualization showing the data set differentials at different heights inside of the data center. Also, custom data presentation views will utilize data visualization with prepackaged views. Examples of this are visuals presentations of temperature differentials, cooling unit utilizations, and supply and return temperatures.

The user can access different data sets. For example, the user can select the date range, use time and date values to select the date range, or use conditional statements to select the data range, to visualize the data. As an example the user can choose to only view the data sets when a single data set has a value over 80. Further, the user can select the frequency to plot the data visualization, which can be done by averaging the data, taking the minimum, taking the maximum, or representing all three.

The data view can be expanded when viewed. Data tick will be available to see exact values and timestamps. And, when aggregate data is being viewed, it will be possible to select the individual data set with in the aggregate. An example of this is selecting the maximum value or group of values in a violin plot.

Global controls can also be applied to a data visualization, such as normalization or even using a secondary axis to view data of different scales.

The data center view provides automated drawing and rendering of the data center in a three-dimensional view. This will use the location data from the nodes 16. Rules can be applied to fit the constraints of data when drawing and rendering. It will be possible to modify the automated drawing and rendering to correct any of the errors from automation. It will also be possible to navigate through the three-dimensional view, which can be done through panning, zooming, and rotating. All of these will be implemented in an intuitive way.

Current sensor reading values can be overlaid on the data center with the addition of sparklines. Filters can be used to select which type of node or sensor to display. Filters can also be used to select which areas to display. Current sensor reading conditional filters can be used to select which sensors to display. An example would be only displaying all temperature values over 80.

Alerts, event, and exceptions; auditing reports; CFD visualizations and panning scenarios can be overlaid on the data center.

Alerts are individual data points for groups of data points that violate a rule. Events are groups or patterns of alerts that are statistically similar. Exceptions are trends in data sets that can indicate the potential triggering of an alert or event. The environmental reporting system 100 will provide the ability to view alerts, exceptions, and events, and managed each of them. Alerts, events, and exceptions can also be overlaid on the data center view and data visualization features.

The trends feature can be used to identify trends in a single data set or amongst multiple data sets. Methods that will be employed are multivariate regression, pattern recognition, and machine learning, among others. Regression and statistical modeling will be used to discover relationships in the data and data center operations. Models with these relationships will be used to benchmark and track various parameters. PUE and power analysis and forecasting will be used to show how power is being distributed and utilized in the data center.

A CFD modeling feature will provide the ability to model the air flow and temperature gradients: (see https://en.wikipedia.org/wiki/Computational_fluid_dynamics). The output of the CFD modeling will indicate how the air moves through the data center along with the temperature gradients as the air moves. This will be shown in an animation that will be overlaid onto the data center view. It will be possible to perform "what if" analysis by reconfiguring the equipment in the data center. The output of this what if analysis will be another CFD animation and estimated performance of the data center.

An auditing feature will provide historical audit logs for SLA compliance (to manage the SLA's for the data center and report against them), data center performance (historical data center performance reports will be available and annotatable), data center occupancy logs (occupancy sensors on the nodes will be used to measure occupancy at the highest level possible). The user can also correlate occupancy with alerts, events, and exceptions. This will be available in a report. Additionally, interface usage logs will keep track of user access of the interface, features, and feature components, as that access will be logged and presented in a report.

Capacity planning will be available utilizing the CFD modeling. This will be an extension of the what if analysis that involves adding new equipment to the data center. Also, workflow and conversations will provide the ability to create tasks for the data center and manage them in a custom workflow. Computer generated task can be generated as well. Conversations can also be held around the tasks and workflow.

As for the data browser, when selecting data to be view, the selection will be presented in a location based view. This will manifest itself in the form of a slimmed down version of the data center view, and will make it possible to select the correct data to view without having to look up a nodes identifier based on its location.

Additionally, all data and reports will have the ability to be exported as a PDF, CFD, or raw data base dump, and any content that the interface is displaying will have corresponding insights and actions as applicable. The insights functionality can be used to identify, report and forecast a number of different environmental and other issues. For example, hot and cold spot identification, temperature condition reporting, air flow condition reporting, humidity condition reporting, alarming and alarm forecasting, fault detection and fault forecasting, opportunity and efficiency identification, efficiency and savings reporting and forecasting, and 3D representation of the sensors in space, among others.

Specific examples include line plots for a temperature sensor that has an alert condition, an automated analysis of the alert condition examining the cause of the alert, and a recommended action to correct the alert. Many other examples exist.

All data and features will have the ability to comment on them. Comments will be tied the data and visible with the data or in the workflow and conversations feature. Comments may also be automatically generated through the machine learning feature.

The interface will further utilize machine learning to identify changes it should make to itself or the network. The changes will be presented to the user for approval. For example, the sampling frequency of a node is too low to adequately perform a what if analysis; and the user is presented with the situation and a recommend change to the sampling frequency. The user can then approve or deny this change. The machine learning algorithm will also be able to surface relevant features and data sets contextually how the user uses them.

Every feature will have the ability to provide help to the user or operator. The help feature provided will be contextual based off of what the user is doing. It will also be possible for the interface to contact personnel, provide them with the context, and allow them to assist the user.

FIG. 11 shows an exemplary spatial layout of the three different modules in a data center 80, additional modules, such as the known location module 104 and the gateway/edge node 106 are not shown for simplicity reasons. The rack modules [9] 68 are shown in the middle area of the data center 80, the plenum or subfloor modules [10] 70 are shown near the front of FIG. 11, and the power modules [11] 72 are shown to the left of the data center 80 shown in FIG. 11. These locations are merely for reference and are not indicative, nor required, of a typical data center 80.

The rack modules 68 are spaced throughout the data center 80 to get an accurate representation of the data center 80 environmental conditions above the subfloor or plenum. Rack module 68 typical spacing could be on the front and back of every three racks or every group of racks. The plenum or subfloor modules 70 are spaced throughout the subfloor or plenum of the data center 80 to get an accurate representation of the environmental conditions of the subfloor or plenum. Ideally the plenum or subfloor modules 70 would be underneath the perforated tiles closest to the rack modules 68. The inline power modules 74 are to be installed on the primary power supply of every server. Additional installations of the clamp on power modules 76 are shown on a power distribution rail and a computer room cooling unit.

As described in detail herein, the software that works with these devices manages the network that the devices communicate on, collects the data, and analyzes the data to create information and insights about the data center environment and data center power consumption. The software will perform certain functions, as detailed herein. Additionally, there will be software configuration.

Figure 12:
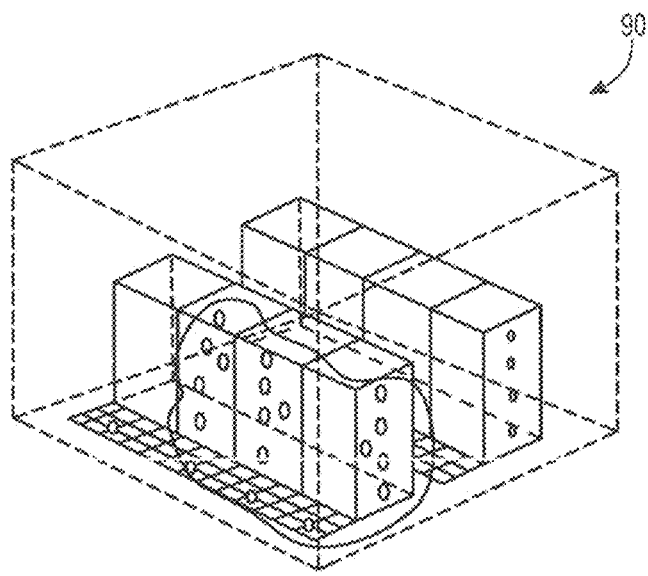
FIG. 12 illustrates an example top level three-dimensional visualization report in accordance with the present disclosure.

FIG. 12 shows a top level 3 dimensional (3D) visualization of the data center 80 in accordance with the present disclosure. The 3D representation 90 of the sensors in space makes intelligent assumptions of what the space contains, depending on the application (for example, if in data center: server rack, perf tiles, power distribution units, etc.) to help automate a richer 3D model, as opposed to sensors floating in space.

Figure 13:
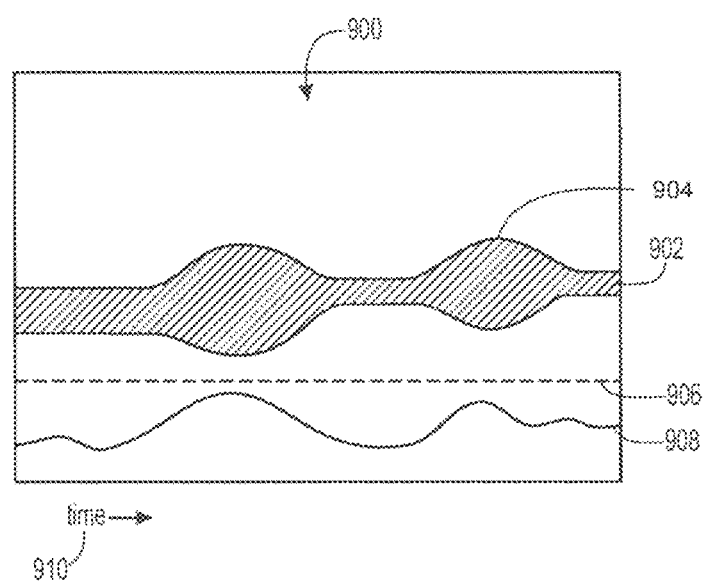
FIG. 13 illustrates an example group view report in accordance with the present disclosure.

FIG. 13 shows a group view report 900 indicating temperature 902 (can use red and blue colors), pressure 904 (width of chart), humidity 906 (dotted line) and power 908 (solid line). All of these measurements are reported over time 910. Of course, there are many ways to represent these and other environment and power conditions.

Also supported is Augmented Reality (AR) representations of the installed sensors. This will enable the user to walk around and see analysis real time overlaid on top of real physical objects while wearing an AR device (for example, Microsoft HoloLens, Magic Leap, or any other AR devices). In such a data center scenario, a user wearing an AR device could see where every sensor was located as they looked around, relevant metrics related to the sensors (temperature, pressure, humidity, voltage, current, etc.) and could view real-time analysis of the environment, such as heat flow and air flow representations, etc.

Further, the system could provide AR What If Analysis. AR capabilities allow the user to perform and experience simulations in the same physical real-world space that the sensors occupy. For example, the user could look at the space, virtually change the pressures at different points, and look inside the space to see how temperatures and pressures change as a result of the proposed pressure changes.

Figure 14:
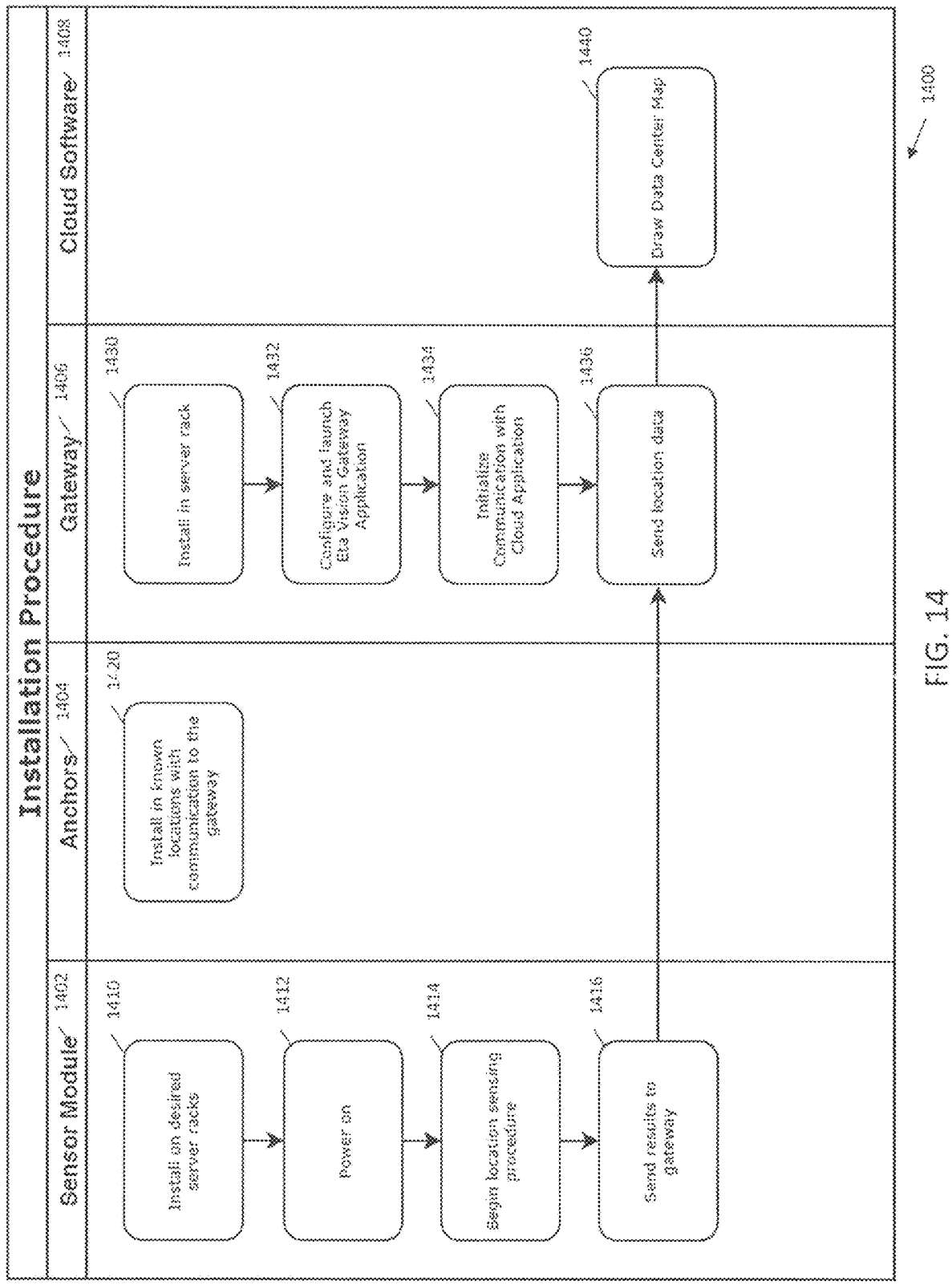
FIG. 14 is a flowchart illustrating an example installation procedure, in accordance with the present disclosure.

Referring now to FIG. 14, a method 1400 for installing a sensor module in a data center is illustrated according to an exemplary embodiment. As shown, four devices can be involved in the installation procedure: a sensor module 1402, one or more anchors 1404, a gateway 1406, and a cloud server 1408, which can implement cloud software. As shown in FIG. 14, the respective tasks of the sensor module 1402, the one or more anchors 1404, the gateway 1406, and the cloud server 1408 are illustrated in respective columns of FIG. 14.

The method 1400 can include installing the sensor module 1402 in a rack of the data center, as in step 1410, the sensor module 1402 powering on, as in step 1412, the sensor module 1402 beginning a location sensing procedure, as in step 1414, and the sensor module 1402 sending results of the location sensing procedure to the gateway 1406, as in step 1416. The location sensing procedure in step 1414 is described in greater detail with reference to FIG. 15.

The method 1400 can also include installing the one or more anchors 1404 in known locations in the data center, as in step 1420. As described above, the one or more anchors 1404 can be installed at or near at least three corners of the data center. The one or more anchors 1404 can be installed prior to or contemporaneously with the installation of the sensor module 1402 (step 1410).

The method 1400 can also include installing the gateway 1406 within the data center, as in step 1430, configuring and launching a gateway application, as in step 1432, initializing communication between the gateway 1406 and the cloud server 1408, as in step 1434, and the gateway 1406 sending location data received from the sensor module 1402 to the cloud server 1408, as in step 1436.

Further still, the method 1400 can include the cloud server 1408 and the cloud software drawing a map of the data center, as in step 1440. According to an exemplary embodiment, the cloud software can draw the map of the data center using at least the location data received from the gateway 1406 and measured by the sensor module 1402. The map drawing procedure in step 1440 is described in greater detail with reference to FIGS. 16 and 17.

Figure 15:
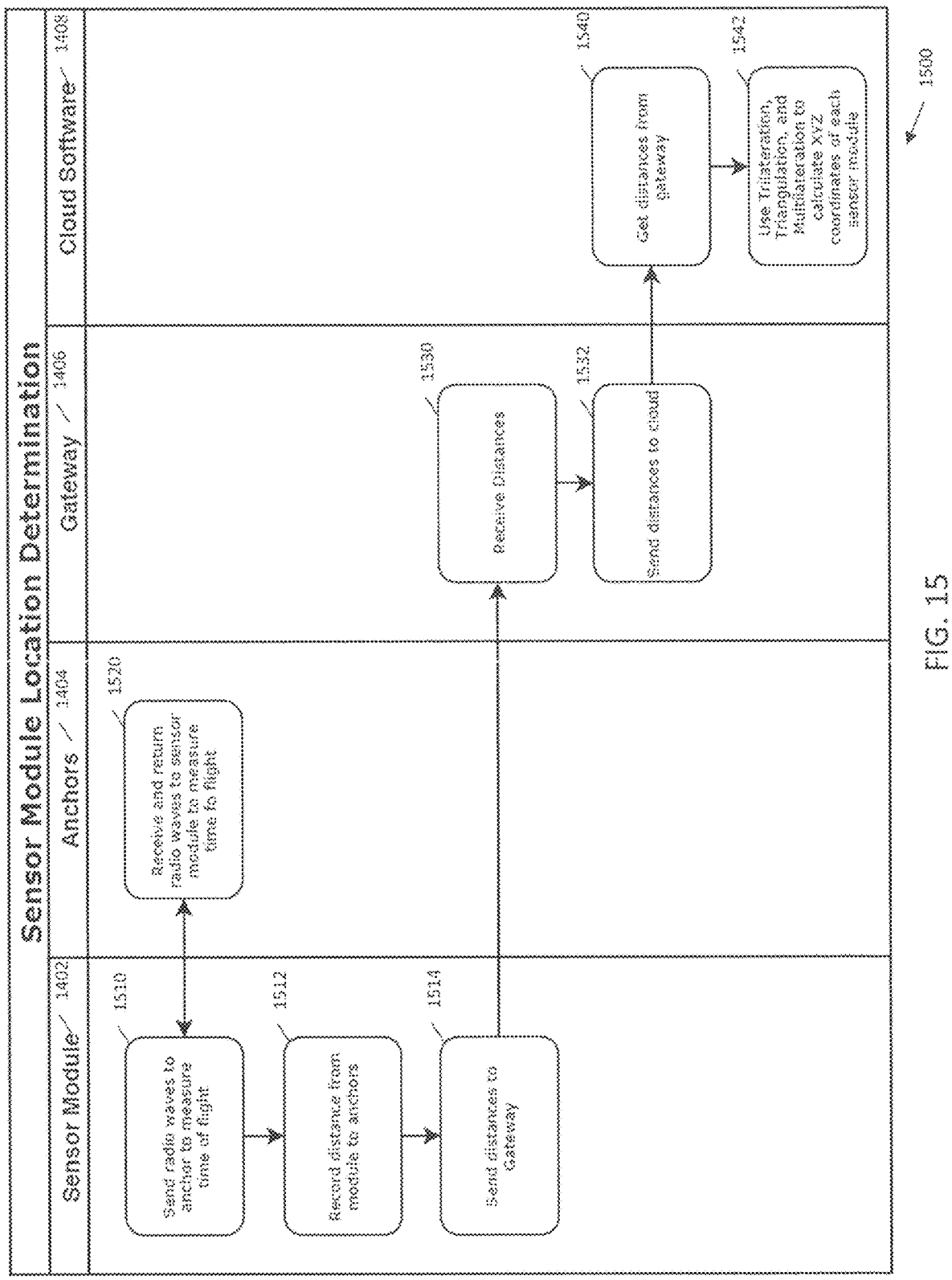
FIG. 15 is a flowchart illustrating an example sensor node location determination procedure, in accordance with the present disclosure.

Referring to FIG. 15, a method 1500 for locating a sensor module is illustrated according to an exemplary embodiment. As shown similarly to FIG. 14, four devices can be involved in the sensor location procedure: the sensor module 1402, the one or more anchors 1404, the gateway 1406, and the cloud server 1408, which can implement the cloud software. As shown in FIG. 15, the respective tasks of the sensor module 1402, the one or more anchors 1404, the gateway 1406, and the cloud server are illustrated in respective columns of FIG. 15.

The method 1500 can include the sensor module 1402, which has been installed in the rack of the data center (FIG. 14), sending radio waves to the one or more anchors 1404 to measure time of flight data, as in step 1510. According to an exemplary embodiment, the sensor module 1402 can send ultra-wideband radio waves to the one or more anchors 1404 to reduce interference and increase location determination accuracy. For example, the ultra-wideband radio waves can utilize Decawave technology, which can involve sending the radio waves through multiple frequencies and logging the time of flight data in each of the multiple frequencies. When the sensor module 1402 sends the radio waves, the one or more anchors 1404 can receive the transmitted radio waves from the sensor module 1402 and return radio waves to the sensor module, as in step 1520.

The method 1500 can further include the sensor module 1402 recording distances from the sensor module 1402 to the one or more anchors 1404 based on the time of flight data, as in step 1512, and the sensor module 1402 sending the distances to the gateway 1406, as in step 1514.

The method 1500 can also include the gateway 1406, which can be installed within the data center (FIG. 14), receiving the distances from the sensor module 1402, as in step 1530, and the gateway 1406 sending the distances received from the sensor module 1402 to the cloud server 1408, as in step 1532.

Further still, the method 1500 can include the cloud server 1408 and the cloud software receiving the distances from the gateway 1406, as in step 1540, and the cloud server 1408 using trilateration, triangulation, and multilateration to calculate X, Y, and Z coordinates for the sensor module 1402, as in step 1542. According to an exemplary embodiment, the results of step 1542 can be used to draw the map of the data center. While FIG. 15 illustrates only a single sensor module 1402, the method 1500 of FIG. 15 can be implemented by multiple sensor modules installed in the data center, and the multiple sensor modules can respectively implement the method 1500 simultaneously.

Figure 16:
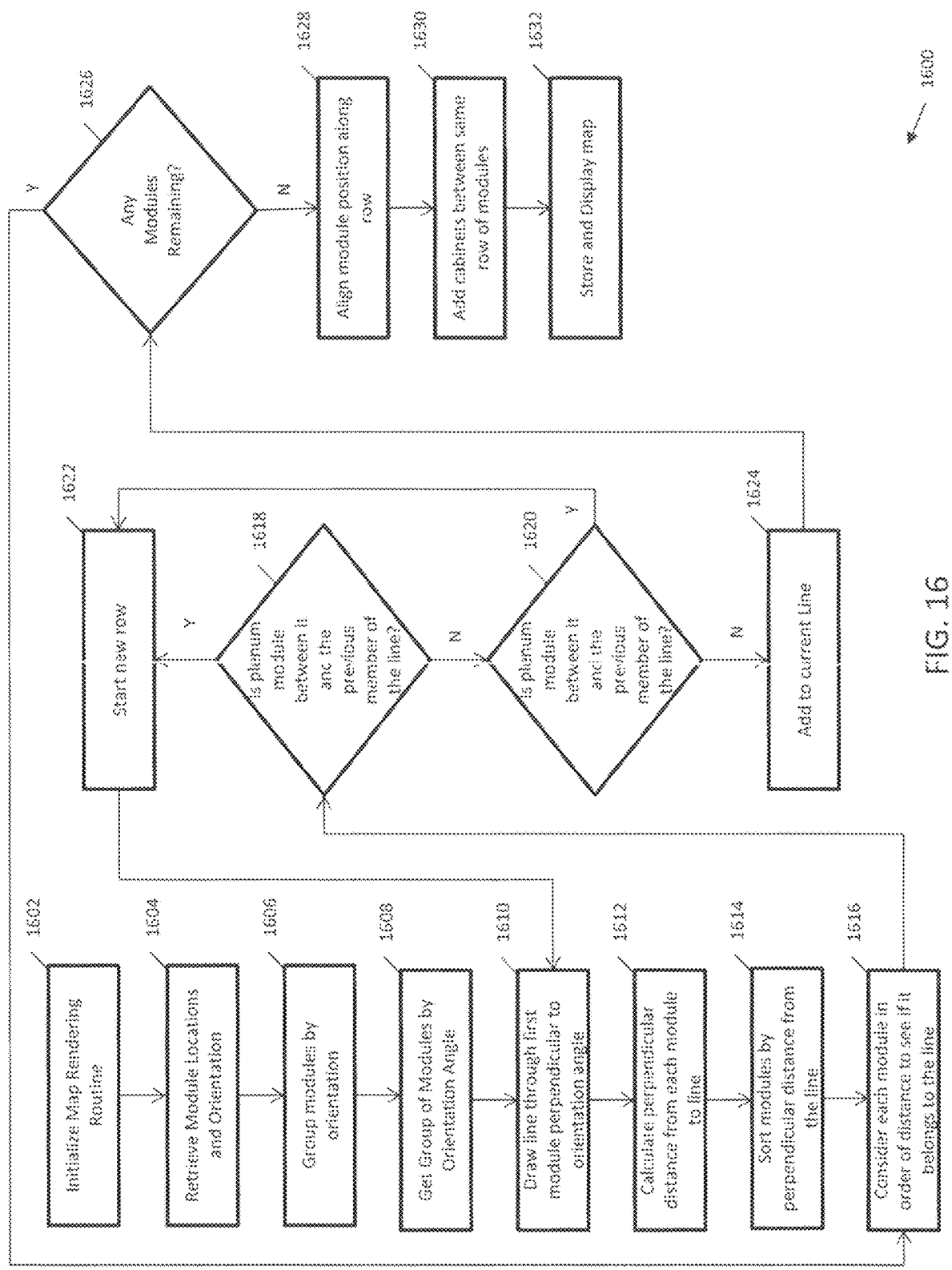
FIG. 16 is a flowchart illustrating an example procedure for generating a map of a data center, in accordance with the present disclosure.

Referring now to FIG. 16, a method 1600 for automatically rendering a map of a data center is illustrated, according to an exemplary embodiment. As shown, the method 1600 can begin by a processor (such as a processor of the cloud server 1408) initializing the map rendering routine, as in step 1602, and the processor receiving module location and orientation data, as in step 1604. As described above, the module location data can be obtained through the method 1500 described above with reference to FIG. 15. Furthermore, the sensor module (e.g. the sensor module 1402) can also transmit orientation data to the cloud server 1408 via the gateway 1606, and the orientation data can indicate an orientation direction that the sensor module is pointing. For example, the sensor module can include a magnetic field sensor (e.g. a compass), and the magnetic field sensor can determine the orientation data in the form of an orientation number or a direction (e.g. north, south, east, west, northwest, e.g.). In some embodiments, the magnetic field sensor can estimate the orientation data as one of four options (e.g. N, S, E, W) or one of more than four options (e.g. N, NW, NW, E, SE, SW, W, NW, NNW, SSE, etc.). For example, the magnetic field sensor can report the sensor module as facing north when the magnetic field sensor determines that the sensor module is facing NNW.

The method 1600 can further include the processor grouping sensor modules according to the orientation data, as in 1606. In some embodiments, the processor can group all sensor modules in the data center that face essentially the same direction. For example, the processor can create a first group comprising all sensor modules oriented towards north and a second group comprising all sensor modules not oriented toward north. As another example, the processor can create a first group including all sensor modules oriented towards north, a second group including all sensor modules oriented toward south, a third group including all sensor modules oriented towards east, and a fourth group including all sensor modules oriented towards west. As yet another example, the processor can create a first group comprising all sensors facing north or south and a second group comprising all sensors facing east or west. After grouping all sensor modules in the data center, the method 1600 can include the processor getting a first group of modules, as in step 1608.

Figure 17:
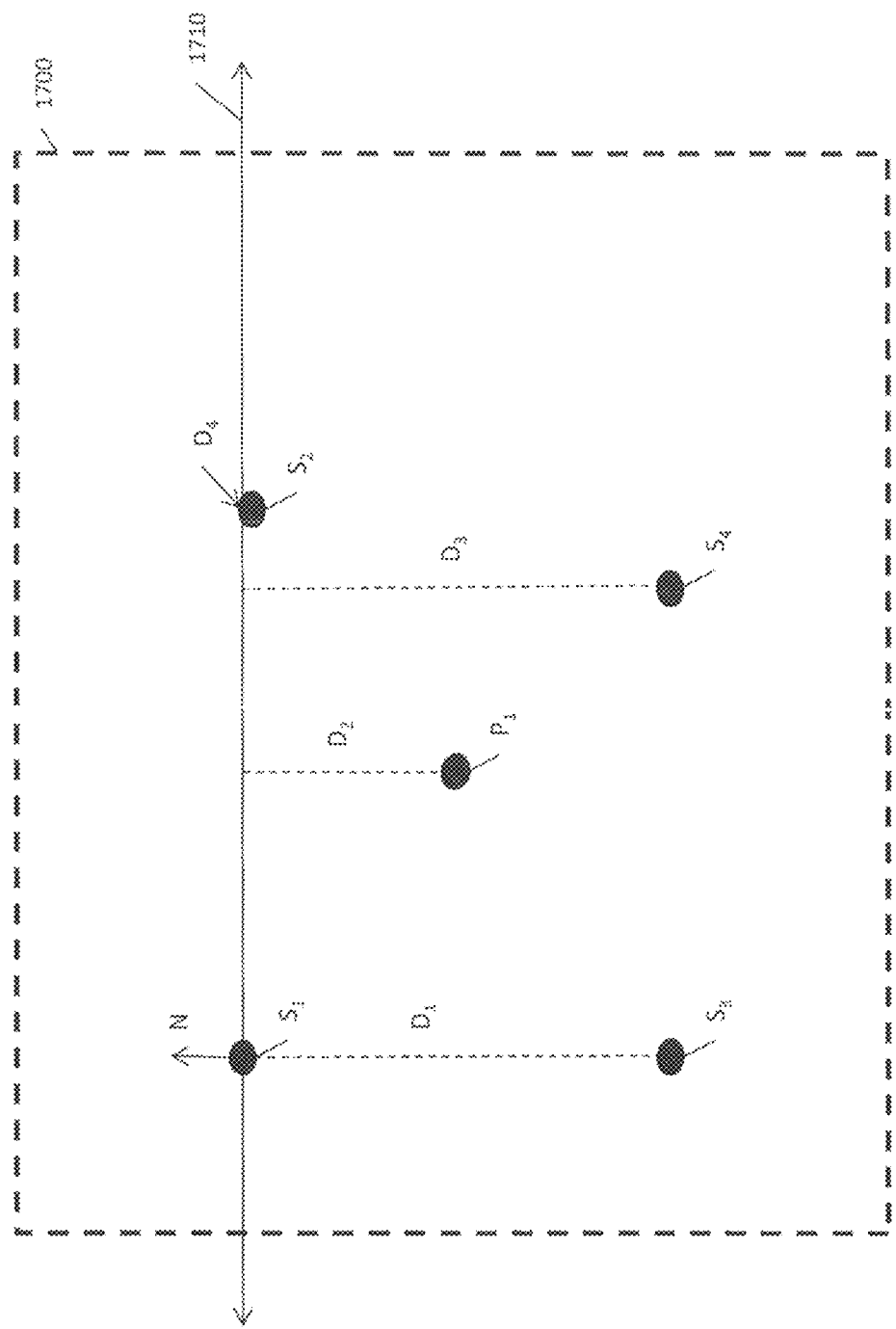
FIG. 17 illustrates an example data center in accordance with the present disclosure.

After getting the first group in step 1608, the method 1600 can include the processor generating a theoretical line through a first sensor module of the group of sensor modules at an angle perpendicular to an orientation angle of the first sensor module, as in step 1610. For example, if the first sensor module has an orientation angle of "north", the theoretical line generated by the processor in step 1610 can extend from east to west. Referring now to FIG. 17, an example data center 1700 is shown to demonstrate the method 1600. According to FIG. 17, the exemplary data center 1700 can include four sensor modules (S1, S2, S3, and S4) and one plenum module (P1) for illustration purposes, and all modules (S1, S2, S3, S4 and P1) can have the same orientation direction (north). Any module can be selected as the first module in step 1610. For example, the sensor module S1 can be selected as the first module. As shown, the sensor module S1 can be oriented toward north, and the method 1600 can draw theoretical line 1710 perpendicular to north (e.g. an East-West line) through the sensor module S1 when performing step 1610.

Referring to both FIGS. 16 and 17, after generating the theoretical line 1710 through the first sensor module (e.g. S1), the method 1600 can include the processor calculating a perpendicular distance between each module other than the first module and the theoretical line 1710, as in step 1612, the processor sorting modules by perpendicular distance from the theoretical line 1710, as in 1614, and the processor considering each sensor module in order of the perpendicular distance to determine whether each sensor module belongs in a same row of racks as the first sensor module, as in step 1616. FIG. 17 illustrates that sensor module S2 has a perpendicular distance D4 from the theoretical line 1710, sensor module S3 has a perpendicular distance D1 from the theoretical line 1710, sensor module S4 has a perpendicular distance D3 from the theoretical line 1710, and plenum module P1 has a perpendicular distance D2 from the theoretical line 1710. The processor can sort the perpendicular distances in order from smallest to largest in step 1614, and the processor can determine that perpendicular distance D4 is the shortest perpendicular distance, D2 is the second shortest perpendicular distance, and D1 and D3 are the two longest perpendicular distances (i.e. D4<D2<D3/D1, and D3≈D1). As such, the processor can first consider sensor module S2 in step 1616.

Moreover, the method 1600 can further include the processor determining whether any plenum modules are between a sensor module under consideration (e.g. sensor module S2) and a previous member determined to be on the theoretical line 1710, as in step 1618. In the example of sensor module S2, the processor has not currently considered a plenum module before selecting sensor module S2, so the processor can determine that there is not a plenum module between S2 and S1, and the processor can continue to method step 1620. If there is a plenum module between a sensor module under consideration and the previous member determined to be on the theoretical line 1710, the method 1600 can include the processor creating a new row of racks (i.e. data center equipment) for a rendered map, as in step 1622.

The method 1600 can further include the processor determining if the calculated perpendicular distance of the sensor module under consideration exceeds a threshold (e.g. 1 meter), as in step 1620. According to an exemplary embodiment, the threshold can be one meter, although other distances are contemplated. In the example of sensor module S2, the processor can determine that the distance D4 is very small (e.g. less than one meter). As such, the processor can continue to method step 1624 and add the sensor module under consideration (e.g. sensor module S2) to the same row of racks as the first sensor (e.g. sensor module S1). If the perpendicular distance between the sensor module under consideration (e.g. sensor module S2) and the theoretical line 1710 exceeds the threshold, the method 1600 can include the processor creating a new row of racks on the rendered map, as in step 1622.

The method 1600 can repeat steps 1610-1622 for all sensor modules in the first group of sensor modules, and the method 1600 can include the processor determining if any modules remain in the sorted list of sensor modules created in step 1614, as in step 1626. If any modules remain, the method 1600 can return to step 1616 and consider a new module not previously considered. Returning to the example shown in FIG. 17, the processor can next consider plenum module P2 and determine that plenum module P2 is a plenum module in step 1618 and start a new row of racks for the plenum module. Alternatively, the processor can consider sensor module S3 and determine that there is a large perpendicular distance D1 between sensor module S3 and the theoretical line 1710 and create a new row of racks for sensor module S3. Whenever a new row of racks is created, the processor can redraw a new theoretical line and return to step 1610.

However, if the processor has considered all sensor modules in the group, the method 1600 can include the processor aligning modules along each determined row of racks using the sensor location data received in step 1604, as in step 1628. The processor can add cabinets to each row of racks created through steps 1610-1622. The processor can also draw data center cabinets between modules in the same row of racks, as in 1630, and eventually render, store, and display the map created through steps 1602-1628, as in step 1632. According to an exemplary embodiment, rendering the map can include drawing the determined rows of racks and also representing the sensor modules in the rows of racks based on the sensor location data. Furthermore, in some embodiments, the method 1600 can apply domain knowledge about data centers to increase map accuracy. For example, domain knowledge includes assumptions about the size of racks in data centers, which are typically standardized or commonly sized, typical distance between racks, and general alignment of racks. Furthermore, using domain knowledge the processor can determine an end of a rack by determining that two sensors along a same row of racks are laterally spaced apart more than a predetermined distance (e.g. 3 meters) because sensor modules can be placed equidistant from each other in a rack.

Figure 18:
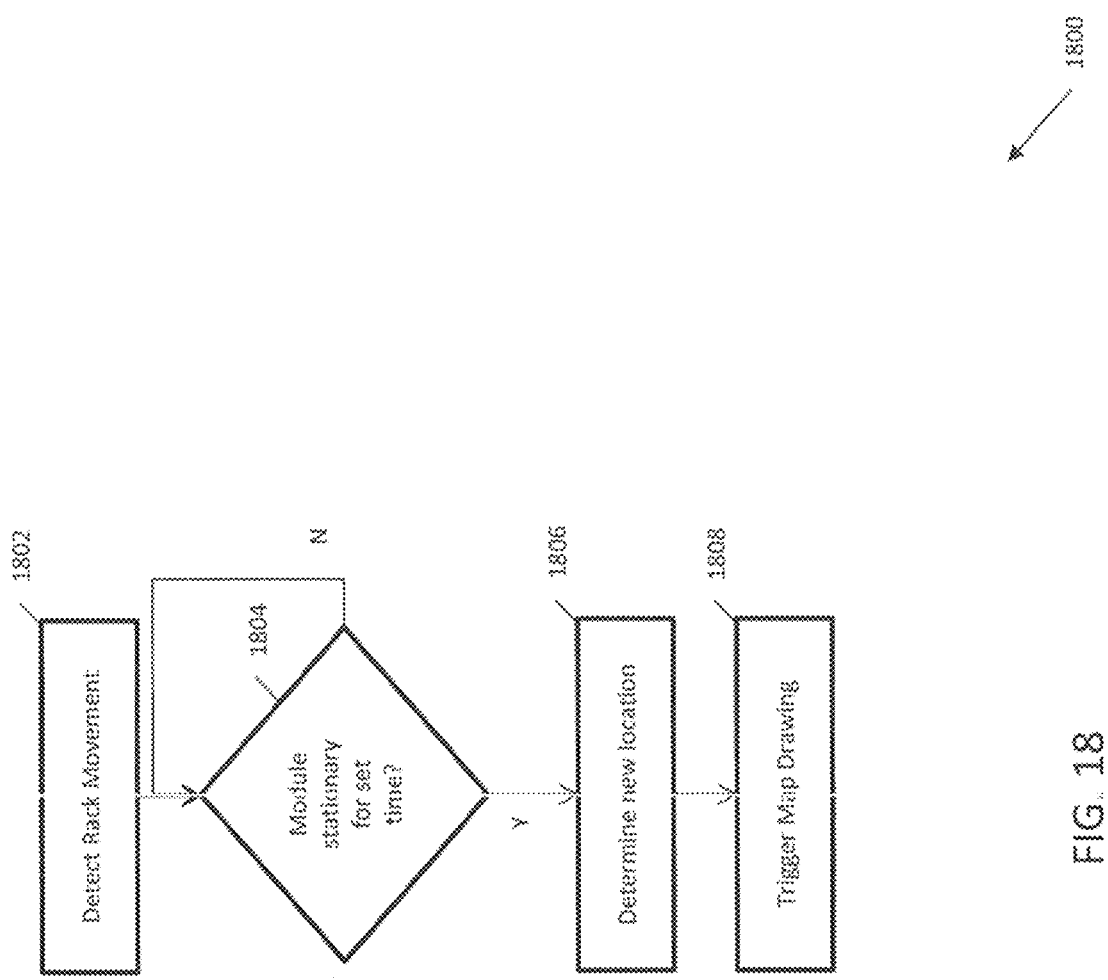
FIG. 18 is a flowchart illustrating an example procedure for updating a map of a data center in accordance with the present disclosure.

As described above, using sensor locations and domain knowledge, a processor can automatically render a map of a data center. However, data centers frequently "move", in that racks may change locations or orientations or equipment is swapped out for other equipment. As such, the map of the data center must be updated frequently anytime the data center "moves". Referring now to FIG. 18, a method 1800 for updating a map of a data center is illustrated, according to an exemplary embodiment.

As shown, the method 1800 include a sensor module (such as a sensor module 1402) detecting a change in the environment of the data center suggesting that the data center is changing in configuration, as in 1802. The sensor node may be equipped with an accelerometer to detect vibration, but the sensor module may detect movement using a combination of vibration, changes in temperature, changes in humidity, and changes in pressure to detect changes in the data center configuration.

After detecting movement, the sensor module can determine if it has come to rest by determining if it has been stationary for a predetermined period of time, as in step 1804. Once the sensor module comes to rest, the sensor module can determine its new location by gathering time of flight data and communicating with one or more anchors (e.g. the anchors 1404), as in step 1806. Step 1806 can substantially correspond with the method 1500 illustrated with reference to FIG. 15. After determining the new location, the sensor module can transmit the new location to a cloud server (e.g. the cloud server 1408), thereby triggering the cloud server to re-render the data center map according to the method 1600, as in step 1908.

Figure 19:
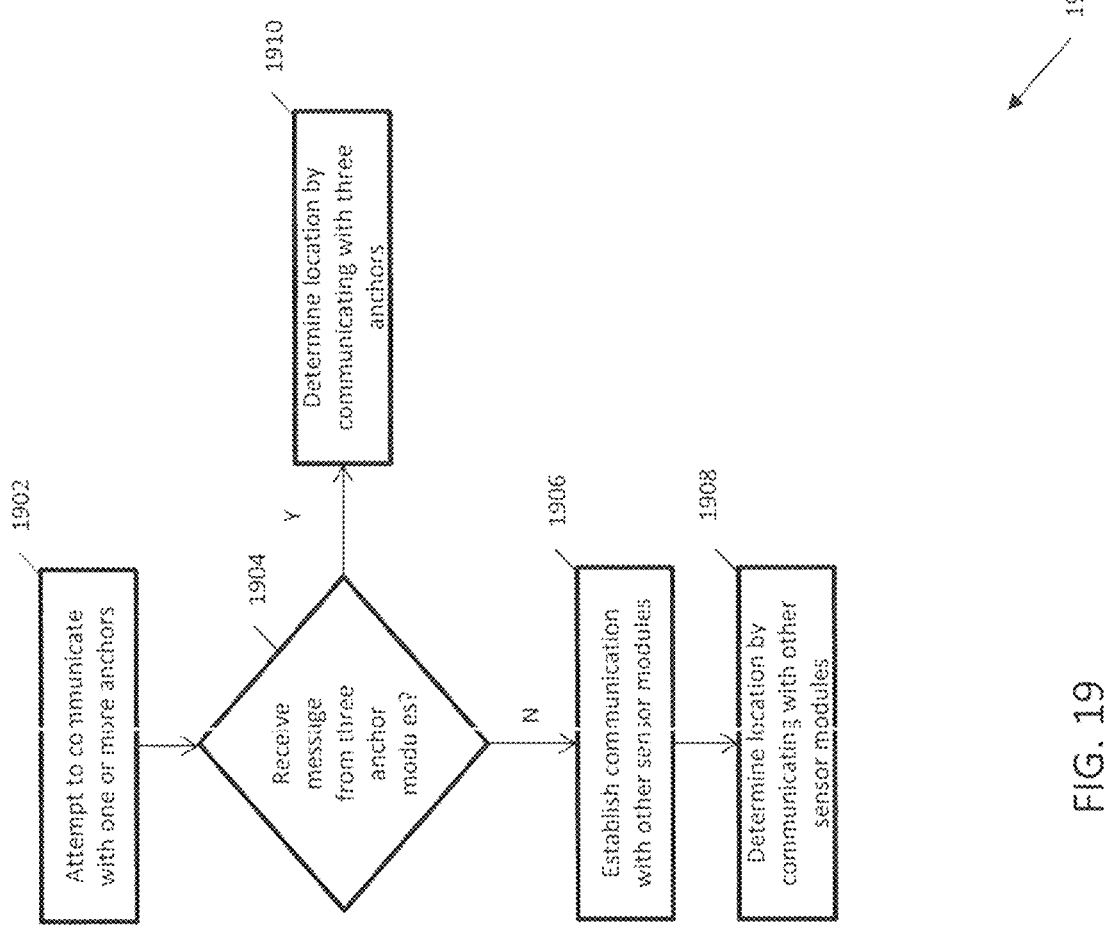
FIG. 19 is a flowchart illustrating an example sensor node location determination procedure without anchor nodes, in accordance with the present disclosure.

As noted above, sensor modules can move within a data center when the data center changes configuration. In some situations, movement of a sensor module can result in a loss of communication with one or more of the anchors. Despite losing communication with the one or more anchors, the sensor module can still detect its location as long as the sensor module can communicate with three other sensor modules that have been located (e.g. by communicating with the one or more anchors). Referring now to FIG. 19, a method 1900 for locating a sensor module is illustrated, according to an exemplary embodiment.

As shown, the method 1900 can begin by a sensor module (such as a sensor module 1402) attempting to communicate with one or more anchor modules (e.g. the one or more anchor modules 1404), as in step 1902, and the sensor module determining whether it can communicate with three anchor modules, as in step 1904. If the sensor module cannot communicate with three anchor modules, the method 1900 can include the sensor module establishing communication with other sensor modules, as in step 1906, and the sensor module determining its location by gathering time of flight data with the other sensor modules or a combination or other sensor modules and one or two anchors, as in step 1908. The other sensor modules can provide their locations to the sensor module, and the sensor module can send the time of flight data and the names or known locations of the other sensor modules to a gateway, which relays the data to the cloud server.

Alternatively, if the sensor module determines that it can communicate with three anchors in step 1904, the sensor module can determine its location by calculating time of flight data by communicating with three anchor modules, as in step 1910 (see FIG. 15).

Figure 20:
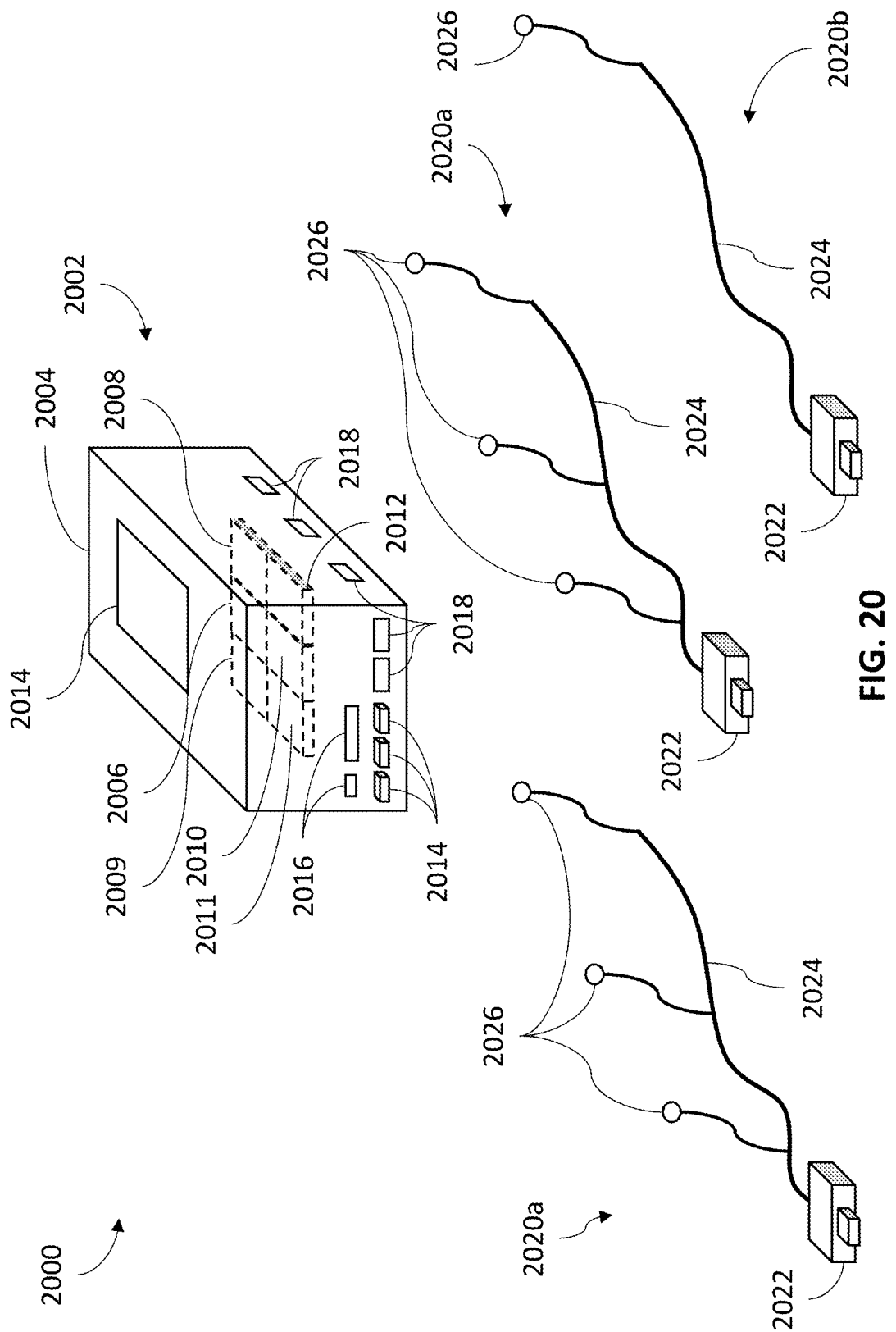
FIG. 20 illustrates an example sensor system that may be used to implement the sensor network nodes of the environmental reporting system of FIG. 1B, in accordance with the present disclosure.

FIG. 20 illustrates an example sensor system 2000. In some examples, the sensor system 2000 may be used to implement some or all of nodes 16 of the environmental reporting system 100, such as, for example, the sensor network nodes 102 (e.g., rack nodes and/or plenum nodes), known location nodes 104 (and/or anchors 1404), gateway edge nodes 106 (and/or gateways 1406), and/or coordinator nodes 118. In the example of FIG. 20, the sensor system 2000 includes one or more sensor modules 2002. While a single sensor module 2002 is shown in the example of FIG. 20, in some examples, the sensor system 2000 may include multiple sensor modules 2002 (see, e.g., FIGS. 22 and 23). In some examples, the sensor module 2002 may implement the sensor module 1402 of FIG. 14. In some examples, the sensor module 2002 may include some or all of the components of the core 64.

In the example of FIG. 20, the sensor module 2002 comprises a module housing 2004 that encloses module memory circuitry 2006, module processing circuitry 2008, module power circuitry 2009, module communication circuitry 2010, module diagnostic circuitry 2011, and module sensors 2012. As shown, the module memory circuitry 2006, module processing circuitry 2008, module communication circuitry 2010, and module sensors 2012 are interconnected and/or in electrical communication with one another. In some examples, the module power circuitry 2009 may include a module power source (e.g., a battery) configured to provide power to the sensor module 2002. In some examples, the module power circuitry 2009 may further be configured to manage the electrical power used by the sensor module 2002 and its various components, such as by, for example, turning off/on power to the components, switching between different power inputs (e.g., battery, wall, solar, etc.), and/or routing power appropriately.

In some examples, the module diagnostic circuitry 2011 may be configured to perform internal diagnostics on the sensor module 2002, such as by, for example, reading and/or responding to status updates and/or issues of various subsystems. In some examples, the module communication circuitry 2010 may be configured for communication via an ultra-wide band (UWB) protocol, a short wavelength ultra-high frequency protocol (commonly referred to as Bluetooth), a cellular and/or IEEE 802.11 standard (commonly referred to as WiFi) protocol, a transmission control protocol (TCP), an internet protocol (IP), an Ethernet protocol, an NFC protocol, and/or an RFID protocol. In some examples, the module processing circuitry 2008 may include one or more processors. In some examples, the module memory circuitry 2006 may store machine readable instructions configured for execution by the module processing circuitry 2008.

In some examples, the module sensors 2012 may comprise one or more temperature sensors, humidity sensors, pressure sensors, light sensors, and/or vibration sensors. In some examples, one or more of the vibration sensors may be implemented via one or more inertial measurement units (IMUs). In some examples, an inertial measurement unit may comprise one or more multi-axis (e.g., 3 axis) accelerometers, gyroscopes, and/or magnetometers. In the example of FIG. 20, the sensor module 2002 also includes a solar panel 2014. In some examples, the solar panel 2014 may include one or many photovoltaic cells. In some examples, the solar panel 2014 may be used as a light sensor, a power source, and/or for charging a power source. Though not shown in the example of FIG. 20 for simplicity, in some examples, the solar panel 2014 may be in electrical communication with the module power circuitry 2009.

In some examples, the module sensors 2012 may include some or all of the sensor array 66. In some examples, the module sensors 2012 may include driving circuitry. In some examples, circuitry for driving the module sensors 2012 may be included as part of the module processing circuitry 2008. In some examples, the module housing 2004 may include holes, apertures, and/or perforations to facilitate measurement of ambient conditions by the module sensors 2012.

In some examples, some or all of the module sensors 2012 may operate according to one or more sensor settings. In some examples, the sensor settings may be stored in the module memory circuitry 2006. In some examples, the sensor settings may include enable/disable settings, a sample rate, a maximum frequency rate, a maximum measurement range, an operating mode, a power mode, a performance mode, and/or a bandwidth. In some examples, the module memory circuitry 2006 may also store one or more thresholds (and/or other corollary data) that define a "normal" range of measurement values. For example, there may be an upper threshold, a lower threshold, and some indicator specifying that a "normal" (and/or expected) measurement value of a particular sensor would be between the upper and lower thresholds, above the upper threshold, or below the lower threshold. In some examples, the module memory circuitry 2006 may additionally store one or more sensor signatures that are defined as being "abnormal."

In some examples, the "abnormal" signatures and/or "normal" range of measurement values may be determined empirically, through one or more experimental testing procedures. In some examples, a sensor module 2002 (and/or one or more of its module sensors 2012) may be able to make minor alterations to what is considered "normal" to account for different locales and/or non-experimental conditions. In some examples, the sensor settings and/or threshold data may be different for each sensor of the module sensors 2012. In some examples, the sensor settings and/or threshold data may be the same for all sensors of the module sensors 2012. In some examples, some sensors of the module sensors 2012 may have the same sensor settings and/or threshold data, while others have different settings and/or threshold data.

In the examples of FIG. 20, the sensor module 2002 additionally includes several module inputs 2014, module outputs 2016, and module ports 2018. In some examples, the module inputs 2014 may include buttons, switches, dials, keys, touchpads, touchscreens, microphones, and/or other appropriate input mechanisms. In some examples, one or more of the module inputs 2014 may be used to power on and/or off the sensor module 2002. In some examples, the module outputs 2016 may include lights, speakers, display screens, haptic outputs, and/or other appropriate output mechanisms. In some examples, the module outputs 2016 may provide one or more output notifications indicative of some state, alert, alarm, message, and/or other output.

In the example of FIG. 20, the sensor module 2002 include several module ports 2018. In some examples, the solar panel 2014, module diagnostic circuitry 2011, module power circuitry 2009, module processing circuitry 2008, module memory circuitry 2006, module communication circuitry 2010, and/or module sensors 2012 may be in electrical communication with one or more of the module ports 2018, module inputs 2014, and/or module outputs 2016. In some examples, one or more of the module ports 2018 may be configured for connection to a power supply charging cable (not shown). In some examples, one or more of the module ports 2018 may be configured for cable connection to one or more other sensor modules 2002. In some examples, one or more of the module ports 2018 may be configured for cable (e.g., Ethernet) connection to a network server. In some examples, one or more of the module ports 2018 may be a receptacle, magnet, fastener, and/or other mechanism configured to facilitate mounting of the sensor module 2002 to a server rack. In some examples, one or more of the module ports 2018 may be configured for connection to a sensor strand 2020 (e.g., via a strand plug 2022 of the sensor strand 2020).

FIG. 20 shows an example of two types of sensor strands 2020 that may be connected to the sensor module 2002 (e.g., via ports 2018). As shown, two sensor strands 2020 are rack sensor strands 2020a, while the other sensor strand 2020 is a plenum sensor strand 2020. All the sensor strands 2020 include a strand plug 2022 in electrical communication with a strand cable 2024. In the example of FIG. 20, the rack strand 2020a includes three strand sensors 2026 attached to the strand cable 2024 at various points along the strand cable 2024. As shown, the strand sensors 2026 are approximately evenly and/or equally spaced along the strand cable 2024. In some examples, the rack strand 2020a may be mounted to a server rack such that the middle strand sensor 2026 positioned near an approximate middle of the server rack, with a strand sensor 2026 positioned at a height above the middle and a strand sensor 2026 positioned at a height below the middle.

In the example of FIG. 20, the plenum sensor strand 2020b includes one strand sensor 2026 attached to the strand cable 2024. As shown, the strand sensor 2026 of the plenum strand 2020b is attached to an end of the strand cable 2024. In some examples, the plenum strand 2020b may be extended under perforated tiles into a plenum (or subfloor) of the data center. In such an example, it may be helpful to have a sensor with a wired connection to a sensor module 2002, as wireless transmission through the floor can be difficult.

While three sensor strands 2020 are shown in the example of FIG. 20, in some examples, a sensor module 2002 may be attached to more or less than three sensor strands 2020. While the plenum strand 2020 is shown with only one strand sensor 2026 in the example of FIG. 20, in some examples, the plenum strand 2020 may include two or more strand sensors 2026. While three strand sensors 2026 are shown in the example of FIG. 20, in some examples, the rack sensor strand 2020a may include more or less strand sensors 2026. For example, a sensor strand 2020 may be configured with four strand sensors 2026 in order to implement a combination rack strand 2020a and plenum strand 2020b. In some examples, each strand sensor 2026 may comprise one or more temperature, humidity, and/or pressure sensors. In some examples, the above noted sensor settings and/or sensor threshold(s) may be applicable to the sensor strands 2020 and/or strand sensors 2026 as well.

In some examples, the sensor module 2002 may be configured to determine, store (e.g., in module memory circuitry 2006), and/or communicate one or more (e.g., relative) locations corresponding to each sensor strand 2020 and/or strand sensor 2026 connected to the sensor module 2002. For example, a sensor module may associate a particular (e.g., relative) location (e.g., plenum, rear of server rack, front of server rack, etc.) with one or more of the module ports 2018 configured for connection to a sensor strand 2020. In such an example, the sensor module 2002 would know that data received via the module port(s) 2018 should be associated with that location. As another examples, each sensor strand 2020 and/or strand sensor 2026 may output identification information along with its sensor measurement(s), and the sensor module 2002 may associate a particular location with particular identification information. Thereby, after the sensor module 2002 determines its own location (e.g., via the method 1500, method 1600, and/or method 1900), it can determine the location of each sensor strand 2020 and/or strand sensor 2026.

Figure 21B:
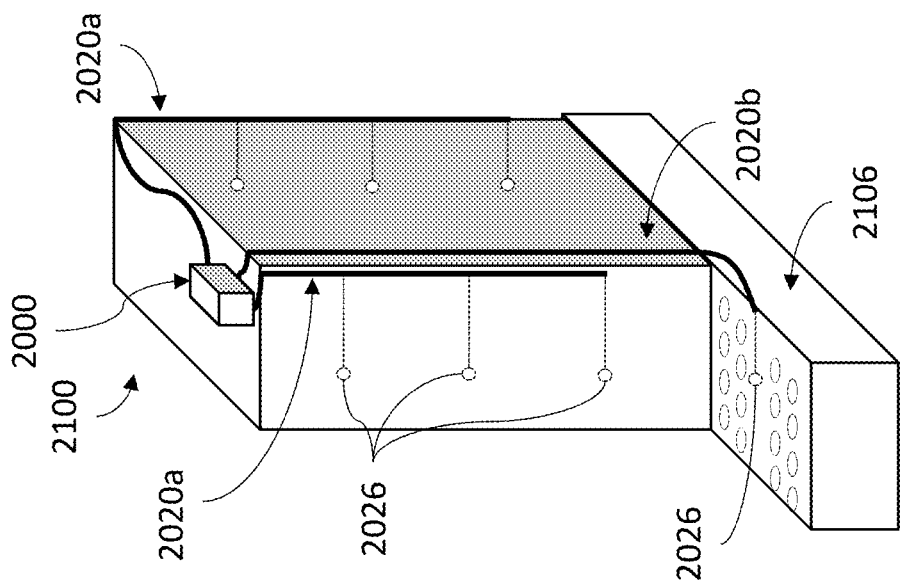
FIG. 21b illustrates the sensor system of FIG. 20 mounted to a simplified depiction of the server rack of FIG. 21a, in accordance with the present disclosure.
Figure 21A:
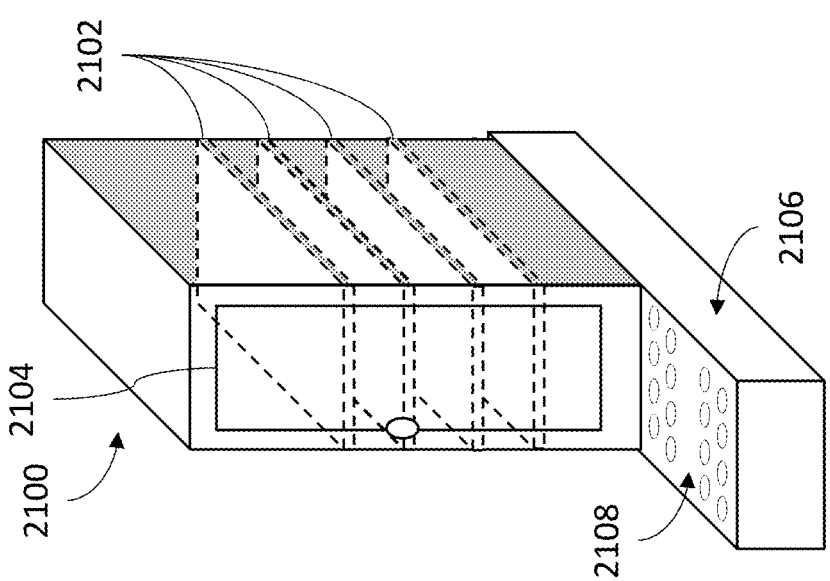
FIG. 21a illustrates an example server rack, in accordance with the present disclosure.

FIG. 21a shows an example of a server rack 2100. In some examples, the server rack 2100 may be similar or identical to the rack/enclosure 126. In the example of FIG. 21a, the server rack 2100 is a cuboid structure that encloses several shelves 2102. In some examples, the shelves 2102 may be configured to support, hold, and/or retain one or more servers. In some examples, the server rack 2100 may have other structures (e.g., railings, webbing, brackets, etc.) configured to support one or more servers. As shown, the server rack 2100 includes a door 2104 that can be opened to obtain access to the server rack 2100 and the shelves 2102 (and/or other items) within the server rack 2100. While only one door 2104 is shown in the example of FIG. 21a, in some examples, there may be several doors 2104 (e.g., a front door and a back door, several front doors and several back doors, etc.). While the door 2104 is shown as being almost the same height as the server rack 2100, in some examples, the door 2104 may be smaller. In some examples, there may be no doors 2104. While not shown for the sake of simplicity, in some examples, the server rack 2100 may include apertures, holes, and/or perforations to facilitate airflow through the server rack 2100.

In the example of FIG. 21a, the server rack 2100 sits on an elevated floor that has a plenum 2106 or subfloor underneath. In some examples, the plenum 2106 may be an open area that acts as a medium for supplying cooled air to the server racks 2100 in the data center. A perforated tile 2108 covers the subfloor plenum 2106 in front of the server rack 2100. In some examples, the perforated tile 2108 may allow cooled air to come up from the plenum 2106 to cool the server racks 2100 and/or the servers within the server racks 2100. While a perforated tile 2108 is shown in the example of FIG. 21a, in some examples, there may be normal, non-perforated tiles in front of server racks 2100 in the data center as well (see, e.g., FIGS. 22 and 23).

FIG. 21b shows an example of a sensor module 2002 mounted to a sever rack 2100 with shelves 2102 and door 2104 of the server rack 2100 omitted for clarity and simplicity. In the example of FIG. 21b, the sensor module 2002 is mounted on top of the server rack 2100. In some examples, the sensor module 2002 may instead be mounted to a side and/or interior of the server rack 2100. In some examples, the sensor module 2002 may be mounted using one or more magnets, bolts, clips, plugs, adhesive, and/or any other appropriate mounting means.

In the example of FIG. 21b, the sensor module 2002 is coupled to two rack sensor strands 2020a. As shown, one rack strand 2020a extends from the sensor module 2002 down a front of the server rack 2100, while the other rack strand 2020a extends down a back of the server rack 2100. The strand sensors 2026 are thus disposed at various heights along the front and back of the server rack 2100. In some examples, the strand sensors 2026 may themselves be mounted to, or otherwise retained by, the server rack 2100, and/or components of the server rack 2100 (e.g., shelves 2102, brackets, servers, etc.).

In the example of FIG. 21b, the sensor module 2000 is also coupled to a plenum sensor strand 2020b. As shown, the plenum sensor strand 2020b extends all the way down the server rack 2100 and into the plenum 2106. In some examples, the plenum sensor strand 2020b may extend through a hole or perforation in the floor and/or server rack 2100 to access the plenum 2106. A strand sensor 2026 attached to the strand cable 2024 is thereby positioned in the plenum adjacent and/or proximate to the perforated tile 2108. In some examples, this positioning may allow the strand sensor 2026 of the plenum strand 2020b to measure environmental characteristics and/or air movement within the plenum 2106 and/or through the perforated tile 2108. In some examples, the strand sensor 2026 of the plenum strand 2020b may be mounted to, or otherwise retained by, the perforated tile 2108 (e.g., via one or more magnets, bolts, clips, plugs, adhesive, and/or any other appropriate mounting means).

Figure 21D:
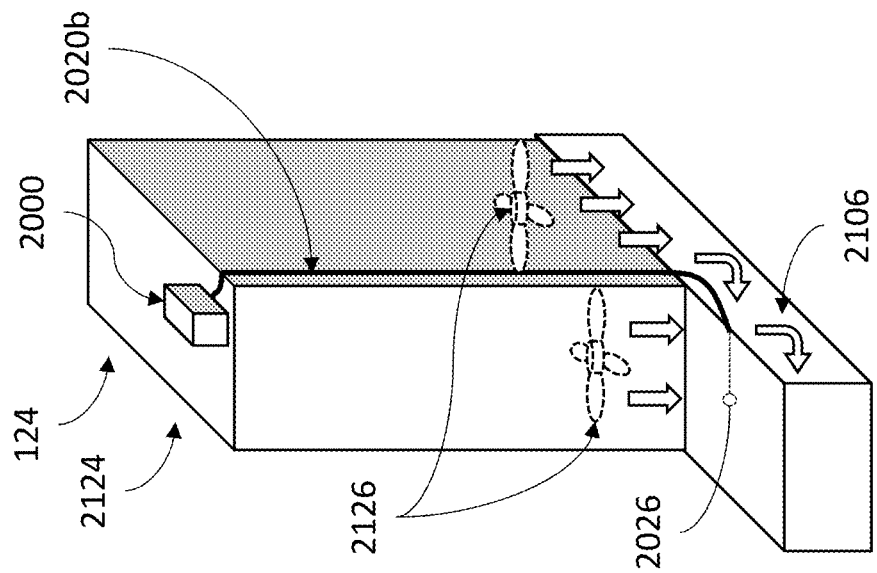
FIG. 21d illustrates a sensor module of the sensor system of FIG. 20 mounted to cooling equipment, in accordance with the present disclosure.
Figure 21C:
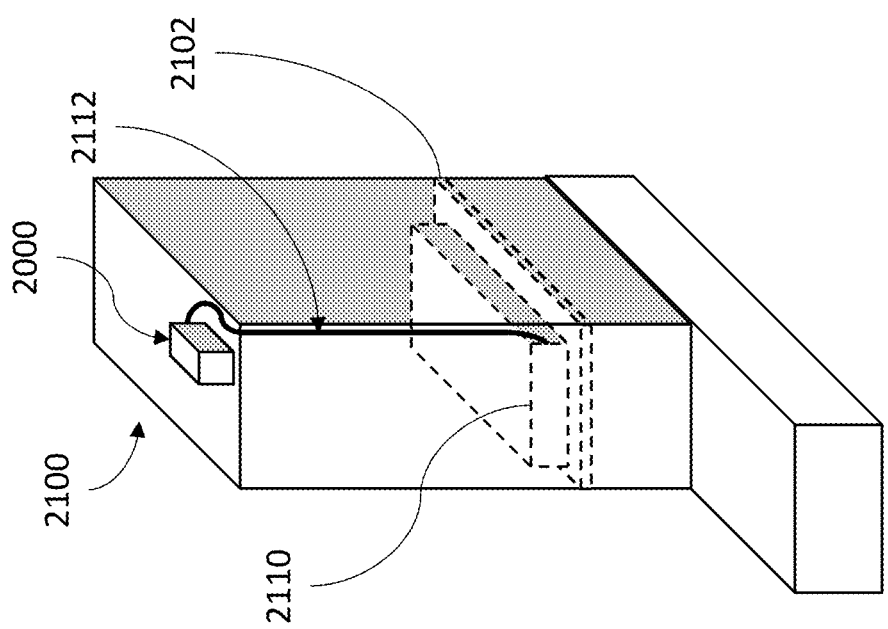
FIG. 21c illustrates a gateway/edge node of the environmental reporting system of FIG. 1B implemented in a server rack via a sensor module of the sensor system of FIG. 20, in accordance with the present disclosure.

FIG. 21c shows another example of a sensor module mounted to a server rack 2100. Again, the door 2104 of the server rack 2100 is omitted for clarity and simplicity. Most of the shelves 2102 are also omitted. However, one shelf 2102 is shown in the example of FIG. 21c. As shown, a server 2110 is retained by the shelf 2102. In some examples, the server 2110 may be similar or identical to the server 160/172. As shown, the server 2110 is connected to the sensor module 2002 via a Universal Serial Bus (USB) cable 2112. In some examples, the cable 2112 may instead be an Ethernet cable or some other type of cable. In some examples, the server 2110 may additionally be connected to other servers, a network of servers, and/or other networks. In some examples, the server 2110 connected to the sensor module 2002 (and/or the sensor module 2002 itself) may operate as a coordinator node 118 and/or a gateway/edge node 106 (and/or gateway 1406). In some examples, the server 2110 may include holes, apertures, and/or perforations to facilitate movement of air through the server 2110. In some examples, the server 2110 may additionally enclose one or more fans (and/or other air moving and/or cooling mechanisms) configured to cool internal components of the server 2110 by moving air through the server 2110.

FIG. 21*d* shows an example of a sensor module 2002 mounted to a piece of cooling equipment 124. In particular, the cooling equipment 124 is depicted as a computer room air conditioning (CRAC) unit 2124. In some examples, the CRAC unit 2124 may take in air through openings (not shown) in the top of the CRAC unit 2124, cool the air via internal mechanisms (not shown), and blow the cooled air out through the bottom of the CRAC unit 2124 into the plenum 2106 via fans 2126. In this way, air may be cooled and circulated to the server racks 2100.

In the example of FIG. 21*d*, the sensor module 2002 is coupled to a plenum sensor strand 2020*b* that has a strand sensor 2026 positioned in the plenum 2106. With the sensor module 2002 on top of the CRAC unit 2124 and the strand sensor 2026 in the plenum 2106, the sensor module 2002 is able to measure environmental conditions at both the inlet (i.e., hot side) and outlet (i.e., cool side) of the CRAC unit 2124. In some examples, the sensor module 2002 may also detect vibrations and/or other characteristics of the CRAC unit 2124 (and/or other cooling equipment 124) that may be used to determine a health of the cooling equipment 124.

Figure 22:
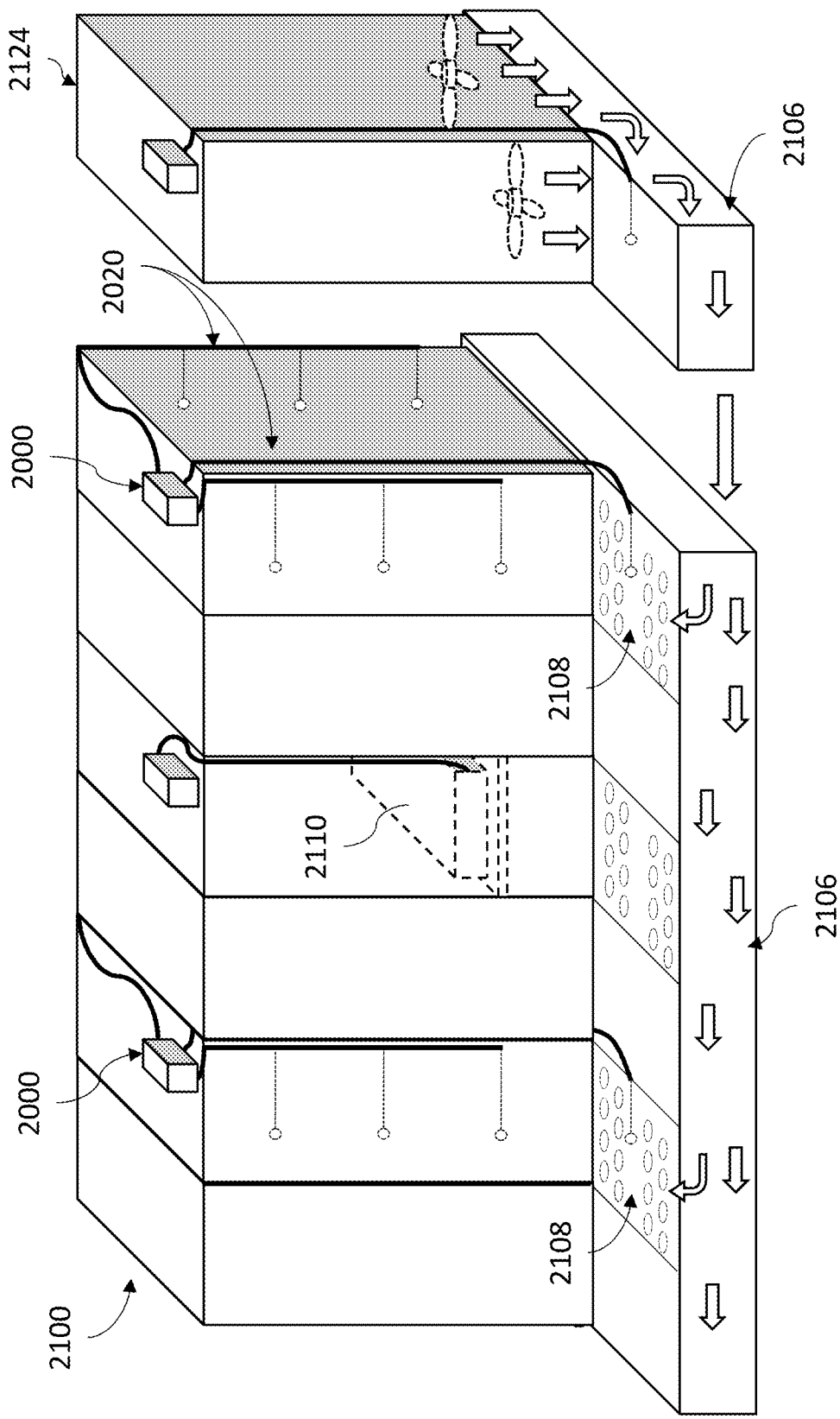
FIG. 22 illustrates an example arrangement of server racks, cooling equipment, and sensors, in accordance with the present disclosure.

FIG. 22 shows an example of the server racks 2100, sensor modules 2002, server 2110, and sensor strands 2020 from FIGS. 20-21*d* together in a small slice of an example data center. As shown, the CRAC unit 2124 circulates cooled air to the other server racks 2100 through the plenum 2106. The perforated tiles 2108 allow for air to come up out of the plenum 2106 to the server racks 2100. Other non-perforated tiles are positioned to prevent air from coming up out of the plenum 2106. While cooled air is depicted as flowing through a plenum 2106 in FIG. 22, in some examples, the air may instead be circulated through overhead ducts, wall pipes, and/or other appropriate medium.

Figure 23:
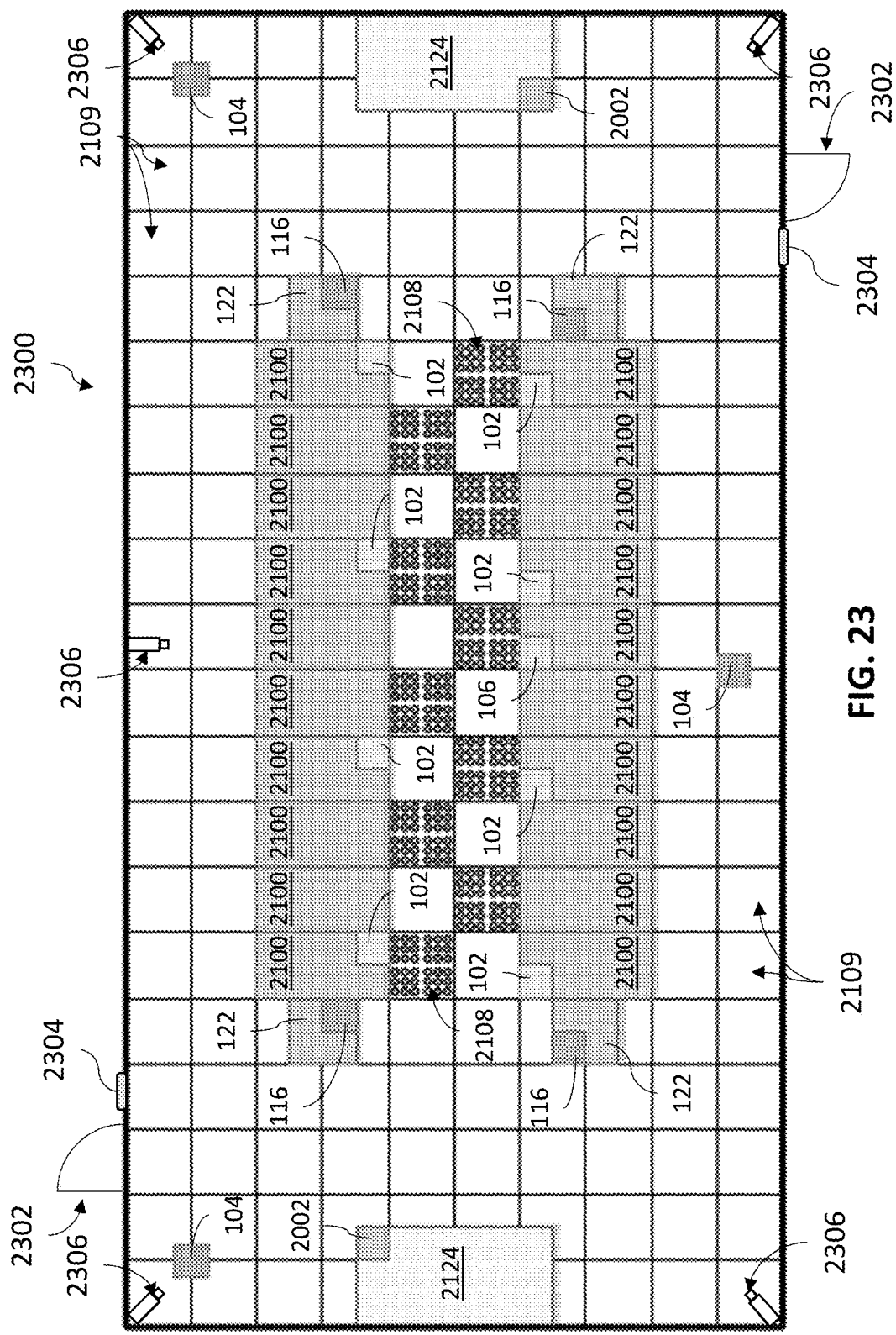
FIG. 23 is a diagram illustrating a top down view of an example data center, in accordance with the present disclosure.

FIG. 23 is a diagram showing a top down view of an example data center 2300. In the simple example of FIG. 23, the data center 2300 is a single rectangular room. As shown, there are two doors 2302 on opposite sides of the data center 2300. The floor of the data center 2300 has numerous tiles. Most of the tiles are non-perforated tiles 2109. Others are perforated tiles 2108. Server racks 2100 are arranged side by side in two parallel rows. In some examples, a front of each server rack 2100 is positioned facing a center aisle that extends between the rows of server racks 2100. As shown, all the perforated tiles 2108 are positioned within the center aisle. Two CRAC units 2124 are positioned at opposite ends of the data center 2300, approximately aligned with the center aisle. Power equipment 122 (e.g., circuit breakers, etc.) is positioned proximate the server racks 2100 as well.

In the example of FIG. 23, power nodes 116 are mounted on the power equipment 122, rack nodes 102 are mounted on some of the server racks 2100, and known location nodes 104 (and/or anchors 1404) are positioned around a perimeter of the data center 2300. A gateway/edge node 106 is also mounted to a server rack 2100 that is at an approximate middle of the row of server racks 2100. In some examples, such central placement of the gateway/edge node 106 may facilitate communication with the other nodes 16 in the data center. In some examples, some or all of the rack nodes 102 and/or known location nodes 104 (and/or anchors 1404) may be implemented via sensor modules 2002. In some examples, the gateway/edge node 106 may also be implemented via a sensor module 2002, such as discussed above. In the example of FIG. 23, there are also sensor modules 2002 mounted to the cooling equipment 124.

In the example of FIG. 23, the data center includes a security system comprised of security panels 2304 and security sensors 2306. As shown, each door 2302 has a corresponding security panel 2304. In some examples, the security panel 2304 may be a keypad, a keycard and/or badge scanner (e.g., NFC and/or RFID), a facial scanner, a biometric reader, and/or some other appropriate security access control means. In some examples, the security panel 2304 may control a lock that prevents the door 2302 from opening when engaged. In some examples, the security panel 2304 may disengage the lock, thereby allowing the door 2302 to open, in response to receiving authorized security credentials (e.g., via the keypad, keycard/badge scanner, biometric reader, etc.). While only shown on one side of the door 2302 in the example of FIG. 23, in some examples, there may be a security panel 2304 on both sides of one or both doors 2302.

In the example of FIG. 23, there are also several security sensors 2306 positioned around the perimeter of the data center. As shown, the security sensors 2306 are camera sensors directed towards an interior of the data center. In some examples, the security sensors 2306 may additionally, or alternatively, include other sensors, such as, for example, thermal, ultrasonic, infrared, motion, pressure, acoustic, and/or other appropriate sensors.

Figure 24:
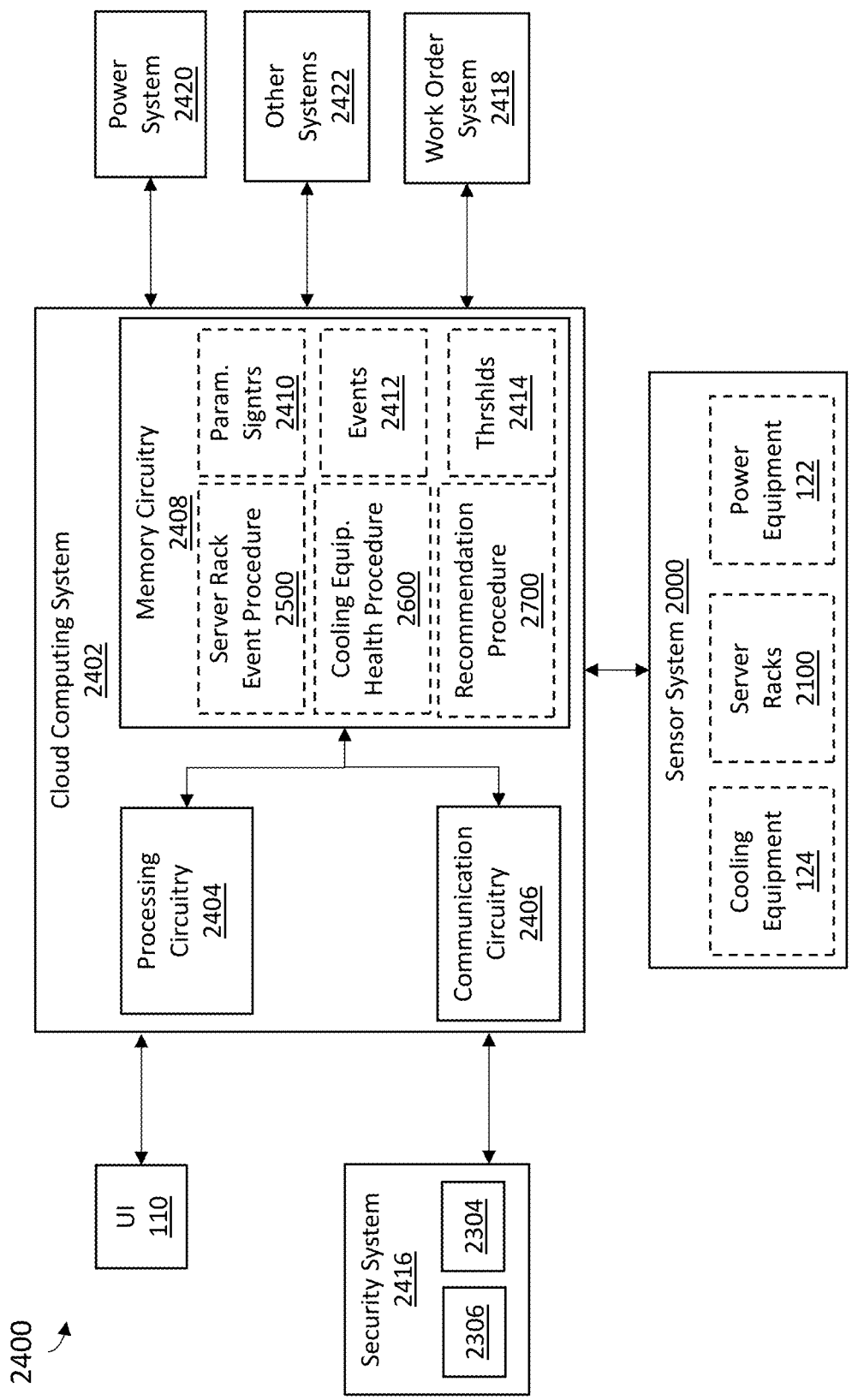
FIG. 24 is a block diagram illustrating an example alternative environmental reporting system, in accordance with the present disclosure.

FIG. 24 is a block diagram illustrating an example of an alternative environmental reporting system 2400. As shown, the alternative environmental reporting system 2400 includes a cloud computing system 2402. In some examples, the cloud computing system 2402 may include and/or implement the presentation layer 702, business logic layer 704, services 714, persistence layer 706, SQL repository 708, constants engine 710, and/or database 712 shown as part of the cloud 108 of FIG. 10. In some examples, the cloud computing system 2402 may include one or more servers 2110 remote from the data center 2300, one or more servers 2110 of the data center 2300, a server 2110 of the gateway/edge node 106, one or more sensor modules 2002, and/or other components.

In the example of FIG. 24, the cloud computing system 2402 includes cloud processing circuitry 2404, cloud communication circuitry 2406, and cloud memory circuitry 2408 interconnected together via a common electrical bus. In some examples, the cloud communication circuitry 2406 may be configured for communication via a cellular and/or IEEE 802.11 standard (commonly referred to as WiFi) protocol, a serial transmission protocol, a transmission control protocol (TCP), an internet protocol (IP), and/or an Ethernet protocol. In some examples, the cloud processing circuitry 2404 may include one or more processors.

In some examples, the cloud memory circuitry 2408 may implement the SQL repository 708 and/or database 712 shown as part of the cloud 108 of FIG. 10. In some examples, the cloud memory circuitry 2408 may store machine readable instructions configured for execution by the cloud processing circuitry 2404. In the example of FIG. 24, the cloud memory circuitry 2408 includes (and/or stores) a plurality of known and/or stored parameter signatures 2410, a plurality of known server rack events 2412 associated with one or more of the known/stored parameter signatures 2410, one or more thresholds 2414, a server rack event procedure 2500, a cooling equipment health procedure 2600, and a recommendation procedure 2700, all of which are further discussed below.

In the example of FIG. 24, the cloud computing system 2402 is in communication with a user interface 110 (UI), similar to the environmental reporting system 100. In some examples, the communication may be through a wired and/or wireless medium, and/or via a network. In some examples, a user may access and/or view data, analytics, reports, and/or other outputs of the cloud computing system 2402 via the UI 110. In some examples, a user may access and/or interact with other portions of the alternative environmental reporting system 2400 (e.g., through the cloud computing system) via the UI 110. In some examples, the UI 110 may comprise an audiovisual input/output (e.g., display screen, microphone, speakers, mouse/keyboard, etc.) in communication with a computing device. In some examples, the computing device may host a web browser through which information from the cloud computing system 2402 may be presented to the user.

In the example of FIG. 24, the cloud computing system 2402 is also in communication with the sensor system 2000. In some examples, the cloud computing system 2402 may communicate with the sensor system 2000 via one or more gateway/edge nodes 106 of the sensor system 2000, and/or module communication circuitry 2010 of one or more sensor modules 2002. In some examples, the sensor system 2000 may include a plurality sensor network nodes 16 (e.g., known location nodes 104, gateway/edge nodes 106, coordinator nodes 118, rack nodes 102, plenum nodes 102, and/or power nodes 116). In some examples, the nodes 16 may be configured and/or arranged to operate in a mesh topology 10 or star topology 12. In some examples, the sensor system 2000 may utilize a mesh network 112 and/or WAN 114.

In some examples, one or more of the nodes 16 of the sensor system 2000 may be implemented via one or more sensor modules 2002 and/or sensor strands 2020, such as discussed above. In the example of FIG. 24, the sensor system 2000 includes nodes 16 (and/or sensor modules 2002 and/or sensor strands 2020) mounted, attached, and/or coupled to cooling equipment 124, server racks 2100, and/or power equipment 122 for a data center 2300. In some examples, some or all of the nodes 16 of the sensor system 2000 may be configured to detect environmental and/or other characteristics related to cooling equipment 124, server racks 2100, and/or power equipment 122, as discussed above.

In some examples, the cooling equipment 124 and/or power equipment 122 may be internal and/or external to the data center 2300 itself. For example, cooling equipment 124 within the data center 2300 may include CRAC units 2124, fans 2126, and/or other cooling equipment 124 within the data center 2300. Power equipment 122 within the data center 2300 may include circuit breakers, power supplies, power cords, and/or other power equipment. Cooling equipment 124 external to the data center may include, for example, chillers, chiller motors, water pumps, cooling tower fans, cooling tower motors, and/or other cooling equipment 124. Power equipment external to the data center 2300 may include, for example, power transformers and/or power lines external to the data center 2300.

In the example of FIG. 24, the cloud computing system 2402 is also in communication with a security system 2416. As shown, the security system 2416 includes the security sensors 2306 and security panels 2304 described above with respect to the data center 2300. In some examples, the security system 2416 also includes security memory circuitry configured to store security data obtained from the security sensors 2306, security panels 2304, and/or other security measures of the security system 2416. In some examples, the security data may include security sensor data (e.g., security film, images, videos, measurements, related timestamps, location data, etc.). In some examples, the security data may include security panel data (e.g., identification/credential information of individuals who attempted to, failed at, and/or succeeded at accessing the data center 2300 and/or security panels 2304, associated location and/or timestamp information, etc.). In some examples, the security system 2416 may include security communication circuitry configured for communication with the cloud computing system 2402 via one of the mediums and/or protocols discussed herein.

In the example of FIG. 24, the cloud computing system 2402 is also in communication with a work order system 2418. In some examples, the work order system 2418 may comprise memory circuitry storing one or more work orders. In some examples, a work order may be a scheduled and/or planned job or task. For example, there may be a work order for planned, preventative, predictive, and/or emergency maintenance of a server 2110, server rack 2100, cooling equipment 124, power equipment 122, and/or node 16. In some examples, a work order may include timestamp information (e.g., when the work order was created, and/or should be begun, terminated, etc.). In some examples, the work order may include and/or be associated with instructions that may be executed by an individual and/or robotic system to complete the work order.

In the example of FIG. 24, the cloud computing system 2402 is also in communication with a power system 2420. In some examples, a data center 2300 may have an existing power system 2420 in place that detects, measures, records, and/or otherwise keeps track of power usage of the data center 2300. In some examples, the power system 2420 may keep track of the power usage of each server 2110 and/or server rack 2100. In some examples, the power system 2420 may keep track of the power usage for one or more individual pieces of cooling equipment 124 and/or power equipment 122. In some examples, the power data kept track of by the power system 2420 may be stored in power memory circuitry.

In the example of FIG. 24, the cloud computing system 2402 is also in communication with one or more other systems 2422. In some examples, the other systems 2422 may include one or more intermediary systems, legacy systems, building control systems, data systems, databases, peripherals, and/or other cloud computing systems 2402. In some examples, the cloud computing system 2402 may communicate, interface, and/or otherwise interact with the security system 2416, work order system 2418, power system 2420, and/or other systems 2422 using an ASHRAE/ANSI standard 135 protocol and/or ISO 16484-5 standard protocol (commonly known as BACnet), a Modbus protocol, a simple network management protocol (SNMP), and/or one or more application program interfaces (APIs).

In some examples, the cloud computing system 2402 may be used to keep track of pertinent activities and/or events involving server racks 2100 in the data center 2300. This may assist in keeping track of and/or managing valuable data center assets. This may also help with fulfilling certain tracking and/or logging obligations for server tenants.

In some examples, the cloud computing system 2402 may execute one or more instances of the server rack event procedure 2500 in order to keep track of the events involving server racks 2100 in the data center 2300. In some examples, the server rack event procedure 2500 may comprise machine readable instructions configured for execution by the cloud processing circuitry 2404. While presented as being stored in cloud memory circuitry 2408 of the cloud computing system 2402, and executed by the cloud processing circuitry 2404, in some examples, portions of the server rack event procedure 2500 may be performed by other components and/or systems outside of the cloud computing system 2402.

Figure 25:
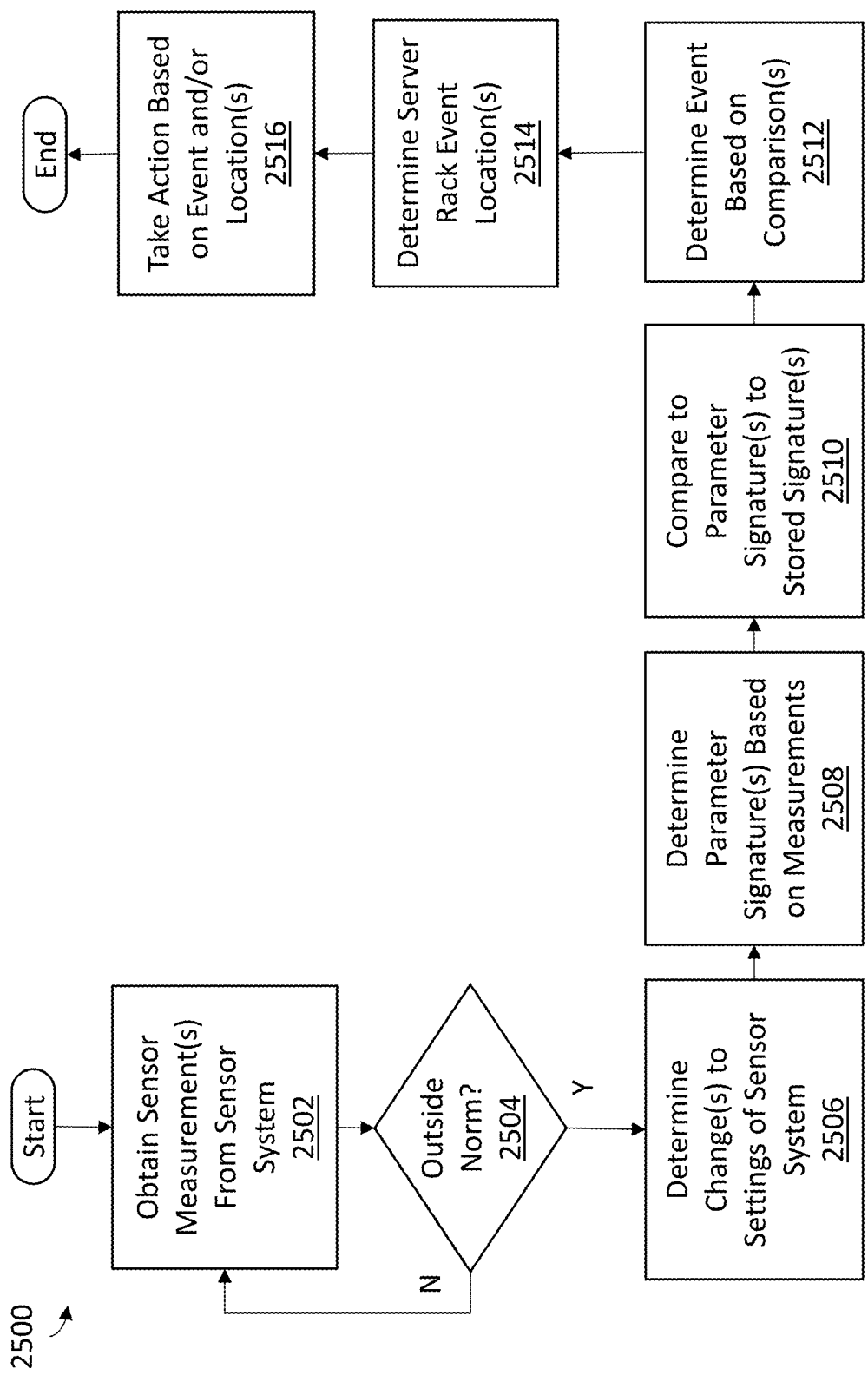
FIG. 25 is a flowchart illustrating an example server rack event procedure, in accordance with the present disclosure.

FIG. 25 is a flowchart illustrating an example operation of the server rack event procedure 2500. In the example of FIG. 25, the server rack event procedure 2500 begins at block 2502, where one or more measurements are obtained from the sensor system 2000. In some examples, the one or more measurements may comprise measurements taken by any of the nodes 16 of the sensor system 2000, such as, for example, one or more temperature, humidity, pressure, light, and/or vibration (i.e., accelerometer, gyroscope, and/or magnetometer) measurements. While, in some examples, measurements relating to the server racks 2100 may be more pertinent for the server rack event procedure 2500, in some examples, measurements relating to the cooling equipment 124 and/or power equipment 122 may also be useful. In some examples, some or all of the measurements may be obtained locally by each node 16. In some examples, some or all of the measurements may be sent to the cloud computing system 2402.

In the example of FIG. 25, the server rack event procedure 2500 proceeds to block 2504 after block 2502. At block 2504, the server rack event procedure 2500 determines whether one or more of the measurement obtained at block 2502 are outside of a threshold range of values that may be considered "normal." In some examples, the threshold range of values defining what is "normal" may be stored within module memory circuitry 2006, as discussed above. In some examples, one or sensor signatures may be also defined as being "abnormal." In some examples, the sensor signatures may be stored in the module memory circuitry 2006 and/or be stored in the cloud memory circuitry 2408 (e.g., as part of the parameter signatures 2410). In some examples, the cloud computing system 2402 may make the determination of whether one or more of the measurement obtained at block 2502 are abnormal and/or outside of a threshold range of values that may be considered "normal." In some examples, one or more sensor modules 2002 may additionally, or alternatively, make the determination. As shown, if it is determined that the measurements obtained at block 2502 are not abnormal and/or within a threshold range of values, the server rack event procedure 2500 returns to block 2502 (or, in some examples, ends). If it is determined that the measurements are abnormal and/or outside of a threshold range of values, the server rack event procedure 2500 proceeds to block 2506.

In the example of FIG. 25, the server rack event procedure 2500 determines (and/or implements) one or more changes to sensor settings of the sensor modules 2002 of the sensor system 2000 at block 2506. For example, a sensor module 2002 may operate in a low power mode initially and/or as a default (e.g., to save battery power), and change from a lower power mode to a high power mode at block 2506. As another example, certain sensors of the sensor module 2002 may operate at a low sampling rate, a low measurement range, a low performance mode, and/or be disabled entirely as a default, and then be enabled and/or changed to a higher measurement range and/or performance mode at block 2506. In some examples, the sensor module 2002 may return to its initial and/or default sensor settings after a threshold amount of time passes with no measurements outside the threshold normal range (and/or no return to block 2506).

In the example of FIG. 25, the server rack event procedure 2500 proceeds to block 2508 after block 2506. At block 2508, the server rack event procedure 2500 determines one or more server rack parameters (and/or measured parameter signatures) based on the sensor measurements obtained at block 2502. In some examples, a server rack parameter may comprise, for example, a temperature, pressure, humidity, and/or light intensity in and/or around a server rack 2100. In some examples, a server rack parameter may comprise, for example, a vibration of a server rack 2100. In some examples, a server rack parameter may comprise, for example, a power characteristic of a server rack 2100.

In some examples, a server rack parameter signature may comprise one or more measurements and/or output signal patterns (e.g., of the sensor system 2000) of one or more server rack parameters that occur over a measurement time period. For example, an output signal of a temperature sensor, humidity sensor, pressure sensor, light sensor, vibration sensor (e.g., IMU), and/or power sensor of the sensor system 2000 over a measurement time period may constitute a server rack parameter signature if it pertains to a server rack 2100. In some examples, a server rack parameter signature may pertain to more than one server rack parameter. For example, a sensor module 2002 mounted to a server rack 2100 may provide a server rack parameter signature comprising an output signal of its IMU and its temperature sensor over a given time period. In some examples, the temperature and IMU output signals may be considered a single parameter signal. In some examples, a power parameter signature may be obtained from the power system 2420 rather than the sensor system 2000.

In the example of FIG. 25, the server rack event procedure 2500 proceeds to block 2510 after block 2508. At block 2510, the server rack event procedure 2500 compares one or more of the parameter signatures from block 2508 with one or more known parameter signatures 2410 stored in cloud memory circuitry 2408. In some examples, the known parameter signatures 2410 may be predetermined and/or prerecorded during an empirical testing process that simulates certain events and records sensor outputs near in time to the event(s). For example, the empirical testing process may simulate opening/closing doors 2104 of the server rack 2100, installing servers 2110 in the server rack 2100, removing servers 2110 from the server rack 2100, restarting one or more servers 2110, plugging in or rearranging network cables and/or other cables, plugging in a monitor, bumping and/or accidentally disturbing a server rack, a fan malfunction, a drive failure, and/or other events. When one or more unique and/or distinctive patterns of one or more sensor outputs are observed to occur near in time to the event, those patterns may be stored and/or recorded as known parameter signatures 2410 associated with the event.

In some examples, the server rack event procedure 2500 may keep track of recent server rack events (e.g., via the events 2412 stored in cloud memory circuitry 2408). In some examples, the server rack event procedure 2500 may only compare the recently measured parameter signatures with certain known/stored parameter signatures based on the recent server rack events. For example, the server rack event procedure 2500 may only compare the measured parameter signature(s) with parameter signatures associated with a server installation event if a door open event has recently been detected (since the installation event requires the door open event to occur first).

In the example of FIG. 25, the server rack event procedure 2500 proceeds to block 2512 after block 2510. At block 2512 the server rack event procedure 2500 determines which server rack event 2412 stored in cloud memory circuitry 2408 has occurred, based on the comparison at block 2510. In some examples, the server rack event procedure 2500 may determine an event associated with a known parameter signature 2410 has occurred if the measured parameter signature is the same as, or significantly similar to (e.g., within a threshold deviation of) the known parameter signature 2410. For example, the server rack event procedure 2500 may determine that a front/back door open event, a front/back door close event, a server installation event, a server removal event, a cable event, a rack disturbance event, a fan event, a drive failure event, and/or a server restart event has occurred at block 2512, based on the comparison(s) at block 2510. In some examples, such as where there are several apparent matches that are mutually exclusive (e.g., a front door open and front door close event), the server rack event procedure 2500 may reference recently occurring events 2412 to determine the most likely applicable server rack event(s).

In some examples, the server rack event procedure 2500 may be unable to find a known parameter signature 2410 that is close enough to a measured parameter signature to qualify as a match. Yet, because of block 2504, the server rack event procedure 2500 knows that something has occurred, even if just what has occurred is unclear. In such an example, the server rack event procedure 2500 may categorize the event in a catchall event category, such as "abnormal operation." In some examples, the server rack event procedure 2500 may also determine a severity of the abnormal operation. Such a severity may be based, for example, on an extent to which the measured parameter signature(s) differ from the normal/expected measurements and/or known parameter signatures.

In the example of FIG. 25, the server rack event procedure 2500 proceeds to block 2514 after block 2512. At block 2514, the server rack event procedure 2500 determines which server rack(s) 2100 (and/or location(s)) should be associated with the event(s) determined at block 2512. In some examples, this determination may be performed using the above sensor location determination method 1500, sensor location determination method 1900, and/or data center mapping method 1600. In some examples, the determination at block 2514 may involve determining (e.g., by accessing stored data in cloud memory circuitry 2408) whether one or more of the server racks 2100 are associated and/or grouped with one another, so as to form one or more "virtual cages." While shown as occurring after block 2512 in the example of FIG. 25, in some examples, block 2514 may occur earlier in the server rack event procedure 2500. For example, the server rack event procedure 2500 may determine the location(s) and/or server rack(s) 2100 of the measured parameter signature(s) prior to block 2510, in order to determine which events have recently occurred for the applicable location(s) and/or server rack(s) 2100.

In some examples, the server rack event procedure 2500 may determine that all the server racks 2100 have been impacted. For example, the server rack event procedure 2500 may determine that there are multiple measured parameter signatures for multiple server racks 2100 that correspond to the same stored parameter signatures 2410 and/or events 2412. In some examples, this may occur where, for example, the event is of a regional nature, such as a seismic event, weather event, natural disaster, large scale disturbance, etc. In some examples, the server rack event procedure 2500 may analyze parameter signatures across multiple measurement time periods to determine one larger event, such as, for example, an event of a regional nature.

In the example of FIG. 25, the server rack event procedure 2500 proceeds to block 2516 after block 2514. At block 2516, the server rack event procedure 2500 takes some action based on the determined event(s), location(s), and/or server rack(s) 2100. In some examples, the action may be simply recording the event(s), location(s), and/or server rack(s) 2100 in cloud memory circuitry 2408 associated with one another. In some examples, the server rack event procedure 2500 may additionally store and/or associate the measurement time period with the other data. In some examples, the action may additionally, or alternatively, include outputting a notification and/or message indicating that the event has occurred (along with above discussed data about the event). For example, the notification and/or message may be output via the cloud communication circuitry 2406 via browser, email, SMS, voicemail, robocall, social media, and/or some other appropriate means. In some examples, the notification may be output to an administrator and/or technician.

In some examples, the action may involve the work order system 2418. For example, the server rack event procedure 2500 may communicate with the work order system 2418 to determine whether there exists one or more work orders that correspond to of the determined server rack event(s). For example, the server rack event procedure 2500 may determine that a work order indicating that a server installation and/or removal is planned for a certain server rack 2100 at a certain date/time corresponds to detected a server installation and/or removal event for that server rack 2100 (e.g., if the dates/times are close). As another example, the server rack event procedure 2500 may determine that a work order indicating maintenance planned for a known faulty fan or drive corresponds to a determined faulty fan and/or drive event. If there does exist one or more work orders that correspond to the determined server rack event(s), the server rack event procedure 2500 may indicate (e.g., via the work order system 2418 and/or some notification/message) that a work order was found corresponding to the detected event and/or that the work order is in progress. If no work order exists, then the server rack event procedure 2500 may generate a new work order and/or generate a notification (e.g., such as discussed above) indicating that no work order exists, that a new work order is being generated, and/or giving the details of the server rack event.

In some examples, the action may involve the security system 2416. For example, the server rack event procedure 2500 may communicate with the security system 2416 to access security data corresponding to the time period(s) and/or location(s) of the server rack events (and/or the measured parameter signature(s)). Thereafter, the server rack event procedure 2500 may store the security data in cloud memory circuitry 2408 and/or associate the security data with the other data surrounding the server rack event, such as discussed above.

In the example of FIG. 25, the server rack event procedure 2500 ends after block 2516. However, in some examples, the server rack event procedure 2500 may instead repeat by returning to block 2502.

In addition to keeping track of events involving server racks 2100, in some examples, the cloud computing system 2402 may also be used to keep track of the health of cooling equipment 124. This is an important task, as proper operation of cooling equipment 124 can be essential to the continued function of a data center 2300. In some examples, the cloud computing system 2402 may execute one or more instances of a cooling equipment health procedure 2600 in order to keep track of the health of the cooling equipment 124 for the data center 2300.

Figure 26:
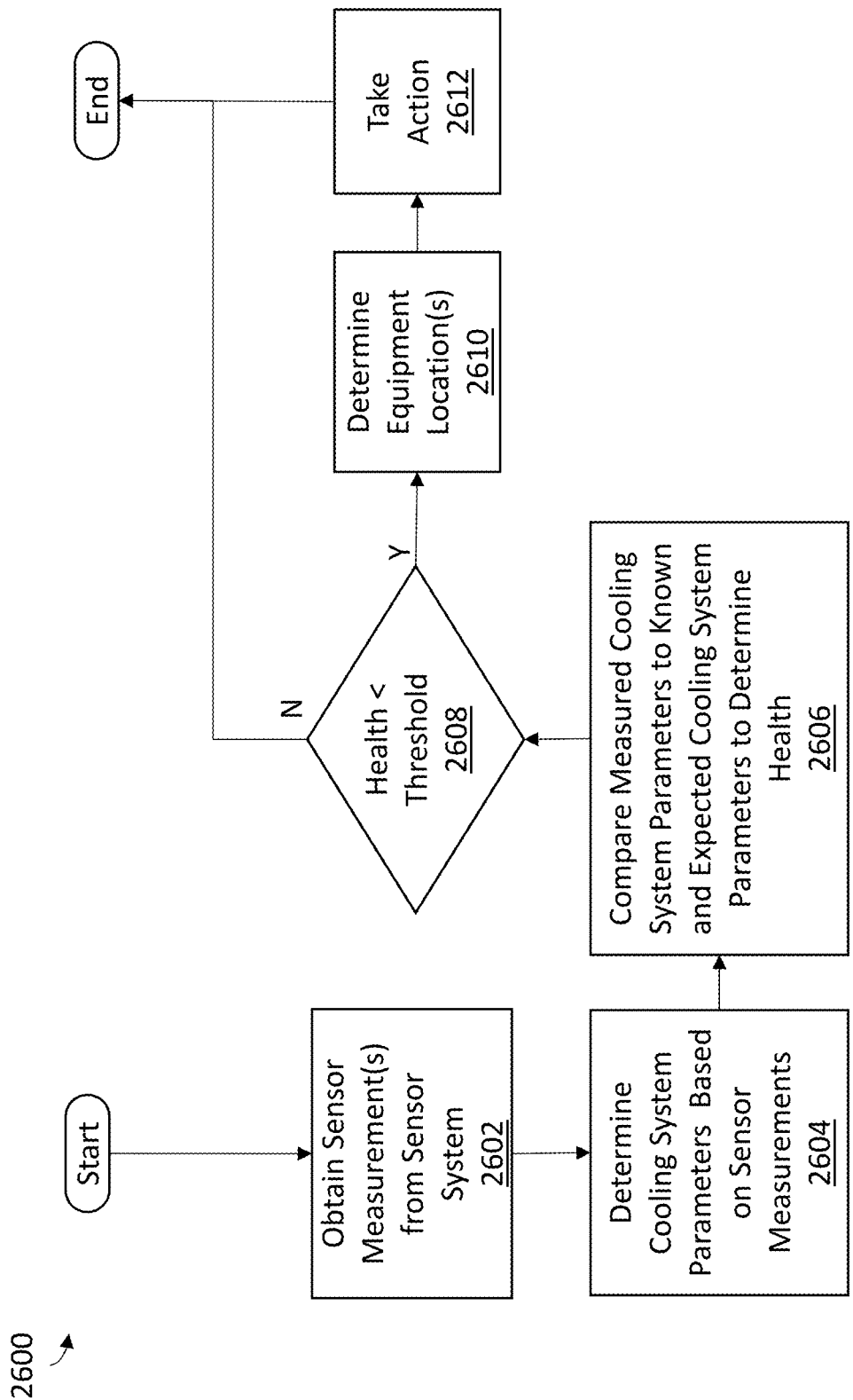
FIG. 26 is a flowchart illustrating an example cooling equipment health procedure, in accordance with the present disclosure.

In some examples, the cooling equipment health procedure 2600 may comprise machine readable instructions configured for execution by the cloud processing circuitry 2404. While presented as being stored in cloud memory circuitry 2408 of the cloud computing system 2402, and executed by the cloud processing circuitry 2404, in some examples, portions of the cooling equipment health procedure 2600 may be performed by other components and/or systems outside of the cloud computing system 2402. FIG. 26 is a flowchart showing an example operation of the cooling equipment health procedure 2600.

In the example of FIG. 26, the cooling equipment health procedure 2600 begins at block 2602. At block 2602, one or more measurements are obtained from the sensor system 2000, similar to block 2502 of the server rack event procedure 2500. While, in some examples, measurements relating to the cooling equipment 124 may be more pertinent for the cooling equipment health procedure 2600, in some examples, measurements relating to the server racks 2100 and/or power equipment 122 may also be useful. In some examples, some or all of the measurements may be obtained locally by each node 16. In some examples, some or all of the measurements may be sent to the cloud computing system 2402.

In the example of FIG. 26, the cooling equipment health procedure 2600 proceeds to block 2604 after block 2602. At block 2604, the cooling equipment health procedure 2600 determines one or more cooling equipment parameters (and/or measured parameter signatures) based on the measurements made at block 2602. In some examples, a cooling equipment parameter may be, for example, a vibration and/or a vibration harmonic of the cooling equipment 124. In some examples, a cooling equipment parameter may be, for example, a temperature, pressure, and/or humidity in and/or around the cooling equipment 124. In some examples, a cooling equipment parameter may be a power characteristic of the cooling equipment 124. In some examples, a cooling equipment parameter signature may be one or more (e.g., distinctive) cooling equipment parameter measurements and/or output signal patterns (e.g., of the sensor system 2000) that occur over a given measurement time period. In some examples, the power characteristic may be obtained from the power system 2420 rather than the sensor system 2000. In some examples, the cooling equipment health procedure 2600 may progress through blocks similar to blocks 2504 and 2506 of FIG. 25 before proceeding to block 2604 in FIG. 26.

In the example of FIG. 26, the cooling equipment health procedure 2600 proceeds to block 2606 after block 2604. At block 2606, the cooling equipment health procedure 2600 determines a health of the cooling equipment 124. "Health" in this context is meant to refer to a relative efficiency and/or likelihood of impending fault and/or failure of the cooling equipment 124. Thus, "healthy" cooling equipment 124 may operate more efficiently and/or have a relatively lower likelihood of impending fault and/or failure, while "unhealthy" cooling equipment 124 may operate less efficiently and/or have a relatively higher likelihood of fault and/or failure. In some examples, health may be stored, determined, evaluated, and/or otherwise considered as a number or percentage (e.g., 100-80, 79-60, 59-40, 39-20, 19-0), letter grade (e.g., A, B, C, D, F), color (e.g., green, blue, yellow, orange, red), description (e.g., excellent, good, moderate, poor, very poor health), and/or other type of value.

In some examples, the cooling equipment health procedure 2600 may determine health based, at least in part, on a comparison of one or more of the parameter signatures from block 2604 with one or more known parameter signatures 2410 stored in cloud memory circuitry 2408. In some examples, the known parameter signatures 2410 may be predetermined and/or prerecorded during an empirical testing process that monitors certain cooling equipment parameters at different points in the lifecycle of different kinds of cooling equipment 124. For example, empirical testing may reveal certain distinctive (e.g., vibration) signatures that occur when a piece of cooling equipment 124 (e.g., a motor or fan of a CRAC unit or chiller) is brand new, healthy, aged but ok, inefficient/faulty, and/or breaking down/near terminal failure.

When one or more unique and/or distinctive patterns of one or more sensor outputs are observed to occur for a given piece of cooling equipment 124 of a given health, those patterns may be stored and/or recorded as known parameter signatures 2410 associated with the cooling equipment 124 and/or health. Thus, if the cooling equipment health procedure 2600 determines that a measured parameter signature matches or is significantly similar to (e.g., within some threshold range of) a known parameter signature 2410 associated with a given health, then the cooling equipment health procedure 2600 may determine that the cooling equipment 124 to which that measured parameter signature pertains may be of the same or a similar health. Similarly, if the cooling equipment health procedure 2600 determines that a measured parameter signature differs significantly from (e.g., is outside the threshold range of) a known parameter signature 2410 associated with a given health (e.g., good health), then the cooling equipment health procedure 2600 may determine that the cooling equipment 124 is not of that health. The cooling equipment health procedure 2600 may additionally determine the current health of the cooling equipment 124 based on just how different the measured parameter signature is from the known parameter signature 2410.

In some examples, the cooling equipment health procedure 2600 may additionally, or alternatively, base the health evaluation of the cooling equipment 124 on whether the cooling equipment 124 is behaving as healthy cooling equipment 124 (and/or cooling equipment 124 of a given health) is expected to behave. For example, the cooling equipment health procedure 2600 may determine whether a cooling output (and/or input/output temperature gradient) of a piece of cooling equipment 124 (e.g., a CRAC unit) is what is expected. In some examples, the cooling equipment procedure 2600 may determine an expected cooling output based on a target cooling output (e.g., determined by the sensor system 2000, user input via UI 110, and/or some other system), the power use of the cooling equipment 124 (e.g., as measured and/or reported by the sensor system 2000 and/or power system 2420), and/or a (e.g., previously determined) health of the cooling equipment 124. As another example, the cooling equipment health procedure 2600 may determine whether an air pressure differential produced by cooling equipment 124 (e.g., a fan) is what is expected, given the power use of the cooling equipment 124 and/or health of the cooling equipment 124.

In some examples, the cooling equipment health procedure 2600 may first determine health based on whether a measured parameter signature corresponding to the cooling equipment 124 matches (and/or is significantly similar to) a known parameter signature 2410 associated with a known health (e.g., excellent, good, moderate, poor, or very poor). In some examples, if a measured parameter signature corresponding to the cooling equipment 124 does not match (and/or is not significantly similar to) a known parameter signature 2410, the cooling equipment health procedure 2600 may instead base the health determination on which known parameter signature 2410 is most similar to the measured parameter signature. In some examples, if a measured parameter signature is outside of a threshold standard deviation from any known parameter signature 2410, the cooling equipment health procedure 2600 may determine the health is inconclusive, and/or generate an error.

In some examples, the cooling equipment health procedure 2600 may (e.g., detrimentally) modify the initially determined health of cooling equipment 124 if sensor measurements indicate that the cooling equipment 124 is not behaving as expected. For example, cooling equipment 124 first determined to be in excellent health may have its health status modified to good, moderate, poor, or very poor if a cooling output of the cooling equipment 124 is not what is expected given the target cooling output, power use, and/or (e.g., first determined) health of the cooling equipment 124. In some examples, the degree to which health status is modified may be based on a degree of difference (e.g., number of standard deviations) between expectation and measurement.

In the example of FIG. 26, the cooling equipment health procedure 2600 proceeds to block 2608 after block 2606. At block 2608, the cooling equipment health procedure 2600 compares the health determined at block 2606 with a health threshold (e.g., of the stored thresholds 2414). If the cooling equipment health procedure 2600 determines that the health determined at block 2606 is better than or equal to the health threshold, then the cooling equipment health procedure 2600 ends (or, in some examples, returns to block 2602). If the cooling equipment health procedure 2600 determines that the health determined at block 2606 is less than the health threshold, the cooling equipment health procedure 2600 proceeds to block 2610.

In the example of FIG. 26, the cooling equipment health procedure 2600 determines one or more locations of the cooling equipment 124 that has found to be unhealthy at block 2610. In some examples, this determination may be performed using the above sensor location determination method 1500, sensor location determination method 1900, and/or data center mapping method 1600. While shown as taking place at block 2610 in the example of FIG. 26, in some examples, this determination may occur earlier in the cooling equipment health procedure 2600 (e.g., to help determine which cooling equipment 124 power characteristics to consider).

In the example of FIG. 26, the cooling equipment health procedure 2600 proceeds to block 2612 after block 2610. At block 2612, the cooling equipment health procedure 2600 takes some action based on the determined health and/or location(s) of the cooling equipment 124. In some examples, the action may be simply recording (and/or associating) information about the health and/or location(s) of the cooling equipment 124 in cloud memory circuitry 2408. In some examples, the cooling equipment health procedure 2600 may additionally store and/or associate the measurement time period(s) with the other data. In some examples, the action may additionally, or alternatively, include outputting a notification and/or message (similar to what is discussed above) indicating that the cooling equipment 124 is below the health threshold.

In some examples, the action may involve the work order system. For example, the cooling equipment health procedure 2600 may communicate with the work order system 2418 to determine whether there exists one or more work orders that correspond to the unhealthy cooling equipment 124. For example, the cooling equipment health procedure 2600 may determine that a work order indicating that maintenance or replacement is planned for the cooling equipment 124 corresponds to the unhealthy cooling equipment 124. If there does exist one or more work orders that correspond to the cooling equipment 124, the cooling equipment health procedure 2600 may indicate (e.g., via the work order system 2418 and/or UI 110), that a corresponding work order has been found and/or that the work order is still needed. If no work order exists, then the cooling equipment health procedure 2600 may generate a new work order and/or generate a notification (e.g., such as discussed above) indicating that no work order exists, that a new work order is being generated, and/or giving the details of the unhealthy cooling equipment 124.

In some examples, the action may involve the security system 2416. For example, the cooling equipment health procedure 2600 may communicate with the security system 2416 to access security data corresponding to the measurement time period(s) and/or pertinent location(s). Thereafter, the server rack event procedure 2500 may store the security data in cloud memory circuitry 2408 and/or associate the security data with the other data surrounding the cooling equipment 124, such as discussed above.

In the example of FIG. 26, the cooling equipment health procedure 2600 ends after block 2612. However, in some examples, the cooling equipment health procedure 2600 may instead repeat by returning to block 2602.

In some examples, the cloud computing system 2402 may also be used to determine inefficiencies within the data center (e.g., pertaining to the environmental conditions of the data center) and/or recommend corrective action to remedy the inefficiencies. Because of the high cost of operating a data center, the cost savings that come with correcting even small inefficiencies can be significant. Likewise, the cost to allowing inefficiencies to fester can be significant.

In some examples, the cloud computing system 2402 may execute one or more instances of a recommendation procedure 2700 in order to determine the inefficiencies and/or recommend corrective actions and/or solutions. In some examples, the corrective actions may be physical corrections, such as, for example, changing how air flow is ducted and/or closing off empty areas of server racks 2100. In some examples, the corrective actions may be more virtual actions that can be implemented via control systems, such as, for example, changing a target temperature output of the cooling equipment 124 and/or changing a fan speed. In some examples, the cloud computing system 2402 may use one or more thermodynamic and/or CFD models to continuously analyze data obtained via the sensor system 2000 in real time to determine inefficiencies and/or make recommendations. In some examples, the ability of sensors to continuously update their location via a local positioning system (e.g., method 1500) and/or relative positioning system (e.g., method 1900) allows such modeling and/or analysis to be done in real time. In contrast, conventional CFD models tend to be snapshots that can quickly become outdated as configurations of the data center 2300 change.

Figure 27:
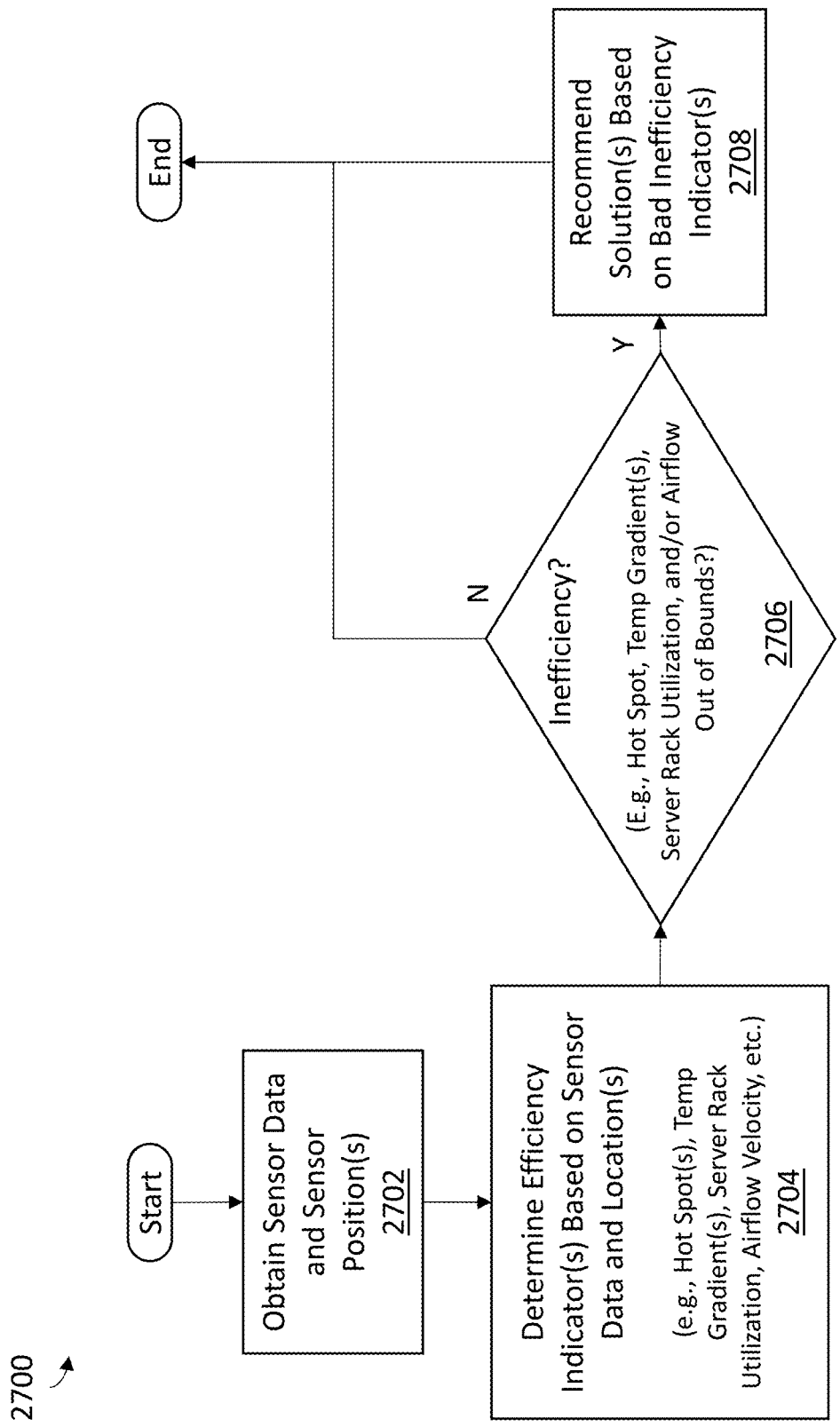
FIG. 27 is a flowchart illustrating an example recommendation procedure, in accordance with the present disclosure.

FIG. 27 is a flowchart showing an example operation of the recommendation procedure 2700. In some examples, the recommendation procedure 2700 may comprise machine readable instructions configured for execution by the cloud processing circuitry 2404. While presented as being stored in cloud memory circuitry 2408 of the cloud computing system 2402, and executed by the cloud processing circuitry 2404, in some examples, portions of the recommendation procedure 2700 may be performed by other components and/or systems outside of the cloud computing system 2402.

In the example of FIG. 27, the recommendation procedure 2700 begins at block 2702. At block 2702, the recommendation procedure 2700 obtains sensor data (e.g., one or more sensor measurements) from the sensor system 2000. The recommendation procedure 2700 additionally determines a location of each sensor from which sensor data was obtained, and associates the location information with the sensor data for that sensor. For example, the recommendation procedure 2700 may obtain sensor data from a sensor module 2002, two rack strands 2020a connected to the sensor module 2002, and a plenum strand 2020b attached to the sensor module 2002. Along with the sensor data, the recommendation procedure 2700 may obtain location information for the sensor module 2002 (e.g., determined via the method 1500, method 1600, and/or method 1900), and location information for each sensor strand 2020 attached to the sensor module 2002 (e.g., as discussed above). In some examples, the recommendation procedure 2700 may additionally generate a rendering of the data center 2300 (e.g., via method 1600) at block 2702, to assist with its analysis.

In the example of FIG. 27, the recommendation procedure 2700 proceeds to block 2704 after block 2702. At block 2704, the recommendation procedure 2700 determines one or more efficiency indicators of the data center 2300. In some examples, the efficiency indicators may be determined based on the sensor data and sensor locations. In some examples, the recommendation procedure 2700 may use the efficiency indicators to help determine whether there are inefficiencies within the data center 2300 and, if so, how the inefficiencies may be addressed. In the context of this disclosure, an "inefficiency" of the data center 2300 may refer to a failure to fully make use of one or more resources to achieve one or more target results. In some examples, the efficiency indicators may be indicative of whether or not the data center 2300 is operating inefficiently.

One simple example of an efficiency indicator is a hot spot indicator. A hot spot may be a location (and/or spot) within the data center 2300 that is particularly warm (or cold). In some examples, the recommendation procedure 2700 may analyze the sensor data obtained at block 2702 to determine one or more hot spots within the data center 2300. In some examples, the recommendation procedure 2700 may determine a hot spot for each server rack 2100, such as, for example, the warmest (and/or coldest) temperature recorded by a sensor proximate to each server rack 2100. In some examples, the recommendation procedure 2700 may determine a hot spot for one or more grouping of server racks 2100. In some examples, the recommendation procedure 2700 may determine a hot spot as being any sensor measurement above (or below) a given temperature threshold (e.g., of the thresholds 2414). In some examples, the temperature threshold may be different depending on the location within the data center 2300. For example, different server racks 2100, aisles, and/or areas may be associated with different temperature thresholds.

In some examples, a hot spot may be indicative of an inefficiency if the temperature at the hot spot is outside some maximum (or minimum) temperature threshold for the data center 2300 as a whole or one or more servers 2110 and/or server racks 2100 in particular. In some examples, particular servers 2110, server racks 2100, groups of servers 2110, groups of server racks 2100, and/or areas within the data center 2300 may have different maximum (or minimum) temperature thresholds, such as, for example, if they contain different hardware, or are for different clients.

Another example of an efficiency indicator is a temperature gradient (or temperature difference) between a front and back of a server rack 2100. In some examples, the recommendation procedure 2700 may analyze the sensor data obtained at block 2702 to determine temperature gradients for one or more server racks 2100, and/or groups of server racks 2100, such as by, for example, analyzing data from rack strands 2020a on the front and back of the server rack(s) 2100. In some examples, different front/back temperature gradients may be determined at different heights on the server rack 2100. In some examples, the recommendation procedure 2700 may expect the front/back server rack 2100 temperature gradient to be within a certain threshold range (e.g., of the thresholds 2414). In some examples, the recommendation procedure 2700 may determine the temperature gradient as being indicative of an inefficiency if the front/back server rack 2100 temperature gradient is outside of this threshold range.

Another example of an efficiency indicator is a vertical temperature gradient between a bottom and top of a server rack 2100 (and/or a floor and ceiling of the data center 2300). In some examples, the vertical temperature gradient may be a measure of a gradient between the plenum 2106 and a top of a server rack 2100 (and/or ceiling of the data center 2300). In some examples, the recommendation procedure 2700 may analyze the sensor data obtained at block 2702 to determine one or more vertical temperature gradients for the data center 2300, such as by, for example, analyzing data from sensor modules 2002, sensor strands 2020, and/or other sensors of the sensor system 2000. In some examples, the recommendation procedure 2700 may expect the vertical temperature gradient to be within a certain threshold range (e.g., of the thresholds 2414). In some examples, the recommendation procedure 2700 may determine the vertical temperature gradient as being indicative of an inefficiency if the vertical temperature gradient is outside of this threshold range.

Another example of an efficiency indicator is utilization of server racks 2100. In some examples, the recommendation procedure 2700 may analyze power data (e.g., from the power system 2420 and/or sensor system 2000) for one or more server racks 2100 to determine whether the server racks 2100 are being utilized efficiently. In some examples, the recommendation procedure 2700 may expect each server 2110 of a server 2110 rack to use an amount of power falling within a server power threshold range (e.g., of the thresholds 2414). Further, the recommendation procedure 2700 may expect each server rack 2100 of the data center 2300 to house servers 2110 that cumulatively use an amount of power falling within a rack power threshold range (e.g., of the thresholds 2414). Power use below that range may indicate utilization that is too low, and which may be better consolidated in other server racks 2100. Power use above the range may indicate utilization that is too high, which may produce an excessive amount of heat for that server rack 2100, such that the servers 2110 may be better served if dispersed. In some examples, the recommendation procedure 2700 may determine the utilization of a server rack 2100 to be indicative of an inefficiency if the cumulative power use of the servers 2110 of a server rack 2100 falls outside of the threshold range.

Another example of an efficiency indicator is airflow velocity. Airflow velocity, as used in this disclosure, refers to a vector comprising an airflow direction and an airflow magnitude. In some examples, the recommendation procedure 2700 may analyze sensor data (e.g., pressure data) at different locations within the data center 2300, and determine airflow velocity (e.g., via pressure differentials). While, in theory, airflow and/or pressure differential could be measured directly, this would require more complex sensor and/or peripheral device installation.

In some examples, the recommendation procedure 2700 may expect air to flow in certain directions (and/or within a certain range of directions) at certain locations within the data center 2300. In some examples, the recommendation procedure 2700 may expect airflow magnitude to fall within certain threshold ranges (e.g., of the thresholds 2414) at certain locations within the data center 2300. For example, the recommendation procedure 2700 may expect air to flow from the cooling equipment 124 through the plenum 2106 and up through the perforated tiles 2108 to the front of the server racks 2100, then through the server racks 2100. Further, the recommendation procedure 2700 may expect the airflow magnitude to be larger near the impelling forces of the fans 2126, and lower elsewhere. In some examples, the recommendation procedure 2700 may determine the airflow velocity to be indicative of an inefficiency if the airflow velocity is significantly different (e.g., outside a threshold deviation) from what is expected.

In the example of FIG. 27, the recommendation procedure 2700 proceeds to block 2706 after block 2704. At block 2706, the recommendation procedure 2700 analyzes the efficiency indicators discussed above to determine whether they indicate that there are one or more inefficiencies within the data center 2300. As shown, the recommendation procedure 2700 ends if no inefficiencies are found at block 2706. In some examples, the recommendation procedure 2700 may instead return to block 2702 if no inefficiencies are found.

In the example of FIG. 27, the recommendation procedure 2700 proceeds to block 2708 after block 2706 if the recommendation procedure 2700 determines that there are one or more inefficiencies in the data center 2300. At block 2708, the recommendation procedure 2700 determines and/or outputs one or more recommendations (and/or recommended solutions) to address the inefficiencies determined at block 2706. In some examples, the recommendation procedure 2700 may consider standard operating procedures, best practices, audit and compliance logs, fault detection, and/or other information when making the recommendation(s). In some examples, the recommendation(s) may be in form of message(s), video(s), picture(s), speech, sound(s), webpage(s), document(s), spreadsheet(s), and/or other appropriate outputs. In some examples, the one or more recommendations may be presented in a diagram showing the data center 2300 (e.g., generated via method 1600), highlighting one or more locations within the data center 2300 corresponding to the inefficiencies and/or recommended solutions, and/or providing a textual explanation. In some examples, the one or more recommendations may be presented in a cost savings analysis that shows how the solution will save resources (e.g., time, money, equipment, electricity, etc.). In some examples, the recommendation(s) may include generating a new work order (e.g., via the work order system 2418) to implement a recommended solution.

In some examples, the recommendation(s) output by the recommendation procedure 2700 may depend upon the inefficiencies (and/or efficiency indicators) determined at blocks 2704 and/or 2706. Thus, the recommendation procedure 2700 may first determine which of the inefficiency indicators indicate there is an inefficiency prior to recommending one or more solutions. While the inefficiency of the data center as a whole may be caused, as a general matter, by failing to fully make sue of a resource to achieve a target result or range of results (e.g., by precisely match cooling supply with cooling demand), an analysis of the specific inefficiency indicators may lead to more concrete and/or discrete solutions. Once one or more of the efficiency indicators are identified as indicating an inefficiency, the recommendation procedure 2700 can recommend one or more solutions to resolve both the limited inefficiencies of the efficiency indicators, and the overall inefficiencies of the data center 2300.

For example, the recommendation procedure 2700 may determine that the front/back temperature gradient indicates an inefficiency because the gradient is negative at some height. A negative front/back temperature gradient means that the temperature at the back of the server rack 2100 is higher than at the front at that height. In some examples, the recommendation procedure 2700 may determine that the likely cause of the negative front/back temperature gradient is one or more servers 2110 that are improperly installed.

In some examples, the fan of a server 2110 that is installed backwards will draw hot air into the server 2110 from the rear of the server rack 2100, and propel the air out the front of the server rack 2100. This in contrast to a correctly installed server 2110, where the fan draws air into the server 2110 at the front of the server rack 2100 (where the cooling equipment 124 provides cooled air) and blows the air out the back. Before being blown out the back, the cool air is moved over the heated components, which cools the components and warms the air. Thus, when servers 2110 are properly installed, the temperature is typically cooler at the front of the server rack 2100, and warmer at the rear of the server rack 2100, creating a positive front/back temperature gradient.

Where the recommendation procedure 2700 instead determines that there is a negative front/back temperature gradient, the recommendation procedure 2700 may determine the likely cause is an improperly installed server 2110. In some examples, the recommendation procedure 2700 may recommend that the server rack 2100 be inspected for servers 2110 installed incorrectly in response to determining that there is likely an improperly installed server 2110. In some examples, in response to determining that there is likely an improperly installed server 2110, the recommendation procedure 2700 may further recommend fixing the installation of any servers 2110 found to be installed incorrectly.

As another example, the recommendation procedure 2700 may determine that the front/back temperature gradient is below the threshold range. There may be several causes for a low front/back temperature gradient. In some examples, there may simply be a low utilization of one or more server racks 2100, where less heat is generated by the servers 2110.

In examples where there is low utilization of one or more server racks 2100, the cold air drawn through the servers 2110 by the server fans will be heated less because the components are not as hot, resulting in a lower temperature gradient. In some examples, the recommendation procedure 2700 may analyze the utilization of server racks 2100 to confirm that low utilization could indeed be the culprit. If there is low utilization, the recommendation procedure 2700 may recommend consolidating processing operations into fewer servers 2110, and/or consolidating operational servers 2110 into fewer server racks 2100. If there is low utilization, the recommendation procedure 2700 may also recommend that the fully utilized server racks 2100 be more closely positioned to one another, and/or modifying the cooling equipment 124 to route more (or all) cool air to server racks 2100 where there are fully utilized servers 2110.

Another potential cause of a low front/back temperature gradient is infiltration, where the cool air provided in the aisle at the front of the server racks 2100 becomes intermixed with the hot air at the back of the sever racks 2100. The intermixing may occur if, for example, there are open spaces in the server racks 2100 (e.g., where there are no servers 2110) that allows air to travel through the server racks 2100. The intermixing may also occur if, for example, there is space around the server racks 2100 (e.g., above, below, on the sides, etc.) where air can travel to intermix. In some examples, the recommendation procedure 2700 may analyze the airflow velocity to confirm that infiltration is the likely cause of the low front/back temperature gradient, as the airflow velocity may show lower magnitudes and/or changes of direction at infiltration points. If the recommendation procedure 2700 determines that infiltration is the likely culprit of the low front/back temperature gradient, the recommendation procedure 2700 may recommend blanking panels be installed within the server racks 2100, and/or containment solutions be implemented around the server racks 2100, to stop the infiltrating air flow.

Another potential cause of low front/back temperature gradient is excessive air flow. In some examples, if the recommendation procedure 2700 cannot confirm that low utilization or infiltration is the likely culprit, the recommendation procedure 2700 may determine that excessive air flow is the cause. Excessive air flow can mean significant amounts of wasted energy. In some examples, the recommendation procedure 2700 may recommend that the air flow output by the cooling equipment 124 (e.g., via fans 2126) be lowered, and/or that the air supply medium (e.g., ducts, plenum, etc.) be modified (e.g., by changing percent open of perforated tiles 2108), to change the air flow.

As another example, the recommendation procedure 2700 may determine the vertical temperature gradient efficiency indicator is indicative of an inefficiency because the gradient is negative or too high. In some examples, a negative temperature gradient may indicate that the air near the floor and/or bottom of the server rack 2100 (e.g., and/or coming out of the plenum 2106) is warmer than the air near the ceiling and/or top of the server rack 2100. In some examples, an excessively high (e.g., above a threshold) temperature gradient may indicate that the air near the ceiling and/or top of the server rack 2100 is much warmer than the air near the floor and/or the bottom of the server rack 2100. Both situations can be problematic for the purposes of correct and efficient cooling of the servers 2110 within the server racks 2100. In some examples, if the recommendation procedure 2700 may recommend the air supply medium (e.g., ducts, plenum, etc.) be modified (e.g., by changing percent open of perforated tiles 2108), to change the air flow and correct the vertical temperature gradient.

As another example, the recommendation procedure 2700 may determine that the hot spot efficiency indicator is indicative of an inefficiency, because one or more hot spots are higher (or lower) than a maximum (or minimum) temperature threshold. In some examples, the recommendation procedure 2700 may recommend a modification of the air supply medium, cooling equipment 124 configuration (e.g., target temperature), and/or server rack 2100 arrangement (e.g., to disburse servers 2110 and/or server racks 2100) to address the hot spot inefficiency. As another example, the recommendation procedure 2700 may determine that the utilization efficiency indicator is indicative of an inefficiency, in which case the recommendation procedure 2700 may recommend disbursement and/or consolidation of servers 2110 and/or server racks 2100. In some examples, the recommendation procedure 2700 may determine that the airflow velocity efficiency indicator is indicative of an inefficiency because airflow velocity is different than what is expected. In such an example, the recommendation procedure 2700 may recommend a modification of the air supply medium, cooling equipment 124 configuration (e.g., air flow output), and/or server rack 2100 arrangement to address this inefficiency.

Through the systems and methods described herein, an administrator of a data center can monitor a data center to understand the current data center environment. Further, the systems and methods described herein allow for an administrator to monitor relevant events that occur pertaining to server racks 2100 within the data center, as well as the health of cooling equipment 124 within the data center. The systems and methods described herein additionally are able to determine if a cooling system within the data center is effectively and/or efficiently cooling and protecting the valuable equipment stored in the data center, and recommend solutions if otherwise. Using this data, the administrator can rearrange or move racks or equipment within the data center to protect the equipment within the data center from overheating, etc. Furthermore, the systems and methods described herein can provide an always accurate and up-to-date map of the data center even after the administrator changes the configuration of the data center, which demonstrates a significant improvement over the prior art systems that relied only on static and frequently out-of-date CAD drawings of the data center. The systems and methods described herein demonstrate a practical application and an improvement over the art.

The present method and/or system may be realized in hardware, software, or a combination of hardware and software. The present methods and/or systems may be realized in a centralized fashion in at least one computing system, or in a distributed fashion where different elements are spread across several interconnected computing or cloud systems. Some examples may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein.

While the present method and/or system has been described with reference to certain examples, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular examples disclosed, but that the present method and/or system will include all implementations falling within the scope of the appended claims.

As used herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z".

As utilized herein, the terms "e.g.," and "for example" set off lists of one or more non-limiting examples, instances, or illustrations.

As used herein, the terms "coupled," "coupled to," and "coupled with," each mean a structural and/or electrical connection, whether attached, affixed, connected, joined, fastened, linked, and/or otherwise secured. As used herein, the term "attach" means to affix, couple, connect, join, fasten, link, and/or otherwise secure. As used herein, the term "connect" means to attach, affix, couple, join, fasten, link, and/or otherwise secure.

As used herein the terms "circuits" and "circuitry" refer to physical electronic components (i.e., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, circuitry is "operable" and/or "configured" to perform a function whenever the circuitry comprises the necessary hardware and/or code (if any is necessary) to perform the function, regardless of whether performance of the function is disabled or enabled (e.g., by a user-configurable setting, factory trim, etc.).

As used herein, the term "processor" means processing devices, apparatus, programs, circuits, components, systems, and subsystems, whether implemented in hardware, tangibly embodied software, or both, and whether or not it is programmable. The term "processor" as used herein includes, but is not limited to, one or more computing devices, hardwired circuits, signal-modifying devices and systems, devices and machines for controlling systems, central processing units, programmable devices and systems, field-programmable gate arrays, application-specific integrated circuits, systems on a chip, systems comprising discrete elements and/or circuits, state machines, virtual machines, data processors, processing facilities, and combinations of any of the foregoing. The processor may be, for example, any type of general purpose microprocessor or microcontroller, a digital signal processing (DSP) processor, an application-specific integrated circuit (ASIC), a graphic processing unit (GPU), a reduced instruction set computer (RISC) processor with an advanced RISC machine (ARM) core, etc. The processor may be coupled to, and/or integrated with a memory device.

As used, herein, the term "memory" and/or "memory circuitry" means computer hardware or circuitry to store information for use by a processor and/or other digital device. The memory and/or memory circuitry can be any suitable type of computer memory or any other type of electronic storage medium, such as, for example, read-only memory (ROM), random access memory (RAM), cache memory, compact disc read-only memory (CDROM), electro-optical memory, magneto-optical memory, programmable read-only memory (PROM), erasable programmable read-only memory (EPROM), electrically-erasable programmable read-only memory (EEPROM), a computer-readable medium, or the like. Memory can include, for example, a non-transitory memory, a non-transitory processor readable medium, a non-transitory computer readable medium, non-volatile memory, dynamic RAM (DRAM), volatile memory, ferroelectric RAM (FRAM), first-in-first-out (FIFO) memory, last-in-first-out (LIFO) memory, stack memory, non-volatile RAM (NVRAM), static RAM (SRAM), a cache, a buffer, a semiconductor memory, a magnetic memory, an optical memory, a flash memory, a flash card, a compact flash card, memory cards, secure digital memory cards, a microcard, a minicard, an expansion card, a smart card, a memory stick, a multimedia card, a picture card, flash storage, a subscriber identity module (SIM) card, a hard drive (HDD), a solid state drive (SSD), etc. The memory can be configured to store code, instructions, applications, software, firmware and/or data, and may be external, internal, or both with respect to the processor.

What is claimed is:

1. A system, comprising:
    a sensor system comprising:
        a sensor module configured to mount to a server rack within a data center,
        a first sensor strand configured to attach to the sensor module, the first sensor strand comprising a first sensor, and
        a second sensor strand configured to attach to the sensor module, the second sensor strand comprising a second sensor, the first sensor and second sensor configured to measure data within the data center; and
    a computing system configured to receive the data, the computing system comprising:
        processing circuitry, and
        memory circuitry comprising machine readable instructions which, when executed, cause the processing circuitry to:
            determine a first position of the first sensor within the data center,
            determine a second position of the second sensor within the data center,
            determine an efficiency indicator based on the first position of the first sensor, the second position of the second sensor, and the data measured by the first sensor and second sensor,
            determine whether there is an inefficiency within the data center based on the efficiency indicator, and
            in response to determining there is an inefficiency, recommend a solution to the inefficiency.

2. The system of claim 1, wherein the sensor module is further configured to measure the data within the data center, and the memory circuitry comprises machine readable instructions which, when executed, further cause the processing circuitry to determine a module position of the sensor module within the data center, the efficiency indicator being determined based on the data measured by the sensor module and first and second sensors, as well as the module position of the sensor module, the first position of the first sensor, and the second position of the second sensor.

3. The system of claim 1, wherein the first position of the first sensor or the second position of the second sensor is determined using position data obtained via a local positioning system or a relative positioning system of the data center.

4. The system of claim 1, wherein the data comprises thermal data, humidity data, or pressure data.

5. The system of claim 1, wherein the efficiency indicator comprises an airflow direction, an airflow magnitude, a horizontal temperature gradient, a vertical temperature gradient, or a server rack utilization.

6. The system of claim 1, wherein the inefficiency comprises a reversed air flow, a horizontal temperature gradient below a low delta threshold, a reversed horizontal temperature gradient, a vertical temperature gradient above a high delta threshold, or a reversed vertical temperature gradient.

7. The system of claim 1, wherein recommending the solution comprises generating a diagram showing a location of a server rack or cooling component within the data center that is impacted by the inefficiency or that will be impacted by the solution, generating a cost saving analysis that includes the solution, or generating a work order to implement the solution.

8. A method of determining inefficiencies in a data center, comprising:
measuring data within the data center via a first sensor and second sensor of a sensor system, the sensor system comprising a sensor module configured to mount to a server rack, a first sensor strand comprising the first sensor, and a second sensor strand comprising the second sensor, the first and second sensor strands being configured to attach to the sensor module;
determining a first position of the first sensor within the data center;
determining a second position of the second sensor within the data center;
determining an efficiency indicator based on the first position of the first sensor, the second position of the second sensor, and the data measured by the first sensor and second sensor;
determining whether there is an inefficiency within the data center based on the efficiency indicator; and
in response to determining there is an inefficiency, recommending a solution to the inefficiency.

9. The method of claim 8, wherein:
the sensor system further comprises a third sensor strand configured to be attached to the sensor module, the third sensor strand comprising a third sensor configured to be positioned in a plenum of the data center,
the data is measured via the first sensor, the second sensor, and the third sensor of the sensor system,
the method further comprises determining a third position of the third sensor within the data center, and
the efficiency indicator is determined based on the first position, second position, and third position, as well as the data measured by the first sensor, second sensor, and third sensor.

10. The method of claim 8, wherein determining the first position of the first sensor or the second position of the second sensor comprises determining the first or second position via a local positioning system or a relative positioning system of the data center.

11. The method of claim 8, wherein the data comprises thermal data, humidity data, or pressure data.

12. The method of claim 8, wherein the efficiency indicator comprises an airflow direction, a change in temperature, or a temperature gradient.

13. The method of claim 8, wherein the inefficiency comprises a reverse air flow, a change in temperature above a high delta threshold, a change in temperature below a low delta threshold, a temperature gradient above a gradient threshold, or a reversed temperature gradient.

14. The method of claim 8, wherein the solution comprises a reconfiguration of a server mounted in the server rack, a consolidation of a processing load to fewer server racks, a disbursement of the processing load to more server racks, an installation of a blanking panel in the server rack, or an installation of a containment solution around the server rack.

* * * * *